US012763454B2

(12) United States Patent
Yao et al.

(10) Patent No.: US 12,763,454 B2
(45) Date of Patent: Oct. 13, 2026

(54) ANTENNA STRUCTURE, ANTENNA MODULE, CHIP, AND ELECTRONIC DEVICE

(71) Applicant: Huawei Technologies Co., Ltd., Shenzhen (CN)

(72) Inventors: Yu Yao, Shanghai (CN); Youquan Wu, Shenzhen (CN); Meng Hou, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 16 days.

(21) Appl. No.: 18/575,631

(22) PCT Filed: Jun. 28, 2022

(86) PCT No.: PCT/CN2022/101755
§ 371 (c)(1),
(2) Date: Dec. 29, 2023

(87) PCT Pub. No.: WO2023/274193
PCT Pub. Date: Jan. 5, 2023

(65) Prior Publication Data

US 2024/0313388 A1 Sep. 19, 2024

(30) Foreign Application Priority Data

Jun. 30, 2021 (CN) ......................... 202110742511.0

(51) Int. Cl.
*H01Q 1/38* (2006.01)
*H01Q 1/22* (2006.01)
(Continued)

(52) U.S. Cl.
CPC ........... *H01Q 1/2283* (2013.01); *H01Q 1/243* (2013.01); *H01Q 1/38* (2013.01); *H01Q 1/48* (2013.01);
(Continued)

(58) Field of Classification Search
None
See application file for complete search history.

(56) References Cited

U.S. PATENT DOCUMENTS

2006/0071308 A1 4/2006 Tang et al.
2010/0109971 A2 5/2010 Gummalla et al.
(Continued)

FOREIGN PATENT DOCUMENTS

CN 102270780 A 12/2011
CN 106463466 A 2/2017
(Continued)

OTHER PUBLICATIONS

A. O. Watanabe, M. Ali, S. Y. B. Sayeed, R. R. Tummala and M. R. Pulugurtha, "A Review of 5G Front-End Systems Package Integration," in IEEE Transactions on Components, Packaging and Manufacturing Technology, vol. 11, No. 1, pp. 118-133, Jan. 2021, doi: 10.1109/TCPMT.2020.3041412.
(Continued)

*Primary Examiner* — Dameon E Levi
*Assistant Examiner* — Anh Ho
(74) *Attorney, Agent, or Firm* — Slater Matsil, LLP

(57) ABSTRACT

A chip having an antenna structure comprising a ground layer, a feeding element, and an antenna element. The antenna element comprises a first metal layer, a second metal layer, a first conducting member, and a second conducting member, the first metal layer and the ground layer are disposed opposite and spaced from each other, the second metal layer is located between the first metal layer and the ground layer and is spaced from both the first metal layer and the ground layer, the second metal layer comprises a first area and a second area that are spaced from each other, the first conducting member is connected between the first metal layer and the first area of the second metal layer, and the
(Continued)

second conducting member is connected between the ground layer and the second area of the second metal layer.

25 Claims, 29 Drawing Sheets

(51) Int. Cl.

| | |
|---|---|
| ***H01Q 1/24*** | (2006.01) |
| ***H01Q 1/48*** | (2006.01) |
| ***H10W 44/20*** | (2026.01) |

(52) U.S. Cl.

CPC .......... *H10W 44/20* (2026.01); *H10W 44/248* (2026.01)

(56) References Cited

U.S. PATENT DOCUMENTS

| | | | | |
|---|---|---|---|---|
| 2019/0096828 | A1* | 3/2019 | Wu | H01Q 21/065 |
| 2019/0115643 | A1* | 4/2019 | Khan | H01Q 9/42 |
| 2019/0305435 | A1 | 10/2019 | Robinson et al. | |
| 2022/0069441 | A1 | 3/2022 | Kim et al. | |
| 2022/0173528 | A1* | 6/2022 | Jia | H01Q 9/0421 |
| 2022/0200640 | A1 | 6/2022 | Kim et al. | |
| 2024/0396218 | A1* | 11/2024 | Zhang | H01Q 5/28 |

FOREIGN PATENT DOCUMENTS

| | | | | | |
|---|---|---|---|---|---|
| CN | 107069199 | A | | 8/2017 | |
| CN | 108183329 | A | | 6/2018 | |
| CN | 109921184 | A | | 6/2019 | |
| CN | 209266562 | U | | 8/2019 | |
| CN | 111180886 | A | * | 5/2020 | H01Q 1/48 |
| CN | 111466055 | A | | 7/2020 | |
| CN | 111509376 | A | | 8/2020 | |
| CN | 111916892 | A | | 11/2020 | |
| CN | 112490646 | A | | 3/2021 | |
| CN | 112968281 | A | | 6/2021 | |
| CN | 113054403 | A | | 6/2021 | |
| JP | 2005197776 | A | | 7/2005 | |
| KR | 20180063403 | A | * | 6/2018 | H01Q 1/38 |
| KR | 20190074193 | A | | 6/2019 | |
| KR | 20190088213 | A | | 7/2019 | |
| KR | 20200004870 | A | | 1/2020 | |
| WO | WO-2023035391 | A1 | * | 3/2023 | H01Q 1/50 |

OTHER PUBLICATIONS

K.-M. Luk and M. Li, "Magneto-electric dipole antennas for millimeter-wave applications," 2013 Asia-Pacific Microwave Conference Proceedings (APMC), Seoul, Korea (South), Nov. 5-8, 2013, pp. 304-306, doi: 10.1109/APMC.2013.6695127.

Bin Yu et al: "A Wideband mmWave Antenna in Fan-Out Wafer Level Packaging With Tall Vertical Interconnects for 50 Wireless Communication", IEEE Transactions on Antennas and Propagation, vol. 69, No. 10, Oct. 2021, Jun. 15, 2021, XP011881440, total 6 pages.

Jie Sun et al.,"Wideband Magneto-Electric Dipole Antennas for Millimeter-Wave Applications with Microstrip Line Feed",2018 International Symposium on Antennas and Propagation (ISAP),Busan,Korea (South), Oct. 23-26, 2018, total 2 pages.

Mingjian Li et al.,"Wideband Magneto-Electric Dipole Antenna for 60-GHz Millimeter Wave Communications",IEEE Transactions on Antennas and Propagation,vol. 63,No. 7,Jul. 2015,total 4 pages.

Yujian Li et al.,"A Ka-Band Wideband Dual-Polarized Magnetoelectric Dipole Antenna Array on LTCC",in IEEE Transactions on Antennas and Propagation vol. 68 No. 6,Jun. 2020, total 6 pages.

Jun Xu et al.,"Millimeter-Wave Broadband Substrate Integrated Magneto-Electric Dipole Arrays With Corporate Low-Profile Microstrip Feeding Structures",in IEEE Transactions on Antennas and Propagation vol. 68 No. 10,Oct. 2020, total 12 pages.

Yangzi Wang et al.,"Wideband Substrate-Integrated-Waveguide-Fed Magneto-Electric Dipole Array Antenna",2019 International Conference on Microwave and Millimeter Wave Technology (ICMMT),Guangzhou,China, May 19-22, 2019, total 3 pages.

Wu, Bi Qun et al.,"A Broadband Dual-Polarized Magneto-Electric Dipole Antenna With Simple Feeds", IEEE Antennas and Wireless Propagation Letters,vol. 8, Dec. 31, 2008, total 4 pages.

Lei Ge et al.,"A Low-Profile Magneto-Electric Dipole Antenna", IEEE Transactions on Antennas and Propagation,vol. 60 No. 4,Apr. 2012,total 6 pages.

Lei Ge et al.,"Magnetoelectric Dipole Antenna With Low Profile", IEEE Antennas and Wireless Propagation Letters,vol. 17 No. 10,Oct. 2018,total 4 pages.

* cited by examiner

ANTENNA STRUCTURE, ANTENNA MODULE, CHIP, AND ELECTRONIC DEVICE

CROSS-REFERENCE TO RELATED APPLICATIONS

This application is a National Stage of International Patent Application No. PCT/CN2022/101755, filed on Jun. 28, 2022, which claims priority to Chinese Patent Application No. 202110742511.0, filed on Jun. 30, 2021, both of which are hereby incorporated by reference in their entireties.

TECHNICAL FIELD

This application relates to the field of antenna technologies, and in particular, to an antenna structure, an antenna module, a chip, and an electronic device.

BACKGROUND

With rapid development of key technologies such as bezel-less screens, keeping an electronic device lightweight and thin and an ultimate screen-to-body ratio has become a trend. This design greatly reduces room for antenna arrangement. In such a condition in which antennas are compactly arranged, it is difficult for a conventional antenna to satisfy a performance requirement of a plurality of communication frequency bands. In addition, in terms of communication frequency bands used by mobile phones, 3G, 4G, and 5G frequency bands are going to coexist for a long time in the future. There are increasingly more antennas and increasingly wider frequency band coverage. Based on these changes, it is urgent to implement new miniaturized antennas on mobile phones.

SUMMARY

This application provides an antenna structure, an antenna module, a chip, and an electronic device. A miniaturized design of the antenna structure can be achieved.

According to a first aspect, this application provides an antenna structure. The antenna structure includes a ground layer, a feeding element, and an antenna element. The antenna element includes a first metal layer, a second metal layer, a first conducting member, and a second conducting member. The first metal layer and the ground layer are disposed opposite and spaced from each other. The second metal layer is located between the first metal layer and the ground layer, and is spaced from both the first metal layer and the ground layer. The second metal layer includes a first area and a second area that are spaced from each other. The first conducting member is connected between the first metal layer and the first area of the second metal layer. The second conducting member is connected between the ground layer and the second area of the second metal layer.

The feeding element is located on a side that is of the second metal layer and that faces the ground layer. The feeding element is configured to feed the second metal layer and the first metal layer.

It can be understood that, as the first conducting member and the second conducting member are spaced from each other in two areas of the second metal layer, when the antenna element is in a working state, a current path includes the ground layer, the second conducting member, the second area of the second metal layer, the first area of the second metal layer, the first conducting member, and the first metal layer. Because a current may be transmitted between the first area and the second area of the second metal layer, the current path is disposed as bent. Compared with an antenna structure that has a same current path, where the current path of the antenna structure is straight, a cross-sectional height of the antenna structure in this embodiment is smaller, to facilitate achieving thinness of the antenna structure.

In a possible implementation, the first conducting member is a plurality of first metal columns. The second conducting member includes a first metal connection sheet, a plurality of second metal columns, and a plurality of third metal columns. The first metal connection sheet is located between the second metal layer and the ground layer. The plurality of second metal columns are connected between the first metal connection sheet and the second area of the second metal layer. The plurality of third metal columns are connected between the first metal connection sheet and the ground layer.

It can be understood that the antenna structure may be an antenna configured to transmit and receive in a millimeter-wave frequency band. For example, the antenna structure may support frequency bands n257, n258, n259, n260, and n261. For example, the antenna structure may cover a frequency range from 24.25 GHz to 43.5 GHZ.

In a possible implementation, a diameter of the third metal column is greater than a diameter of the second metal column.

It can be understood that, when the diameter of the second metal column is smaller, a thickness of a chip bodylectric layer surrounding the second metal columns may be made small. When the diameter of the third metal column is larger, a thickness of a chip bodylectric layer surrounding the third metal columns may be made large. In this way, in a forming process of the antenna structure, the two chip bodylectric boards (one chip bodylectric board is provided with the second metal columns, and the other chip bodylectric board is provided with the third metal columns) of different thicknesses may be stacked up into a whole by bonding, welding, or the like.

In an implementation, the plurality of first metal columns are arranged into an L shape or an arc shape, the first metal connection sheet has an L shape or an arc shape, the plurality of second metal columns are arranged into an L shape or an arc shape, and the plurality of third metal columns are arranged into an L shape or an arc shape.

It can be understood that, as the first metal connection sheet is disposed into an L shape or an arc shape, the plurality of second metal columns are arranged into an L shape or an arc shape, and the plurality of third metal columns are arranged into an L shape or an arc shape, the second metal layer, the second metal columns, the third metal columns, the first metal connection sheet, and the ground layer can circle up to form a space. In this way, another component of the antenna structure may be disposed in the space. On one hand, space utilization of the antenna structure is high. On the other hand, the antenna structure may be compactly disposed, to facilitate miniaturization of the antenna structure.

In an implementation, projections of the third metal columns on the first metal connection sheet at least partly overlap projections of the second metal columns on the first metal connection sheet. In this way, the current path is disposed as bent once. The antenna structure is relatively simple.

In an implementation, the first metal connection sheet includes a third area and a fourth area that are spaced from each other. The second metal columns are connected between the third area of the first metal connection sheet and the second area of the second metal layer. The third metal columns are connected between the fourth area of the first metal connection sheet and the ground layer.

It can be understood that when the antenna element is in the working state, the current path includes the ground layer, the third metal columns, the fourth area of the first metal connection sheet, the third area of the first metal connection sheet, the second metal columns, the second metal layer, the first metal columns, and the first metal layer. In this case, because a current may be transmitted between the fourth area of the first metal connection sheet and the third area of the first metal connection sheet and transmitted between the two areas of the second metal layer, the current path is disposed as bent twice. Compared with the solution in which the current path is disposed as bent once, a cross-sectional height of the antenna structure in this implementation can be smaller. In this way, thinness of the antenna structure is easier to achieve.

In an implementation, there are four antenna elements. The four antenna elements are arranged in two rows and two columns and are spaced from each other. The four antenna elements have a central point. The four antenna elements are a first antenna element, a second antenna element, a third antenna element, and a fourth antenna element.

A second conducting member of the first antenna element is located on a side that is of a first conducting member of the first antenna element and that is farther away from the central point. A second conducting member of the second antenna element is located on a side that is of a first conducting member of the second antenna element and that is farther away from the central point. A second conducting member of the third antenna element is located on a side that is of a first conducting member of the third antenna element and that is farther away from the central point. A second conducting member of the fourth antenna element is located on a side that is of a first conducting member of the fourth antenna element and that is farther away from the central point. In this way, the second conducting member of the first antenna element, the second conducting member of the second antenna element, the second conducting member of the third antenna element, and the second conducting member of the fourth antenna element can circle up to form a space of a relatively large volume.

In addition, the feeding element is located in the space encircled by the second conducting member of the first antenna element, the second conducting member of the second antenna element, the second conducting member of the third antenna element, and the second conducting member of the fourth antenna element. In this way, on one hand, space utilization of the antenna structure is high. On the other hand, the antenna structure may be compactly disposed, to facilitate miniaturization of the antenna structure.

In an implementation, the first antenna element, the second antenna element, the third antenna element, and the fourth antenna element form a centrosymmetric structure.

In an implementation, the feeding element includes a first feeding branch and a second feeding branch that are spaced from each other. One end of the first feeding branch is located on a side that is of a second metal layer of the first antenna element and that faces the ground layer. The other end of the first feeding branch is located on a side that is of a second metal layer of the fourth antenna element and that faces the ground layer. The first feeding branch is configured to feed the second metal layer of the first antenna element, a first metal layer of the first antenna element, the second metal layer of the fourth antenna element, and a first metal layer of the fourth antenna element. One end of the second feeding branch is located on a side that is of a second metal layer of the second antenna element and that faces the ground layer. The other end of the second feeding branch is located on a side that is of a second metal layer of the third antenna element and that faces the ground layer. The second feeding branch is configured to feed the second metal layer of the second antenna element, a first metal layer of the second antenna element, the second metal layer of the third antenna element, and a first metal layer of the third antenna element.

It can be understood that the feeding element may simultaneously feed the first antenna element, the second antenna element, the third antenna element, and the fourth antenna element.

In an implementation, the first antenna element, the second antenna element, the third antenna element, and the fourth antenna element are all symmetric structures. A symmetry plane of the first antenna element, a symmetry plane of the second antenna element, a symmetry plane of the third antenna element, and a symmetry plane of the fourth antenna element all pass through the central point. An extension direction of the first feeding branch is parallel to the symmetry plane of the first antenna element and the symmetry plane of the fourth antenna element. An extension direction of the second feeding branch is parallel to the symmetry plane of the second antenna element and the symmetry plane of the third antenna element. In this way, the antenna structure can generate two types of polarization. A first type of polarization is −45° polarization of the antenna structure. A second type of polarization is +45° polarization of the antenna structure.

In an implementation, the first feeding branch includes a first part, a second part, a third part, a fourth part, and a fifth part that are sequentially connected. A distance between the first part and the ground layer, a distance between the fifth part and the ground layer, and a distance between the second feeding branch and the ground layer are all equal. The second part, the third part, and the fourth part form a "U" shape, and the third part is located between the second feeding branch and the ground layer. In this way, a distance between the first feeding branch and the second metal layer of the first antenna element, a distance between the first feeding branch and the second metal layer of the fourth antenna element, a distance between the second feeding branch and the second metal layer of the second antenna element, and a distance between the first feeding branch and the second metal layer of the third antenna element may be all equal to a large extent.

In an implementation, a distance between the first feeding branch and the ground layer is greater than or less than the distance between the second feeding branch and the ground layer. A structure of the feeding element in this implementation is relatively simple.

In an implementation, the antenna structure further includes a plurality of metal short-circuit hole groups. The plurality of metal short-circuit hole groups are electrically connected to the ground layer and are located on a periphery of the first antenna element, the second antenna element, the third antenna element, and the fourth antenna element.

The first antenna element and the second antenna element form a first gap. At least one metal short-circuit hole group is disposed in an extension direction of the first gap. The first antenna element and the third antenna element form a second gap. At least one metal short-circuit hole group is disposed in an extension direction of the second gap. The third antenna element and the fourth antenna element form a third gap. At least one metal short-circuit hole group is disposed in an extension direction of the third gap. The fourth antenna element and the second antenna element form a fourth gap. At least one metal short-circuit hole group is disposed in an extension direction of the fourth gap.

It can be understood that the antenna structure may have four resonant frequencies. On one hand, within a frequency band range including n257, n258, n259, n260, and n261, the antenna structure may have another resonance point. On the other hand, within the frequency band range including n257, n258, n259, n260, and n261, the antenna structure may have another trap point.

In an implementation, the antenna structure further includes a plurality of matching via groups. The plurality of matching via groups are electrically connected to the ground layer. The plurality of matching via groups are located on the periphery of the antenna elements. The plurality of matching via groups are disposed around the antenna elements.

It can be understood that, as the plurality of matching via groups that are spaced from each other are disposed on the ground layer, the matching via groups can enlarge a current path between the antenna elements and the ground layer. The matching via groups may be configured to tune impedance of the antenna structure, to implement impedance matching. In addition, because the matching via groups may enlarge the current path between the antenna elements and the ground layer, sizes of the antenna elements and the ground layer in embodiments can be made small, to achieve miniaturization of the antenna structure.

In an implementation, the antenna structure further includes a chip bodylectric layer. The ground layer, the feeding element, and the antenna elements are all disposed at the chip bodylectric layer. In this way, the antenna structure has higher integrity and stability.

In an implementation, the chip bodylectric layer is made of an LCP. Because a loss tangent of the LCP remains relatively small at a high frequency, the antenna structure may have a relatively small transmission loss, thereby improving antenna radiation efficiency and obtaining a higher antenna gain.

In an implementation, the first conducting member is a first metal wall. The second conducting member includes a metal connection sheet, a second metal wall, and a third metal wall. The metal connection sheet is located between the second metal layer and the ground layer. The second metal wall is connected between the metal connection sheet and the second area of the second metal layer. The third metal wall is connected between the metal connection sheet and the ground layer.

It can be understood that the antenna structure in this implementation may support a low frequency. For example, a frequency band that can be covered by the antenna structure may be 1.5 GHz to 3 GHz.

In an implementation, the metal connection sheet includes a third area and a fourth area that are spaced from each other. The second metal wall is connected between the third area of the metal connection sheet and the second area of the second metal layer. The third metal wall is connected between the fourth area of the metal connection sheet and the ground layer.

It can be understood that, as the second metal wall and the third metal wall are spaced from each other in two areas of the metal connection sheet, and the first metal wall and the second metal wall are spaced from each other in two areas of the second metal layer, when the antenna element is in the working state, the current path includes the ground layer, the third metal wall, the metal connection sheet, the second metal wall, the second metal layer, the first metal wall, and the first metal layer. Because a current may be transmitted between the third area and the fourth area of the metal connection sheet and transmitted between the first area and the second area of the second metal layer, the current path may be disposed as bent twice. In this way, compared with an antenna structure that has a same current path, where the current path of the antenna structure is straight, a cross-sectional height of the antenna structure in this embodiment is smaller, to facilitate miniaturization of the antenna structure.

In an implementation, a projection of the third metal wall on the metal connection sheet at least partly overlaps a projection of the second metal wall on the metal connection sheet. In this way, the current path is disposed as bent once. The antenna structure is relatively simple.

According to a second aspect, this application provides an antenna module, including a radio frequency circuit and the antenna structure described above. The radio frequency circuit is electrically connected to a feeding element of the antenna structure.

It can be understood that when the antenna structure is applied to the antenna module, because the antenna structure can achieve miniaturization, the antenna module can also achieve miniaturization.

According to a third aspect, this application provides an electronic device. The electronic device includes a circuit board and the antenna module described above. The antenna module is disposed on the circuit board.

It can be understood that when the antenna module is used in the electronic device, because the antenna module can achieve miniaturization, the electronic device can also achieve miniaturization.

In an implementable, the antenna structure and the circuit board are an integrally formed structure. In this way, a structure of the antenna module is simpler.

According to a fourth aspect, this application provides a chip. The chip includes a package substrate, an injection molded piece, a chip body, and the antenna structure described above. Both the antenna structure and the chip body are disposed on the package substrate and are electrically connected to the package substrate. The injection molded piece is configured to package the antenna structure and the chip body.

It can be understood that when the antenna structure is applied to the chip, because the antenna structure can achieve miniaturization, the chip can also achieve miniaturization.

In an implementation, the chip body is a radio frequency transceiver chip. The antenna structure is electrically connected to the chip body via the package substrate.

According to a fifth aspect, this application provides an electronic device. The electronic device includes a circuit board and the chip described above. The chip is disposed on the circuit board.

It can be understood that when the chip is used in the electronic device, because the chip can achieve miniaturization, the electronic device can also achieve miniaturization.

DETAILED DESCRIPTION OF ILLUSTRATIVE EMBODIMENTS

Figure 1:
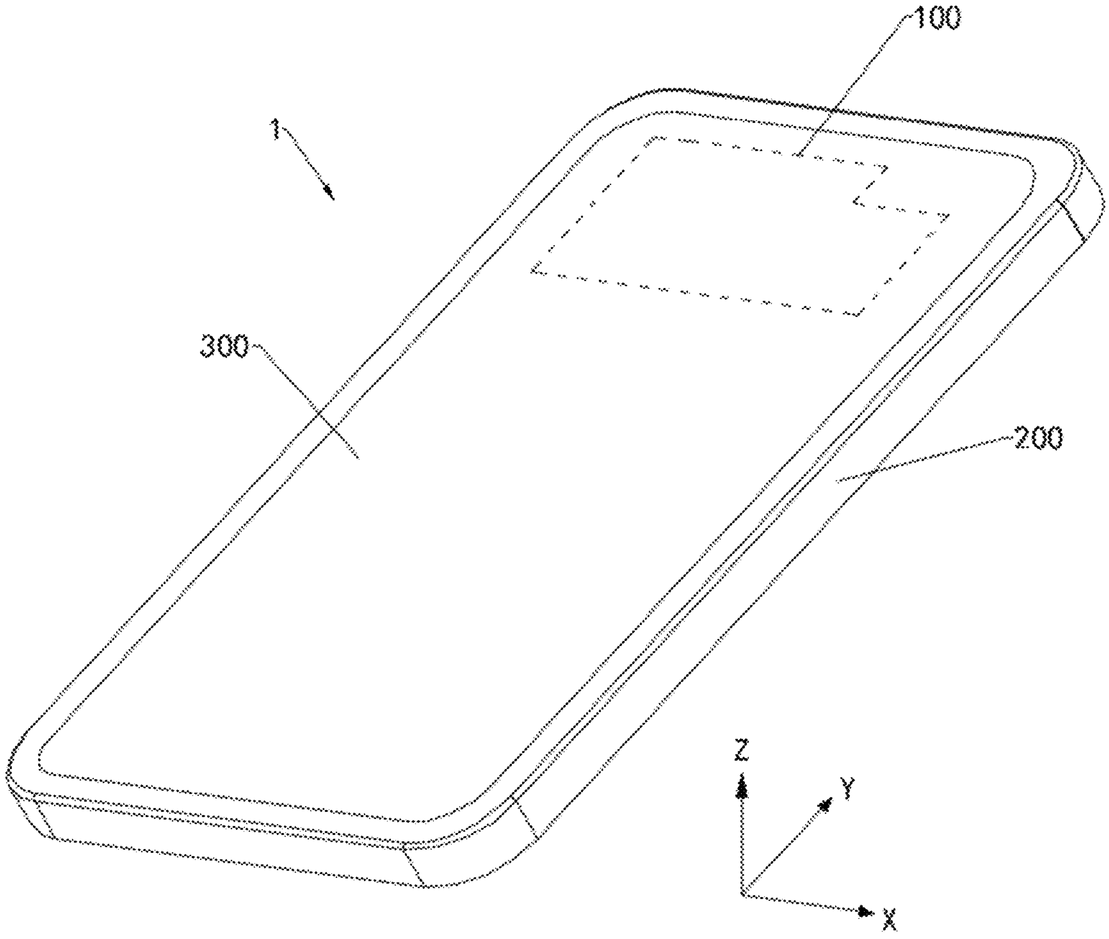
FIG. 1 is a schematic diagram of a structure of an electronic device according to an embodiment of this application.

To facilitate understanding of an antenna structure provided in embodiments of this application, related terms used in this application are explained below.

It should be understood that, in this application, an "electrical connection" may be understood as a manner in which elements or components are physically in contact and electrically conducting; or may be understood as a manner in which different elements or components are connected through a physical line that can transfer an electrical signal in wiring, for example, printed circuit board (Printed Circuit Board, PCB) copper foil or a conductive wire. The electrical connection includes a direct connection and indirect coupling. Both "connection" and "interconnection" may mean a mechanical connection relationship or a physical connection relationship. The term "connection" is used as an example. The term "connection" should be understood in a broad sense. For example, a "connection" may be a detachable connection, a nondetachable connection, may be a direct connection, or may be an indirect connection through an intermediary. For example, a connection between A and B may mean that there is a fastening component (for example, a screw, a bolt, or a rivet) between A and B, or A and B are in contact with each other and A and B are difficult to be separated.

In this application, “length” may be understood as a physical length of an object, or may be understood as an electrical length. The electrical length may be a product of a physical length (that is, a mechanical length or a geometric length) and a ratio of a transmission time period of an electrical or electromagnetic signal in a medium to time required for the signal to pass through a distance as long as the physical length of the medium in free space. The electrical length may satisfy the following formula:

$$\bar{L} = L \times \frac{a}{b}$$

L is the physical length, a is a transmission time period of an electrical or electromagnetic signal in a medium, and b is a transmission time period in free space.

Alternatively, the electrical length may be a ratio of a physical length (that is, a mechanical length or a geometric length) to a wavelength of a transmitted electromagnetic wave. The electrical length may satisfy the following formula:

$$\bar{L} = \frac{L}{\lambda}$$

L is the physical length, and λ is the wavelength of the electromagnetic wave.

Coupling is a phenomenon that two or more circuit elements or electrical networks closely cooperate with and affect each other in input and output, so that energy is transmitted from one side to another side through interaction.

An antenna gain indicates how strong an antenna radiates an input power in a specified direction. Generally, a narrower main lobe of an antenna pattern indicates a smaller side lobe and a higher antenna gain.

Antenna radiation efficiency is a ratio of a power radiated by an antenna into space (that is, a power for effectively converting to an electromagnetic wave) to an active power input to the antenna. The active power input to the antenna is equal to an input power of the antenna minus a power loss. The power loss mainly includes a return power loss and an ohmic power loss of metal and/or a chip bodylectric power loss.

An antenna return loss may be understood as a ratio of a power of a signal reflected back to an antenna port by an antenna circuit to a transmit power of the antenna port. A smaller reflected signal indicates a larger signal radiated by an antenna into space and higher radiation efficiency of the antenna. A larger reflected signal indicates a smaller signal radiated by the antenna into space and lower radiation efficiency of the antenna.

The antenna return loss may be represented by an S11 parameter, and the S11parameter is usually a negative number. A smaller S11 parameter indicates a smaller antenna return loss and higher antenna system efficiency; and a larger S11 parameter indicates a larger antenna return loss and lower antenna system efficiency.

Antenna isolation indicates a ratio of a quantity of signals, transmitted by one antenna, received by another antenna to a quantity of signals transmitted by the antenna. Isolation is a physical quantity used to measure a degree of mutual coupling between antennas. If two antennas form a dual-port network, isolation between the two antennas is S21 and S12 for antennas. The antenna isolation may be represented by S21 and S12 parameters. The S21 and S12 parameters are usually negative numbers. Smaller S21 and S12 parameters indicate larger isolation between antennas and a smaller degree of mutual coupling between the antennas; and larger S21 and S12 parameters indicate smaller isolation between the antennas and a larger degree of mutual coupling between the antennas. The antenna isolation depends on a radiation pattern of the antennas, a spatial distance between the antennas, an antenna gain, and the like.

Reference ground may be a ground layer of a circuit board of an electronic device (for example, a mobile phone), or may be a ground layer formed by a middle plate in an electronic device or a ground metal layer formed by a metal thin film below a screen. A circuit board may be a printed circuit board (printed circuit board, PCB), for example, an 8-layer, 10-layer, or 12-layer to 14-layer board having 8, 10, 12, 13, or 14 layers of a conductive material, or an element that is separated and electrically insulated by using a chip bodylectric layer or insulation layer, for example, glass fiber, polymer, or the like. The circuit board generally includes a chip bodylectric substrate, a ground layer, and a routing layer. The routing layer and the ground layer are electrically connected through vias. Components such as a display 120, a touchscreen, an input button, a transmitter, a processor, a memory, a battery 140, a charging circuit, and a system on chip (system on chip, SoC) structure may be mounted on the circuit board or connected to the circuit board; or may be electrically connected to the routing layer and/or the ground layer of the circuit board. For example, a radio frequency source is disposed in the routing layer.

The ground layer, the ground layer, and the ground metal layer are made of a conductive material. The conductive material may be any one of the following materials: copper, aluminum, stainless steel, brass and alloys thereof, copper foil on a chip bodylectric substrate, aluminum foil on the chip bodylectric substrate, gold foil on the chip bodylectric substrate, silver-plated copper, silver-plated copper foil on the chip bodylectric substrate, silver foil on the chip bodylectric substrate and tin-plated copper, cloth impregnated with graphite powder, a graphite-coated substrate, a copper-plated substrate, a brass-plated substrate and an aluminum-plated substrate. A person skilled in the art can understand that the ground layer/ground layer/ground metal layer may alternatively be made of another conductive material.

Embodiments of this application are described below with reference to the accompanying drawings in embodiments of this application.

In the descriptions of embodiments of this application, “a plurality of” means two or more. In the descriptions of embodiment of this application, a range of A to B includes the endpoints A and B. In addition, orientation terms mentioned in embodiments of this application, for example, “top”, “bottom”, and “side”, are merely directions with reference to the accompanying drawings. Therefore, the orientation terms are used to better and more clearly describe and understand embodiments of this application, but do not indicate or imply that the specified apparatus or element must have a specific orientation, and be constructed and operated in a specific orientation. Therefore, the orientation terms cannot be understood as a limitation on embodiments of this application.

In addition, mathematical concepts mentioned in embodiments of this application such as being symmetric, equal, 45°, parallel, perpendicular, and the like are limitations in terms of existing process level, but are not subject to absolutely strict definitions in a mathematical sense. A small deviation is allowed, so that being approximately symmetric, approximately equal, approximately 45°, approximately parallel, and approximately perpendicular are acceptable. For example, that A is parallel to B means that A and B are parallel or approximately parallel, and an included angle between A and B may be between 0 degrees to 10 degrees. For example, that A is perpendicular to B means that A is perpendicular to B or approximately perpendicular to B, and an included angle between A and B may be between 80 degrees to 100 degrees. FIG. 1 is a schematic diagram of a structure of an electronic device 1 according to an embodiment of this application. The electronic device 1 may be a mobile phone, a watch, a tablet computer (tablet personal computer), a laptop computer (laptop computer), a personal digital assistant (personal digital assistant, PDA), a camera, a personal computer, a notebook computer, a vehicle-mounted device, a wearable, augmented reality (augmented reality, AR) glasses, an AR helmet, virtual reality (virtual reality, VR) glasses, a VR helmet, mixed reality (mixed reality, MR) glasses, an MR helmet, or a device that can be used to transmit a millimeter-wave antenna. In the embodiment shown in FIG. 1, an example in which the electronic device 1 is a mobile phone is used for description.

Figure 2:
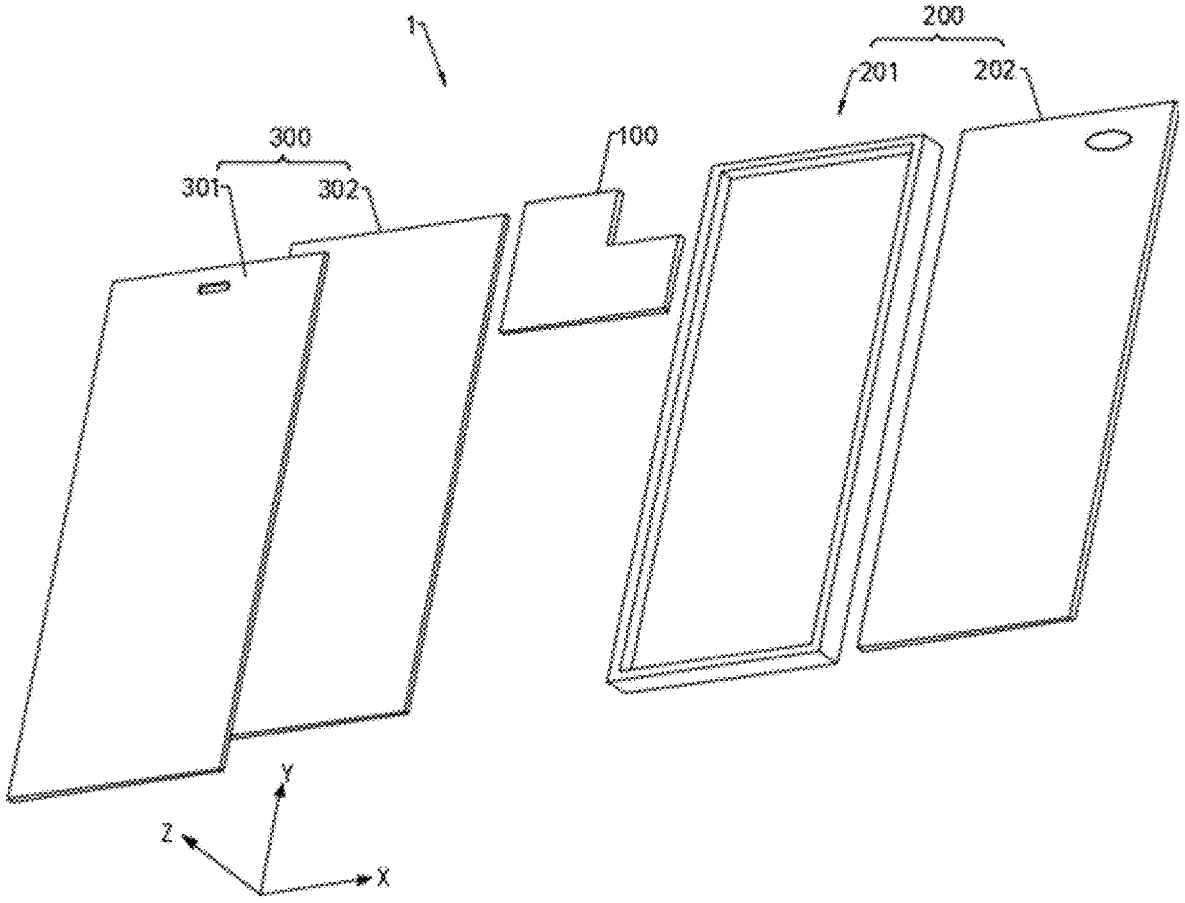
FIG. 2 is an exploded schematic diagram of a part of the electronic device shown in FIG. 1.

Refer to FIG. 2 with reference to FIG. 1. FIG. 2 is an exploded schematic diagram of a part of the electronic device 1 shown in FIG. 1. The electronic device 1 includes a circuit board component 100, a housing 200, and a screen 300. It can be understood that FIG. 1 and FIG. 2 schematically show some components included in the electronic device 1. Actual shapes, actual sizes, actual locations, and actual structures of these components are not limited to those shown in FIG. 1, FIG. 2, and the following accompanying drawings. It should be noted that, because the circuit board component 100 is located inside the electronic device 1, in FIG. 1, the circuit board component 100 is represented schematically by a dashed line.

The screen 300 may be configured to display an image or the like. The screen 300 may be a flat screen, or may be a curved screen. The screen 300 may include a transparent cover plate 301 and a display screen 302. The transparent cover plate 301 is layered on the display screen 302. The transparent cover plate 301 may be disposed in close contact with the display screen 302, and may be configured to provide light transmission, protection, and dust-proof functions for the display screen 302. The transparent cover plate 301 may be made of glass. The display screen 302 may be configured to display an image or the like. The display screen 302 may be a liquid crystal display (liquid crystal display, LCD) screen, an organic light-emitting diode (organic light-emitting diode, OLED) display screen, an active-matrix organic light-emitting diode or active matrix organic light-emitting diode (active-matrix organic light-emitting diode, AMOLED) display screen, a quantum dot light-emitting diode (quantum dot light emitting diode, QLED) display screen, or the like.

For example, the housing 200 includes a frame 201 and a rear cover 202. The rear cover 202 may be fixed to one side of the frame 201 by using an adhesive. In another embodiment, the rear cover 202 and the frame 201 may alternatively be an integrally formed structure.

In addition, the screen 300 may be fixed to the other side of the frame 201 by using an adhesive. The screen 300 is disposed opposite the rear cover 202, and a transparent cover plate 301 of the screen 300 is located on a side that is of a display screen 302 of the screen 300 and that is farther away from the rear cover 202. In this case, the rear cover 202, the frame 201, and the screen 300 may jointly circle up to form an interior of the electronic device 1. Components such as a battery, a speaker, a receiver, a camera, and a microphone may be disposed in the interior of the electronic device 1.

For example, the housing 200 may further include a middle plate (not shown in the figure). The middle plate is located between the screen 300 and the rear cover 202. The middle plate may be at least partly spaced from the frame 201, at least partly connected to an inner side of the frame 201, or partly spaced from the frame and partly connected to an inner side of the frame 201. For example, the inner side of the frame includes an extension part. The frame is connected to the middle plate via the extension part, or the frame and the middle plate are an integrated structure.

In addition, the circuit board component 100 is fastened in the interior of the electronic device 1. For example, the circuit board component 100 may be fastened in the interior of the electronic device 1 by using a fastener (a bolt, a screw, a dowel, or the like). In this case, the housing 200 and the screen 300 can protect the circuit board component 100.

Figure 3:
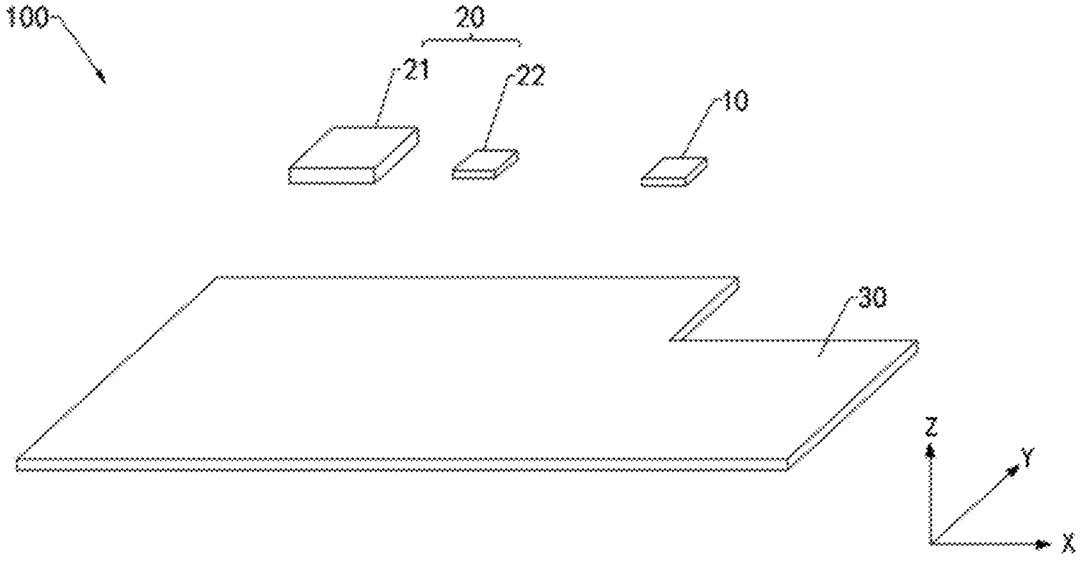
FIG. 3 is an exploded schematic diagram of a part of a circuit board component shown in FIG. 2.

FIG. 3 is an exploded schematic diagram of a part of the circuit board component 100 shown in FIG. 2. The circuit board component 100 includes an antenna structure 10, a radio frequency circuit 20, and a circuit board (printed circuit board, PCB) 30.

The circuit board 30 may be a rigid circuit board, may be a flexible circuit board, or may be a rigid-flex circuit board. In addition, the circuit board 30 may be an FR-4 chip bodylectric board, may be a Rogers (Rogers) chip bodylectric board, may be a hybrid chip bodylectric board of FR-4 and Rogers, or the like. Herein, FR-4 is a grade designation for flame retardant material, and a Rogers chip bodylectric board is a high-frequency board. It can be understood that the circuit board 30 may include one board component. For example, the circuit board 30 may be a primary board, a secondary board, or any flexible circuit board connecting a primary board and a secondary board. For example, both the primary board and the secondary board are rigid circuit boards. The circuit board 30 may alternatively include a plurality of board components. For example, the circuit board 30 may include a primary board, a secondary board, and a subboard. The subboard is electrically connected between the primary board and the secondary board. For example, both the primary board and the secondary board are rigid circuit boards, and the subboard is a flexible circuit board.

Both the antenna structure 10 and the radio frequency circuit 20 are disposed on the circuit board 30. The antenna structure 10 may be electrically connected to the radio frequency circuit 20 via the circuit board 30. In this case, the radio frequency circuit 20 may transmit a radio frequency signal to the antenna structure 10 via the circuit board 30, so that the antenna structure 10 radiates an electromagnetic wave based on the radio frequency signal. In addition, when the antenna structure 10 receives an electromagnetic wave and converts the electromagnetic wave into a radio frequency signal, the radio frequency circuit 20 may further receive, by using the circuit board 30, the radio frequency signal converted by the antenna structure 10.

For example, the antenna structure 10 may be integrated into the circuit board 30. In this case, the antenna structure 10 and the circuit board 30 are an integrally formed structure.

The radio frequency circuit 20 includes a radio frequency transceiver chip 21 and a matching circuit 22. The matching circuit 22 may include electronic components such as an antenna switch, a capacitor, an inductor, or a resistor. The matching circuit 22 is electrically connected between the radio frequency transceiver chip 21 and the antenna structure 10. The radio frequency transceiver chip 21 is configured to transmit a radio frequency signal to the antenna structure 10, so that the antenna structure 10 radiates an electromagnetic wave based on the radio frequency signal. In addition, when the antenna structure 10 receives an electromagnetic wave and converts the electromagnetic wave into a radio frequency signal, the radio frequency transceiver chip 21 may further receive the radio frequency signal converted by the antenna structure 10.

In addition, the matching circuit 22 may be configured to perform signal processing on the radio frequency signal, for example, signal amplification or filtering.

In an embodiment, the antenna structure 10 and the matching circuit 22 may be integrated into the radio frequency transceiver chip 21. In this case, the antenna structure 10, the matching circuit 22, and the radio frequency transceiver chip 21 are an overall structure. In this way, a space in the electronic device 1 occupied by the matching circuit 22 and the antenna structure 10 can be smaller, to improve utilization of an internal space of the electronic device 1, reduce a transmission loss of an antenna, and improve antenna efficiency.

In an embodiment, the circuit board component 100 may further include a functional chip. For example, the functional chip is a central processing unit (central processing unit, CPU), a graphics processing unit (graphics processing unit, GPU), a universal flash storage (universal flash storage, UFS), or a power management integrated circuit (power management integrated circuit).

For example, the radio frequency circuit 20 and the antenna structure 10 may be integrated into the functional chip. In this case, the radio frequency circuit 20, the antenna structure 10, and the functional chip form an overall structure. For example, the radio frequency circuit 20 and the antenna structure 10 may be integrated into a CPU. In this way, a space in the electronic device 1 occupied by the radio frequency circuit 20 and the antenna structure 10 can be smaller, to improve utilization of an internal space of the electronic device 1.

It can be understood that an implementation in which the antenna structure 10 is disposed on the circuit board 30 is provided above. In another implementation, the antenna structure 10 may alternatively be disposed on another substrate, for example, a low-temperature co-fired ceramic (low-temperature co-fired ceramic, LTCC) substrate.

Refer to FIG. 3 again with reference to FIG. 1 and FIG. 2. A radiation direction of the antenna structure 10 may be set in a plurality of manners.

In a first optional manner, the antenna structure 10 may radiate or receive an electromagnetic wave to or from the outside of the electronic device 1 via the rear cover 202.

For example, the rear cover 202 is made of an insulating material (for example, glass, ceramic, or a plastic material), so that the antenna structure 10 can directly radiate or receive an electromagnetic wave to or from the outside of the electronic device 1 via the rear cover 202.

For example, the rear cover 202 is made of a metal material (for example, an aluminum alloy material), and a through hole (not shown in the figure) is provided on the rear cover 202, so that the antenna structure 10 can radiate or receive an electromagnetic wave to or from the outside of the electronic device 1 through the through hole on the rear cover 202. In addition, the through hole is filled with an insulating material (for example, materials such as polymer, glass, or ceramic, or a combination of these materials), so that integrity of the rear cover 202 and surface flatness of the rear cover 201 can be ensured without affecting electromagnetic wave transmission.

In a second optional manner, the antenna structure 10 may radiate or receive an electromagnetic wave to or from the outside of the electronic device 1 via the frame 201.

For example, the frame 201 is made of an insulating material (for example, glass, ceramic, or a plastic material), so that the antenna structure 10 can directly radiate or receive an electromagnetic wave to or from the outside of the electronic device 1 via the frame 201.

For example, the frame 201 is made of a metal material (for example, an aluminum alloy material), and a through hole (not shown in the figure) is provided on the frame 201, so that the antenna structure 10 can radiate or receive an electromagnetic wave to or from the outside of the electronic device 1 through the through hole on the frame 201. In addition, the through hole is filled with an insulating material (for example, materials such as polymer, glass, or ceramic, or a combination of these materials), so that integrity of the frame 201 and surface flatness of the frame 201 can be ensured without affecting electromagnetic wave transmission.

In a third optional manner, the antenna structure 10 may radiate or receive an electromagnetic wave to or from the outside of the electronic device 1 via the screen 300.

For example, the antenna structure 10 is disposed between the transparent cover plate 301 of the screen 300 and the display screen 302 of the screen 300, so that the antenna structure 10 can directly radiate or receive an electromagnetic wave to or from the outside of the electronic device 1 via the transparent cover plate 301.

For example, the antenna structure 10 is directly embedded inside the transparent cover plate 301 of the screen 300, so that an electromagnetic wave can be radiated to or received from the outside of the electronic device 1 via the transparent cover plate 301.

For example, the screen 300 may be a notched screen, a waterdrop screen, or the like. The antenna structure 10 may radiate or receive an electromagnetic wave to or from the outside of the electronic device 1 through a "waterdrop", a "notch", or another location on the screen 300. For example, the "waterdrop" or the "notch" on the screen 300 is a perforated structure. In this case, the antenna structure 10 may radiate or receive an electromagnetic wave to or from the outside of the electronic device 1 through a perforated location on the screen 300.

In another implementation, any two of the first optional manner to the third optional manner may be combined with each other, or the three implementations may be combined. In this way, the antenna structure 10 is not limited to radiation from one part. For example, when the antenna structure 10 is close to the rear cover 202 and the frame 201, the antenna structure 10 may radiate or receive an electromagnetic wave to or from the outside of the electronic device 1 via an insulating part of the rear cover 202 and the frame 201.

For example, the antenna structure 10 may support frequency bands n257, n258, n259, n260, and n261. For example, the antenna structure 10 may cover a frequency range from 24.25 GHz to 43.5 GHz. f0 is defined as a center frequency of the antenna structure 10. In this embodiment, f0=(24.25+43.5)/2 GHZ=33.875 GHz. λ0 is defined as a medium wavelength of the center frequency. The antenna structure 10 may be applied to a millimeter-wave frequency band. The antenna structure 10 may satisfy a 5G (5th Generation, fifth Generation) mobile communication requirement of a user, and be applied to scenarios such as calling or video calling. Alternatively, an NFC (Near Field Communication, near field communication) chip is disposed in the electronic device 1, to satisfy a near field communication requirement of a user, and be applied to scenarios such as mobile payment, public transport payment, and identity verification. In another embodiment, the antenna structure 10 may alternatively cover another frequency band. In this case, the center frequency f0 of the antenna structure 10 changes accordingly.

In embodiments, several manners of disposing the antenna structure 10 are described in detail with reference to related accompanying drawings.

Figure 4:
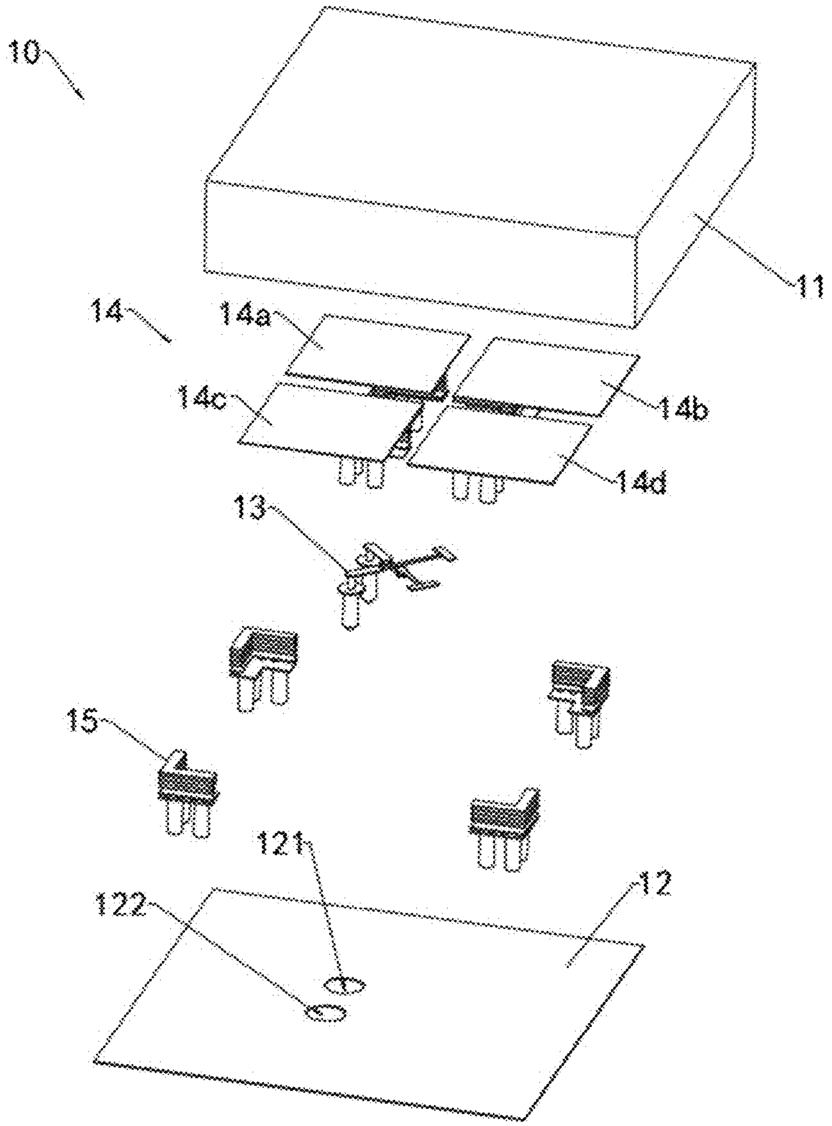
FIG. 4 is an exploded schematic diagram of a part of an antenna structure shown in FIG. 3.

FIG. 4 is an exploded schematic diagram of a part of the antenna structure 10 shown in FIG. 3. The antenna structure 10 includes a chip bodylectric layer 11, a ground layer 12, a feeding element 13, antenna elements 14, and a plurality of matching via groups 15.

The chip bodylectric layer 11 is an LCP (Liquid Crystal Polymer, liquid crystal polymer) chip bodylectric layer 11, may be an FR-4 chip bodylectric layer 11, may be a Rogers (Rogers) chip bodylectric layer 11, may be a hybrid chip bodylectric board of FR-4 and Rogers, or the like. It can be understood that, when the chip bodylectric layer is made of LCP, because a loss tangent of the LCP remains relatively small at a high frequency, the antenna structure may have a relatively small transmission loss, thereby improving antenna radiation efficiency and obtaining a higher antenna gain.

The ground layer 12, the feeding element 13, the antenna elements 14, and the plurality of matching via groups 15 may all be disposed at the chip bodylectric layer 11. It can be understood that the chip bodylectric layer 11 may be configured to support the ground layer 12, the feeding element 13, the antenna elements 14, and the plurality of matching via groups 15, so that the ground layer 12, the feeding element 13, the antenna elements 14, and the plurality of matching via groups 15 form an overall structure.

In an implementation, the chip bodylectric layer 11 may surround or half-surround the ground layer 12, the feeding element 13, the antenna elements 14, and the plurality of matching via groups 15. When the chip bodylectric layer 11 half-surrounds the ground layer 12, the feeding element 13, the antenna elements 14, and the plurality of matching via groups 15, at least a part of the ground layer 12, the feeding element 13, the antenna elements 14, and the plurality of matching via groups 15 may be exposed relative to the chip bodylectric layer 11.

In an implementation, the ground layer 12, the feeding element 13, the antenna elements 14, and the plurality of matching via groups 15 may be disposed on a surface of the chip bodylectric layer 11.

In an embodiment, a structure formed by the ground layer 12, the feeding element 13, the antenna elements 14, and the plurality of matching via groups 15 is a multi-layer structure. In a process of forming the antenna structure 10, the multi-layer structure needs to be formed layer by layer. In a process of forming each layer of the multi-layer structure, a sublayer of the chip bodylectric layer may be correspondingly formed in this embodiment. In this way, after the antenna structure 10 is formed, with the chip bodylectric layer 11, the ground layer 12, the feeding element 13, the antenna elements 14, and the plurality of matching via groups 15 can all be embedded in the chip bodylectric layer 11 just right. Therefore, although the chip bodylectric layer 11 shown in FIG. 4 is an overall structure, the chip bodylectric layer 11 may alternatively be formed by stacking a plurality of sublayers.

In another embodiment, the antenna structure 10 may alternatively not include the chip bodylectric layer 11. In this case, the ground layer 12, the feeding element 13, and the antenna elements 14 may be fastened to each other by using a support or the like.

In another embodiment, the antenna structure 10 may alternatively not include the matching via groups 15.

Refer to FIG. 4 again. The ground layer 12 is configured to provide grounding for the antenna elements 14. The ground layer 12 may be made of a metal material, for example, copper, gold, or silver. A shape of the ground layer 12 may be a square, a rectangle, a circle, or the like. Specifically, the shape of the ground layer 12 is not limited. This embodiment is described by using an example in which the shape of the ground layer 12 is a square.

In addition, the ground layer 12 is provided with a first through hole 121 and a second through hole 122 that are spaced from each other. Both the first through hole 121 and the second through hole 122 penetrate two opposite surfaces of the ground layer 12 (for example, a top surface and a bottom surface of the ground layer 12). The feeding element 13 may be electrically connected to the radio frequency circuit 20 outside the antenna structure 10 through the first through hole 121 and the second through hole 122.

Refer to FIG. 4 again. There may be one or more antenna elements 14. In this implementation, a plurality of antenna elements 14 are used as an example for description. The plurality of antenna elements 14 are arranged in m rows and n columns, where both m and n are positive integers. A gap is formed between two adjacent antenna elements 14. The plurality of antenna elements 14 may form a "1×1" array, a "2×1" array, a "1×2" array, a "2×2" array, a "3×3" array, or the like. This embodiment is described by using an example in which the plurality of antenna elements 14 form a "2×2" array. In this case, there are four antenna elements 14, specifically including a first antenna element **14*a*, a second antenna element 14*b*, a third antenna element 14*c*, and a fourth antenna element 14*d***.

Figure 5:
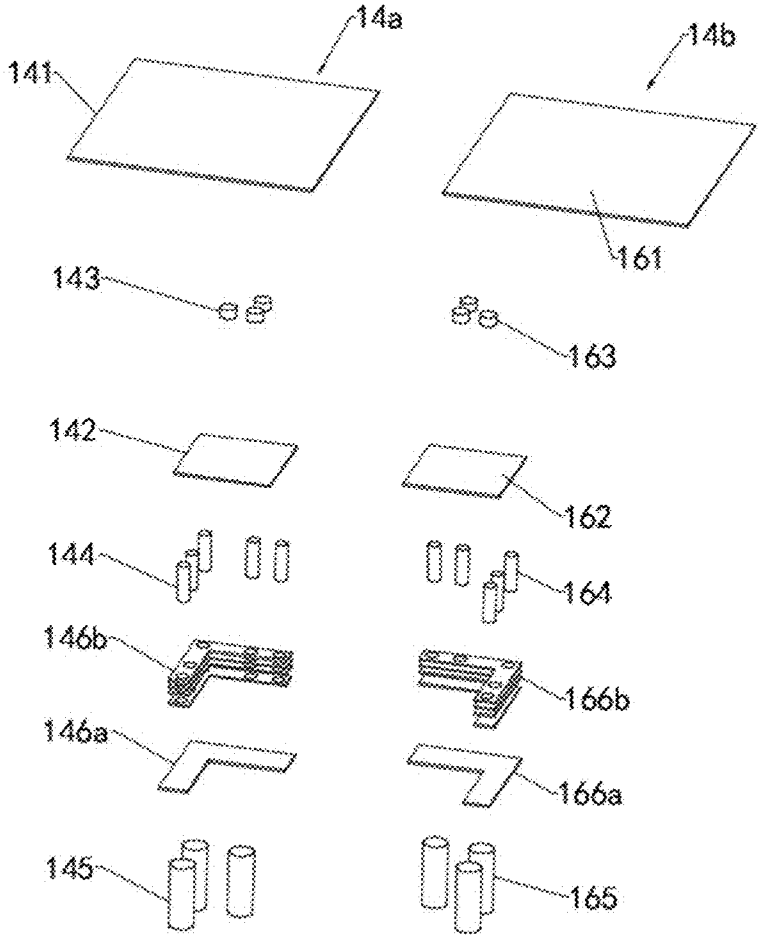
FIG. 5 is an exploded schematic diagram of a first antenna element and a second antenna element shown in FIG. 4.

FIG. 5 is an exploded schematic diagram of the first antenna element **14*a* and the second antenna element 14*b* shown in FIG. 4. The first antenna element 14*a* includes a first metal layer 141, a second metal layer 142, first metal columns 143, second metal columns 144, third metal columns 145, a first metal connection sheet 146*a*, and second metal connection sheets 146*b*. The first metal columns 143 form a first conducting member in an implementation. The second metal columns 144, the third metal columns 145, the first metal connection sheet 146*a*, and the second metal connection sheets 146*b*** form a second conducting member in this implementation.

It should be noted that, to avoid lengthy related descriptions below, the first metal layer 141 of the first antenna element **14*a*, the second metal layer 142 of the first antenna element 14*a*, the first metal columns 143 of the first antenna element 14*a*, the second metal columns 144 of the first antenna element 14*a*, the third metal columns 145 of the first antenna element 14*a*, the first metal connection sheet 146*a* of the first antenna element 14*a*, the second metal connection sheets 146*b* of the first antenna element 14*a*, and related descriptions are simplified as the first metal layer 141, the second metal layer 142, the first metal columns 143, the second metal columns 144, the third metal columns 145, the first metal connection sheet 146***a*, the second metal connection sheets 146*b*, and related descriptions. In addition, the first metal layer 141, the second metal layer 142, the first metal columns 143, the second metal columns 144, the third metal columns 145, the first metal connection sheet 146*a*, the second metal connection sheets 146*b*, and the like are named with a number to distinguish from a first metal layer 161 of the second antenna element 14*b*, a second metal layer 162 of the second antenna element 14*b*, first metal columns 163 of the second antenna element 14*b*, second metal columns 164 of the second antenna element 14*b*, third metal columns 165 of the second antenna element 14*b*, a first metal connection sheet 166*a* of the second antenna element 14*b*, second metal connection sheets 166*b* of the second antenna element 14*b*, and the like below.

Figure 6:
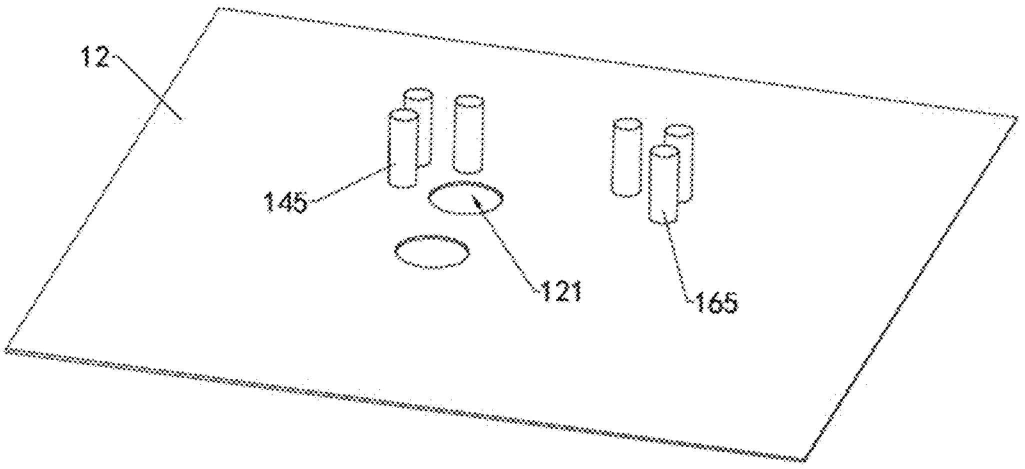
FIG. 6 is a schematic diagram of a part of a structure of an antenna structure shown in FIG. 3.

FIG. 6 is a schematic diagram of a part of a structure of the antenna structure 10 shown in FIG. 3. The third metal columns 145 are connected to the ground layer 12. For example, there are three third metal columns 145. The three third metal columns 145 may be arranged into an "L" shape, or may be arranged into an arc shape. The three third metal columns 145 are disposed half-round the first through hole 121 on the ground layer 12. In another embodiment, a quantity and an arrangement shape of the third metal columns 145 are not specifically limited.

It should be noted that, a structure of the third metal columns 145 may be formed by forming a layer of metal material on a wall of a via. In this case, the third metal columns 145 have a roughly "tube-like" structure. A structure of the third metal columns 145 may alternatively be formed by filling a metal material in a via. In this case, the third metal columns 145 may be a "column-shaped" structure. In another embodiment, the third metal columns 145 may alternatively be another structure. This is not specifically limited in this embodiment. It can be understood that, for a structure of a metal column (for example, the first metal columns 143 and the second metal columns 144) mentioned below, refer to the structure of the third metal columns 145 in this embodiment. Details are not described below again.

Figure 7:
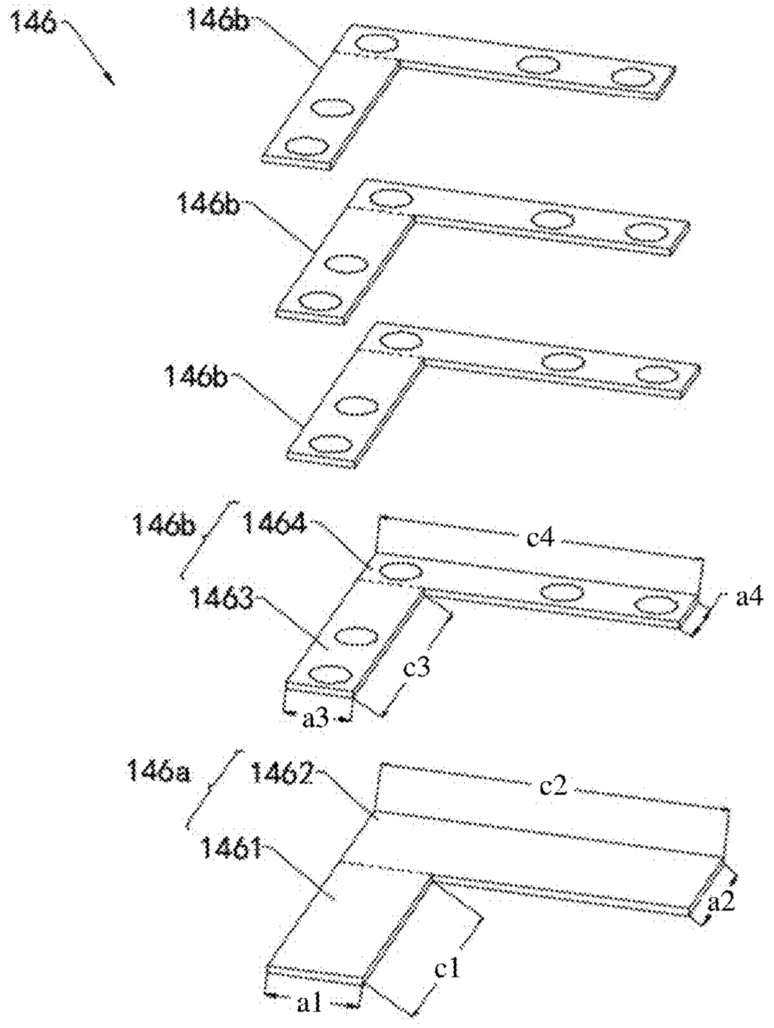
FIG. 7 is a schematic diagram of structures of a first metal connection sheet and a second metal connection sheet of the first antenna element shown in FIG. 5.

FIG. 7 is a schematic diagram of structures of the first metal connection sheet 146*a* and the second metal connection sheets 146*b* of the first antenna element 14*a* shown in FIG. 5. In this embodiment, there is one first metal connection sheet 146*a*. In another embodiment, a quantity of first metal connection sheets 146*a* is not limited.

In addition, the first metal connection sheet 146*a* includes a first connection part 1461 and a second connection part 1462. The first connection part 1461 is connected to the second connection part 1462, to form a bent shape. For example, the first metal connection sheet 146*a* has an "L" shape, an arc shape, or the like. It should be noted that, to clearly describe a structure of the first metal connection sheet 146*a*, in FIG. 7, the first connection part 1461 and the second connection part 1462 are distinguished schematically by using a dashed line.

For example, a width a1 of the first connection part 1461 is equal to a width a2 of the second connection part 1462. In addition, a length c2 of the second connection part 1462 is equal to a sum of a length c1 of the first connection part 1461 and the width a2 of the second connection part 1462. In another embodiment, a size of each part of the first metal connection sheet 146*a* is not specifically limited.

Refer to FIG. 7 again. There may be a plurality of second metal connection sheets 146*b*. For example, there are four second metal connection sheets 146*b*. In another embodiment, a quantity of second metal connection sheets 146*b* is not limited.

In addition, one of the second metal connection sheets 146*b* is used as an example for description. The second metal connection sheet 146*b* includes a third connection part 1463 and a fourth connection part 1464. The third connection part 1463 is connected to the fourth connection part 1464, to form a bent shape. For example, the second metal connection sheet 146*b* may have an "L" shape, an arc shape, or the like. It should be noted that, in FIG. 7, the third connection part 1463 and the fourth connection part 1464 are distinguished schematically by using a dashed line.

For example, a width a3 of the third connection part 1463 is equal to a width a4 of the fourth connection part 1464. The width a3 of the third connection part is less than the width a1 of the first connection part 1461. The width a4 of the fourth connection part 1464 is less than the width a2 of the second connection part 1462. In addition, a length c4 of the fourth connection part 1464 is equal to a sum of a length c3 of the third connection part 1463 and the width a4 of the fourth connection part 1464. The length c4 of the fourth connection part 1464 is equal to the length c2 of the second connection part 1462. In another embodiment, a size of each part of the second metal connection sheet 146*b* is not specifically limited.

Figure 8:
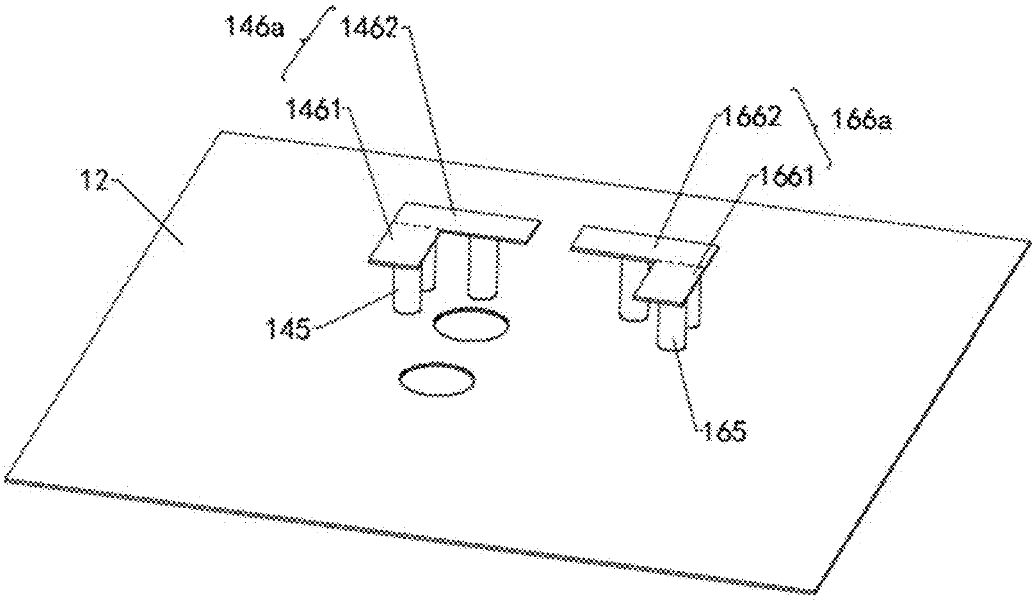
FIG. 8 is a schematic diagram of a part of a structure of an antenna structure shown in FIG. 3.

FIG. 8 is a schematic diagram of a part of the structure of the antenna structure 10 shown in FIG. 3. The ground layer 12 and the first metal connection sheet 146*a* are spaced from and disposed opposite each other, and the first metal connection sheet 146*a* is connected to end parts that are of the third metal columns 145 and that are farther away from the ground layer 12. In this case, the third metal columns 145 are connected between the ground layer 12 and the first metal connection sheet 146*a*, and the third metal columns 145, the ground layer 12, and the first metal connection sheet 146*a* are electrically connected to each other.

For example, one of the third metal columns 145 is connected to the first connection part 1461 of the first metal connection sheet 146*a*. Two of the third metal columns 145 are connected to the second connection part 1462 of the first metal connection sheet 146*a*. In addition, the third metal columns 145 may penetrate the first metal connection sheet 146*a*.

Figure 9:
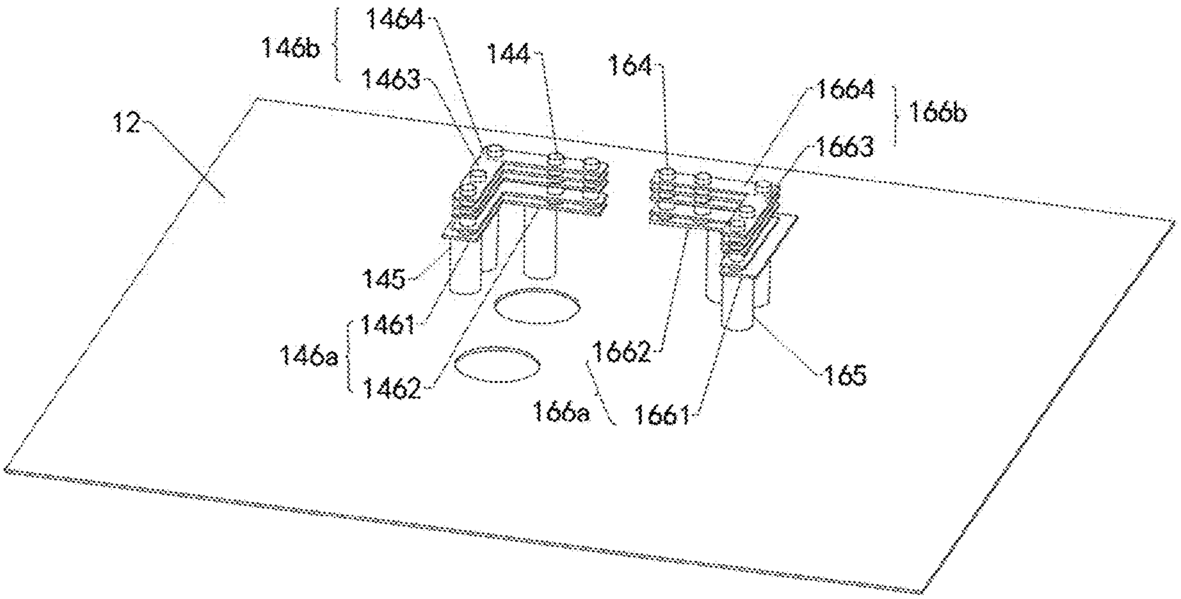
FIG. 9 is a schematic diagram of a part of a structure of an antenna structure shown in FIG. 3.

Refer to FIG. 9 with reference to FIG. 8. FIG. 9 is a schematic diagram of a part of the structure of the antenna structure 10 shown in FIG. 3. The plurality of second metal connection sheets 146*b* are located on a side that is of the first metal connection sheet 146*a* and that is farther away from the third metal columns 145. The plurality of second metal connection sheets 146*b* are disposed along a thickness direction of the antenna structure 10 and are spaced from each other. Third connection parts 1463 of the second metal connection sheets 146*b* are spaced from and disposed opposite each other, and each are spaced from and disposed opposite the first connection part 1461 of the first metal connection sheet 146*a*. Fourth connection parts 1464 of the second metal connection sheets 146*b* are spaced from and disposed opposite each other, and each are spaced from and disposed opposite the second connection part 1462 of the first metal connection sheet 146*a*.

The plurality of second metal columns 144 are spaced from each other, and one end of each of the second metal columns 144 is further connected to the first metal connection sheet 146*a*. Projections of the plurality of second metal columns 144 on the first metal connection sheet 146*a* at least partly overlap projections of the plurality of third metal columns 145 on the first metal connection sheet 146*a*. In addition, the plurality of second metal columns 144 are further connected to the plurality of second metal connection sheets 146*b*. The second metal connection sheets 146*b*, the second metal columns 144, the first metal connection sheet 146*a*, the third metal columns 145, and the ground layer 12 are electrically connected to each other.

For example, the plurality of second metal columns 14 may be arranged into an "L" shape, or may be arranged into an arc shape.

For example, each of the second metal columns 144 may penetrate each of the second metal connection sheets 146*b*. In this case, the second metal columns 144 and the second metal connection sheets 146*b* are connected to each other more stably. In another implementation, each of the second metal columns 144 may not penetrate each of the second metal connection sheets 146*b*. In this case, the second metal columns 144 are disposed between every two second metal connection sheets 146*b*, and the second metal columns 144 are disposed between the second metal connection sheets 146*b* and the first metal connection sheet 146*a*, so that the second metal connection sheets 146*b*, the second metal columns 144, and the first metal connection sheet 146*a* are electrically connected to each other.

In this embodiment, a diameter of the second metal column 144 is less than a diameter of the third metal column 145. It can be understood that, when the diameter of the second metal column 144 is smaller, a thickness of a chip bodylectric layer surrounding the second metal columns 144 may be made small. When the diameter of the third metal column 145 is larger, a thickness of a chip bodylectric layer surrounding the third metal columns 145 may be made large. In this way, in a forming process of the antenna structure 10, the two chip bodylectric boards (one chip bodylectric board is provided with the second metal columns 144, and the other chip bodylectric board is provided with the third metal columns 145) of different thicknesses may be stacked up into a whole by bonding, welding, or the like.

In addition, when the diameter of the second metal column 144 is less than the diameter of the third metal column 145, the width a3 of the third connection part is set to less than the width a1 of the first connection part 1461, and the width a4 of the fourth connection part 1464 is set to less than the width a2 of the second connection part 1462, so that there is enough room on the first connection part 1461 and the second connection part 1462 for a connection to the third metal columns 145, and high connection stability is ensured.

In another embodiment, the first antenna element 14*a* may not include the third metal columns 145 and the first metal connection sheet 146*a*. In this case, the second metal columns 144 may be directly connected to the ground layer 12.

In another embodiment, the first antenna element 14*a* may not include the second metal connection sheets 146*b*.

Figure 10:
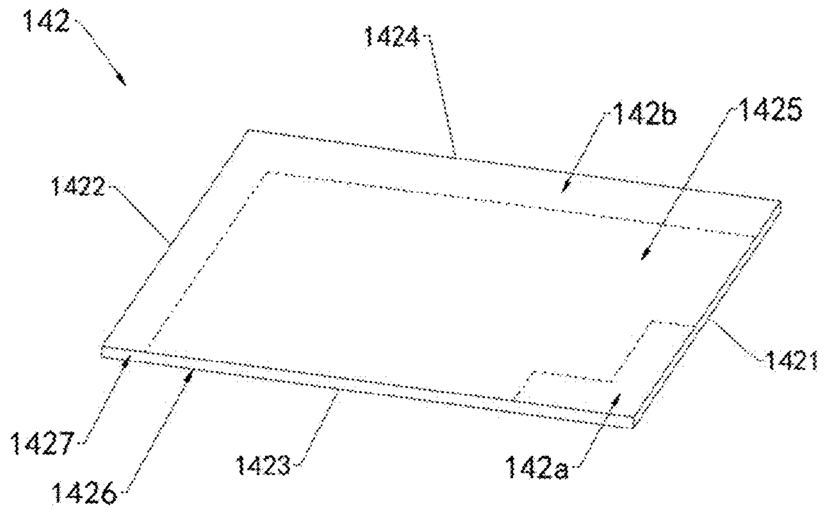
FIG. 10 is a schematic diagram of a structure of a second metal sheet of the first antenna element shown in FIG. 5.

FIG. 10 is a schematic diagram of a structure of the second metal sheet 142 of the first antenna element 14*a* shown in FIG. 5. The second metal layer 142 includes a top surface 1425 and a bottom surface 1426 that are disposed opposite each other, and a lateral surface 1427 that connects the top surface 1425 and the bottom surface 1426. Because a thickness of the first metal layer 141 in embodiments is smaller than a length and a width of the first metal layer 141, a distance between the top surface 1425 of the first metal layer 141 and the bottom surface 1426 of the first metal layer 141 is small. The top surface 1425 of the first metal layer 141 and the bottom surface 1426 of the first metal layer 141 have a roughly same structure. In this way, this embodiment can be described by using the top surface 1425 of the first metal layer 141 as an example. In addition, because the thickness of the first metal layer 141 is relatively small, a structure of the first metal layer 141 is slightly affected by a structure of the lateral surface 1427 of the first metal layer 141. Therefore, as the structure of the top surface 1425 of the first metal layer 141 is described, a three-dimensional structure of the first metal layer 141 may be further roughly reflected.

A shape of the second metal layer 142 may be a square, a rectangle, a circle, or the like. This embodiment is described by using an example in which the shape of the second metal layer 142 is a square. Specifically, the second metal layer 142 includes a first edge 1421 and a second edge 1422 that are disposed opposite each other, and a third edge 1423 and a fourth edge 1424 that are disposed opposite each other. The third edge 1423 and the fourth edge 1424 are connected between the first edge 1421 and the second edge 1422. Because the second metal layer 142 is a square, lengths of the first edge 1421, the second edge 1422, the third edge 1423, and the fourth edge 1424 of the second metal layer 142 are all equal. For example, a length b1 of the edges of the second metal layer 142 is equal to the length c4 of the second connection part 1464 of the second metal connection sheet 146*b* (refer to FIG. 7).

In this embodiment, the second metal layer 142 includes a first area 142*a* and a second area 142*b* that are spaced from each other. In FIG. 10, the first area 142*a* and the second area 142*b* are distinguished schematically by using a dashed line. For example, the first area 142*a* and the second area 142*b* may each have an "L" shape. The first area 142*a* is disposed near the first edge 1421 and the third edge 1423. The second area 142*b* is disposed near the second edge 1422 and the fourth edge 1424. In another embodiment, shapes of the first area 142*a* and the second area 142*b* are not specifically limited.

Figure 11:
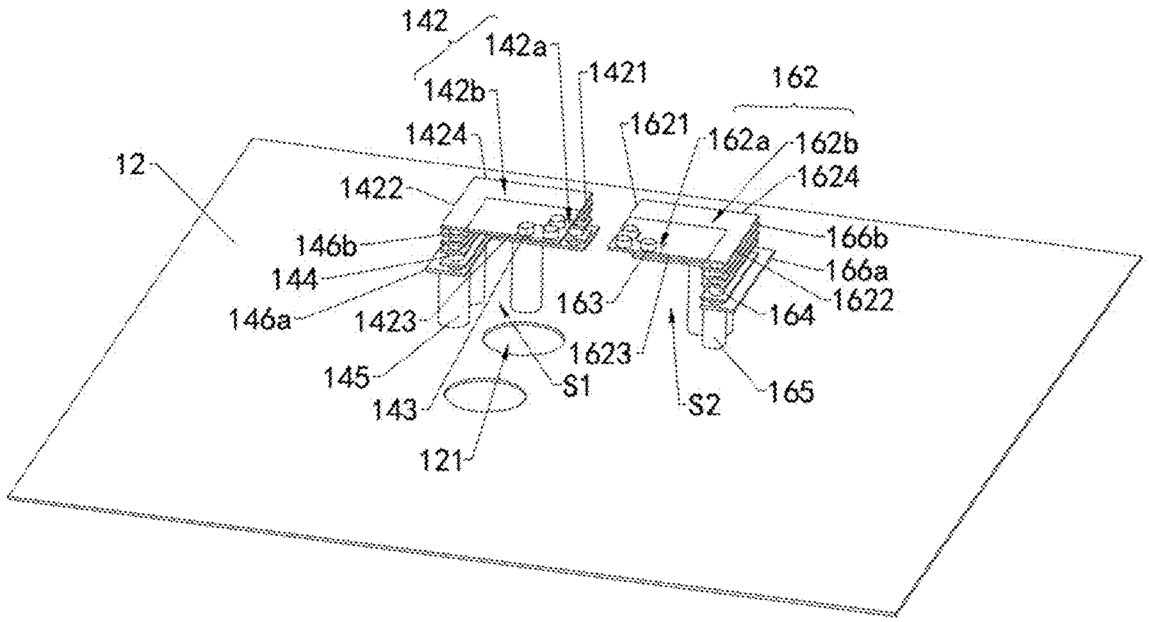
FIG. 11 is a schematic diagram of a part of a structure of an antenna structure shown in FIG. 3.

Refer to FIG. 11 with reference to FIG. 9 and FIG. 10. FIG. 11 is a schematic diagram of a part of the structure of the antenna structure 10 shown in FIG. 3. The second metal layer 142 and the second metal connection sheets 146*b* are spaced from and disposed opposite each other. One end of each of the second metal columns 144 is connected to the second area 142*b* of the second metal layer 142. In this case, each of the second metal columns 14 is connected between the second area 142*b* of the second metal layer 142 and the first metal connection sheet 146*a*. A part of the second metal columns 144 are disposed near the second edge 1422 of the second metal layer 142, and a part of the second metal columns 144 are disposed near the fourth edge 1424 of the second metal layer 142.

In this implementation, the second metal layer 142, the second metal columns 144, the third metal columns 145, the first metal connection sheet 146*a*, the second metal connection sheets 146*b*, and the ground layer 12 circle up to form a first space S1. It can be understood that another component of the antenna structure 10 may be disposed in the first space S1. In this way, on one hand, space utilization of the antenna structure 10 is high. On the other hand, the antenna structure 10 may be compactly disposed, to facilitate miniaturization of the antenna structure 10.

For example, the first through hole 121 on the ground layer 12 is interconnected to the first space S1.

In addition, one end of each of the first metal columns 143 is connected to the first area 142*a* of the second metal layer 142. For example, there are three first metal columns 143. The three first metal columns 143 may be arranged into an "L" shape, or may be arranged into an arc shape.

It can be understood that, as the second metal columns 144 are connected to the second area 142*b* of the second metal layer 142, and the first metal columns 143 are connected to the first area 142*a* of the second metal layer 142, in this case, the first metal columns 143 and the second metal columns 144 are spaced from each other in two areas of the second metal layer 142. To be specific, projections of the first metal columns 143 on the second metal layer 142 do not overlap projections of the second metal columns 144 on the second metal layer 142. In addition, the first metal columns 143, the second metal layer 142, the second metal columns 144, the third metal columns 145, the first metal connection sheet 146*a*, the second metal connection sheets 146*b*, and the ground layer 12 are electrically connected to each other.

Figure 12:
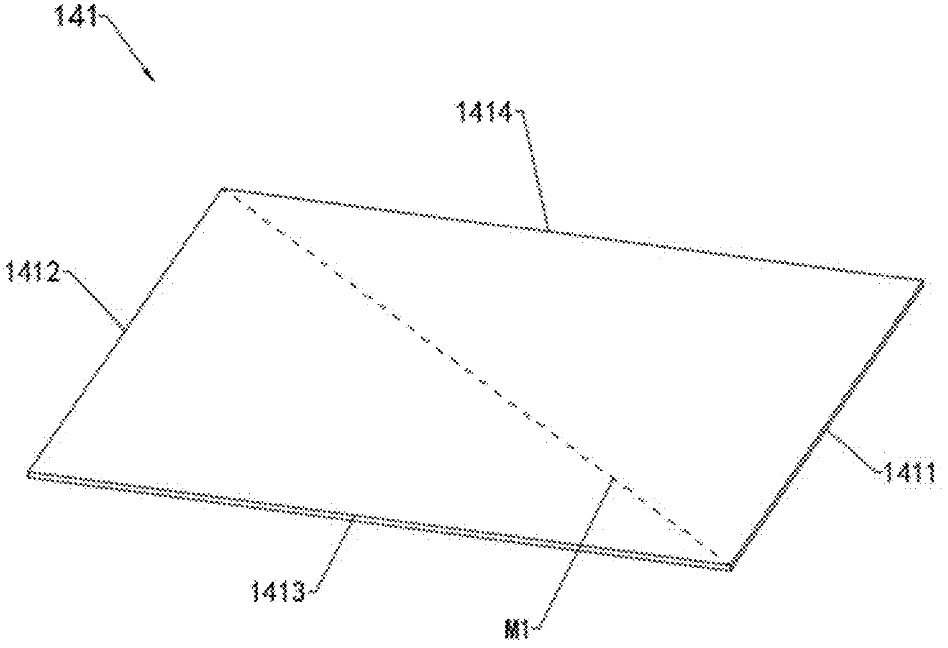
FIG. 12 is a schematic diagram of a structure of a first metal sheet of the first antenna element shown in FIG. 5.

FIG. 12 is a schematic diagram of a structure of the first metal sheet 141 of the first antenna element 14*a* shown in FIG. 5. A shape of the first metal layer 141 may be a square, a rectangle, a circle, or the like. This embodiment is described by using an example in which the shape of the first metal layer 141 is a square. Specifically, the first metal layer 141 includes a first edge 1411 and a second edge 1412 that are disposed opposite each other, and a third edge 1413 and a fourth edge 1414 that are disposed opposite each other. The third edge 1413 and the fourth edge 1414 are connected between the first edge 1411 and the second edge 1412. Because the first metal layer 141 is a square, lengths of the first edge 1411, the second edge 1412, the third edge 1413, and the fourth edge 1414 of the first metal layer 141 are all equal. For example, the length of the edge of the first metal layer 141 is in the range of 0.25λ0 to 0.35λ0. In this embodiment, a size of the first metal layer 141 is greater than a size of the second metal layer 142.

In addition, there is a diagonal line M1 of the first metal layer 141. One end of the diagonal line M1 is located at a joint between the first edge 1411 and the third edge 1413, and the other end is located at a joint between the second edge 1412 and the fourth edge 1414. It should be noted that the diagonal line M1 is not an actual structure on the first metal layer 141. The diagonal line M1 is a virtual line. FIG. 12 shows the diagonal line M1 represented by a dashed line.

Figure 13:
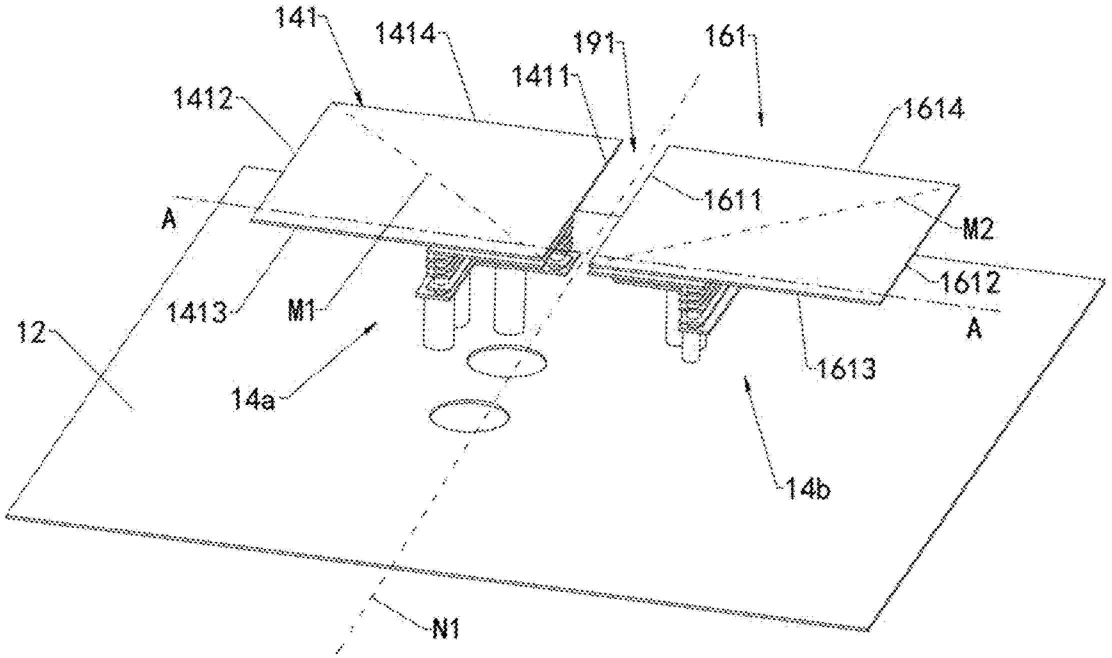
FIG. 13 is a schematic diagram of a part of a structure of an antenna structure shown in FIG. 3.

Refer to FIG. 13 with reference to FIG. 11 and FIG. 12. FIG. 13 is a schematic diagram of a part of the structure of the antenna structure 10 shown in FIG. 3. The first metal layer 141 and the second metal layer 142 are spaced from and disposed opposite each other. The first metal layer 141 is fastened to end parts of the first metal columns 143. The first metal columns 143 are connected between the first metal layer 141 and the first area 142*a* of the second metal layer 142. The first metal layer 141 is electrically connected to the first metal columns 143. In addition, a projection of the second metal layer 142 on a plane, on which the first metal layer 141 is located, is located in the first metal layer 141. A projection of the first metal layer 141 on the ground layer 12 is located in the ground layer 12.

For example, the first edge 1411 of the first metal layer 141 is disposed opposite the first edge 1421 of the second metal layer 142. In other words, a projection of the first edge 1421 of the second metal layer 142 on the first metal layer 141 overlaps the first edge 1411 of the first metal layer 141. The third edge 1413 of the first metal layer 141 is disposed opposite the third edge 1423 of the second metal layer 142. In other words, a projection of the third edge 1423 of the second metal layer 142 on the first metal layer 141 overlaps the third edge 1413 of the first metal layer 141.

Figure 14:
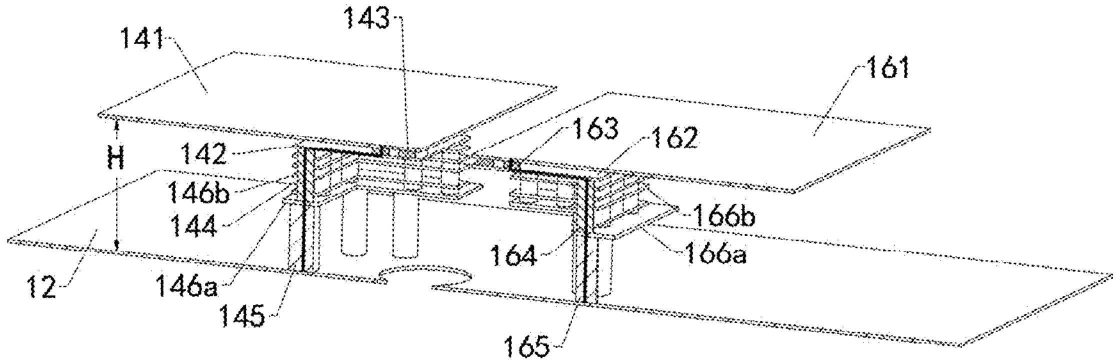
FIG. 14 is a schematic cross-sectional diagram of a part of the antenna structure shown in FIG. 13 cut along a line A-A.

FIG. 14 is a schematic cross-sectional diagram of a part of the antenna structure 10 shown in FIG. 13 cut along a line A-A. As the first metal columns 143 and the second metal columns 144 are spaced from each other in two areas of the second metal layer 142, when the first antenna element 14*a* is in a working state, a current path (simply represented by thick lines in FIG. 14) includes the ground layer 12, the third metal columns 145, the first metal connection sheet 146*a*, the second metal columns 144, the second area 142*b* (refer to FIG. 11) of the second metal layer 142, and the first area 142*a* (refer to FIG. 11) of the second metal layer 142, the first metal columns 143, and the first metal layer 141. Because a current may be transmitted between the first area 142*a* and the second area 142*b* of the second metal layer 142, the current path is disposed as bent once. Compared with an antenna structure that has a same current path, where the current path of the antenna structure is straight, a cross-sectional height H of the antenna structure 10 in this embodiment is smaller, to facilitate achieving thinness of the antenna structure 10.

For example, when a length of the current path (to be specific, an electrical length is equal to a sum of the cross-sectional height H of the antenna structure 10 and the length of the edge of the second metal layer 142) is in the range of 0.25λ0 to 0.32λ0, the cross-sectional height H of the antenna structure 10 may be in the range of 0.15λ0 to 0.21λ0. In this way, the cross-sectional height H of the antenna structure 10 in this implementation is greatly reduced from another cross-sectional height of the antenna structure 10.

For example, the first antenna element 14*a* may be a symmetric structure, a partly symmetric structure, a structure having same or similar parts, or a structure having different parts. In this embodiment, the first antenna element 14*a* is a symmetric structure. Specifically, refer to FIG. 13 again. The first antenna element 14*a* is symmetrical along a symmetry plane of the first antenna element 14*a*. The symmetry plane of the first antenna element 14*a* is perpendicular to the plane on which the first metal layer 141 is located, and the diagonal line M1 of the first metal layer 141 is located on the symmetry plane of the first antenna element 14*a*.

Refer to FIG. 5 again. The second antenna element 14*b* includes a first metal layer 161, a second metal layer 162, first metal columns 163, second metal columns 164, third metal columns 165, a first metal connection sheet 166*a*, and second metal connection sheets 166*b*. For structures of the first metal layer 161, the second metal layer 162, the first metal columns 163, the second metal columns 164, the third metal columns 165, the first metal connection sheet 166*a*, and the second metal connection sheets 166*b*, refer to structures of the first metal layer 141, the second metal layer 142, the first metal columns 143, the second metal columns 144, the third metal columns 145, the first metal connection sheet 146*a*, and the second metal connection sheets 146*b* of the first antenna element 14*a*. Details are not described herein again.

In another embodiment, the second antenna element 14*b* may not include the third metal columns 165, the first metal connection sheet 166*a*, and the second metal connection sheets 166*b*.

Refer to FIG. 6 again. The third metal columns 165 are connected to the ground layer 12. The third metal columns 165 of the second antenna element 14*b* are located on one side of the third metal columns 145 of the first antenna element 14*a*. For example, there are three third metal columns 165. The three third metal columns 165 are arranged into an “L” shape, or into an arc shape. In another embodiment, a quantity of third metal columns 165 is not specifically limited.

Refer to FIG. 8 again. The first metal connection sheet 166*a* is connected to end parts that are of the third metal columns 165 and that are farther away from the ground layer 12. In this case, the third metal columns 165 are connected between the first metal connection sheet 166*a* and the ground layer 12, and the third metal columns 165, the first metal connection sheet 166*a*, and the ground layer 12 are electrically connected to each other.

In addition, a first connection part 1661 of the first metal connection sheet 166*a* of the second antenna element 14*b* is disposed opposite the first connection part 1461 of the first metal connection sheet 146*a* of the first antenna element 14*a*. A second connection part 1662 of the first metal connection sheet 166*a* of the second antenna element 14*b* is disposed opposite the second connection part 1642 of the first metal connection sheet 146*a* of the first antenna element 14*a*.

For example, one of the third metal columns 165 is connected to the first connection part 1661 of the first metal connection sheet 166*a*. Two of the third metal columns 165 are connected to the second connection part 1662 of the first metal connection sheet 166*a*.

Refer to FIG. 9 with reference to FIG. 8. The plurality of second metal connection sheets 166*b* are located on a side that is of the first metal connection sheet 166*a* and that is farther away from the third metal columns 165. The plurality of second metal connection sheets 166*b* are disposed along the thickness direction of the antenna structure 10 and are spaced from each other. Third connection parts 1663 of the second metal connection sheets 166*b* are spaced from and disposed opposite each other, and each are spaced from and disposed opposite the first connection part 1661 of the first metal connection sheet 166*a*. Fourth connection parts 1664 of the second metal connection sheets 166*b* are spaced from and disposed opposite each other, and each are spaced from and disposed opposite the second connection part 1662 of the first metal connection sheet 166*a*.

In addition, the plurality of second metal columns 164 are spaced from each other, and one end of each of the second metal columns 164 is further connected to the first metal connection sheet 166*a*. Projections of the plurality of second metal columns 164 on the first metal connection sheet 166*a* at least partly overlap projections of the plurality of third metal columns 165 on the first metal connection sheet 166*a*. The plurality of second metal columns 164 are further connected to the plurality of second metal connection sheets 166*b*. In this case, the second metal connection sheets 166*b*, the second metal columns 164, the first metal connection sheet 166*a*, the third metal columns 165, and the ground layer 12 are electrically connected to each other.

For example, each of the second metal columns 164 may penetrate each of the second metal connection sheets 166*b*. In this case, the second metal columns 164 and the second metal connection sheets 166*b* are connected to each other more stably. In another implementation, each of the second metal columns 164 may not penetrate each of the second metal connection sheets 166*b*. In this case, the second metal columns 164 are disposed between every two second metal connection sheets 166*b*, and the second metal columns 164 are disposed between the second metal connection sheets 166*b* and the first metal connection sheet 166*a*, so that the second metal connection sheets 166*b*, the second metal columns 164, and the first metal connection sheet 166*a* are electrically connected to each other.

In another embodiment, when the second antenna element 14*b* does not include the third metal columns 165 and the first metal connection sheet 166*a*, the second metal columns 164 may be directly connected to the ground layer 12.

Refer to FIG. 11 again with reference to FIG. 9 and FIG. 10. The second metal layer 162 is fastened to end parts of the plurality of second metal columns 164. A first edge 1621 of the second metal layer 162 of the second antenna element 14*b* and the first edge 1421 of the second metal layer 142 of the first antenna element 14*a* are spaced from each other.

One end of each of the second metal columns 164 is connected to a second area 162*b* of the second metal layer 162. In this case, a part of the second metal columns 164 are disposed near a second edge 1622 of the second metal layer 162. A part of the second metal columns 144 are disposed near a fourth edge 1624 of the second metal layer 162.

It can be understood that the second metal layer 162, the second metal columns 164, the third metal columns 165, the first metal connection sheet 166*a*, the second metal connection sheets 166*b*, and the ground layer 12 circle up to form a second space S2. The second space S2 is interconnected to the first space S1. It can be understood that another component of the antenna structure 10 may be disposed in the second space S2. In this way, on one hand, space utilization of the antenna structure 10 is high. On the other hand, the antenna structure 10 may be compactly disposed, to facilitate miniaturization of the antenna structure 10.

In addition, one end of each of the first metal columns 163 is connected to a first area 162*a* of the second metal layer 162. For example, there are three first metal columns 163. The three first metal columns 163 are arranged into an "L" shape.

It can be understood that, as the second metal columns 164 are connected to the second area 162*b* of the second metal layer 162, and the first metal columns 163 are connected to the first area 162*a* of the second metal layer 162, in this case, the first metal columns 163 and the second metal columns 164 are spaced from each other in two areas of the second metal layer 162. To be specific, projections of the first metal columns 163 on the second metal layer 162 do not overlap projections of the second metal columns 164 on the second metal layer 162. In addition, the first metal columns 163, the second metal layer 162, the second metal columns 164, the third metal columns 165, the first metal connection sheet 166*a*, the second metal connection sheets 166*b*, and the ground layer 12 are electrically connected to each other.

Refer to FIG. 13 with reference to FIG. 11. The first metal layer 161 and the second metal layer 162 are spaced from and disposed opposite each other. The first metal layer 161 is fastened to end parts of the first metal columns 163. In this case, the first metal layer 161 is electrically connected to the first metal columns 163. A projection of the second metal layer 162 on a plane, on which the first metal layer 161 is located, is located in the first metal layer 161. A projection of the first metal layer 161 on the ground layer 12 is located in the ground layer 12.

In this embodiment, a first edge 1611 of the first metal layer 161 of the second antenna element 14*b* and the first edge 1411 of the first metal layer 141 of the first antenna element 14*a* form a first gap 191. A projection of the first gap 191 on the ground layer 12 is located in the ground layer 12.

For example, a projection of the first edge 1621 of the second metal layer 162 on the first metal layer 161 overlaps the first edge 1611 of the first metal layer 161. A projection of a third edge 1623 of the second metal layer 162 on the first metal layer 161 overlaps a third edge 1613 of the first metal layer 161.

Refer to FIG. 14 again. As the first metal columns 163 and the second metal columns 164 are spaced from each other in two areas of the second metal layer 162, when the second antenna element 14*b* is in a working state, a current path (simply represented by thick lines in FIG. 14) includes the ground layer 12, the third metal columns 165, the first metal connection sheet 166*a*, the second metal columns 164, and the second area 162*b* (refer to FIG. 11) of the second metal layer 162, the first area 162*a* (refer to FIG. 11) of the second metal layer 162, the first metal columns 163, and the first metal layer 161. Because the current may be transmitted between the first area 162*a* and the second area 162*b* of the second metal layer 162, the current path is disposed as bent once. In this way, compared with an antenna structure that has a same current path, where the current path of the antenna structure is straight, a cross-sectional height H of the antenna structure 10 in this embodiment is smaller, to facilitate achieving thinness of the antenna structure 10.

For example, the second antenna element 14*b* may be a symmetric structure, a partly symmetric structure, a structure having same or similar parts, or a structure having different parts. In this embodiment, the second antenna element 14*b* is a symmetric structure. Specifically, refer to FIG. 13 again. The second antenna element 14*b* is symmetrical along a symmetry plane of the second antenna element 14*b*. The symmetry plane of the second antenna element 14*b* is perpendicular to the plane on which the first metal layer 161 is located, and a diagonal line M2 of the first metal layer 161 is located on the symmetry plane of the second antenna element 14*b*. One end of the diagonal line M2 of the first metal layer 161 is located at a joint between the first edge 1611 and the third edge 1613, and the other end is located at a joint between a second edge 1612 and a fourth edge 1614.

For example, the second antenna element 14*b* and the first antenna element 14*a* may be symmetrical, partly symmetrical, have a same or similar structure, or have different structures. In embodiments, the second antenna element 14*b* and the first antenna element 14*a* form a symmetric structure. Specifically, the second antenna element 14*b* and the first antenna element 14*a* are symmetrical along a first symmetry plane N1. It should be noted that the first symmetry plane N1 is not an actual structure on the antenna structure 10. The first symmetry plane N1 is a virtual plane. In FIG. 13, the first symmetry plane N1 is represented schematically by a dashed line.

Figure 15:
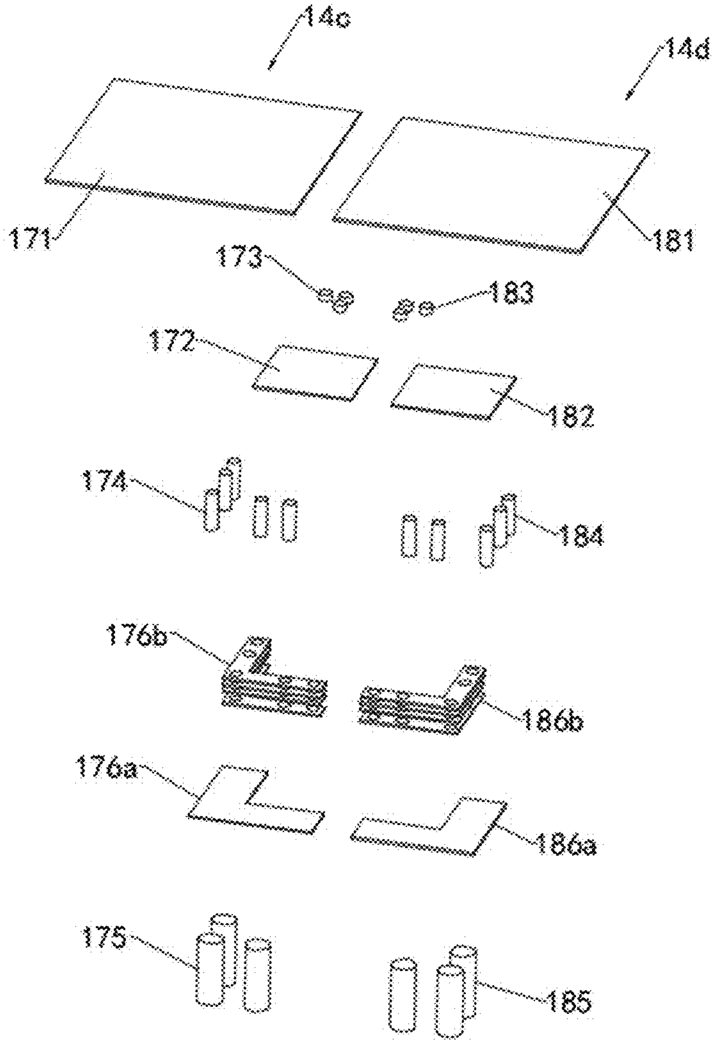
FIG. 15 is an exploded schematic diagram of a third antenna element and a fourth antenna element shown in FIG. 4.

FIG. 15 is an exploded schematic diagram of the third antenna element 14*c* and the fourth antenna element 14*d* shown in FIG. 4. The third antenna element 14*c* includes a first metal layer 171, a second metal layer 172, first metal columns 173, second metal columns 174, third metal columns 175, a first metal connection sheet 176*a*, and second metal connection sheets 176*b*. For structures of the first metal layer 171, the second metal layer 172, the first metal columns 173, the second metal columns 174, the third metal columns 175, the first metal connection sheet 176*a*, and the second metal connection sheets 176*b*, refer to structures of the first metal layer 141, the second metal layer 142, the first metal columns 143, the second metal columns 144, the third metal columns 145, the first metal connection sheet 146*a*, and the second metal connection sheets 146*b* of the first antenna element 14*a*. Details are not described herein again.

In another embodiment, the third antenna element 14*c* may not include the third metal columns 175, the first metal connection sheet 176*a*, and the second metal connection sheets 176*b*.

Figure 16:
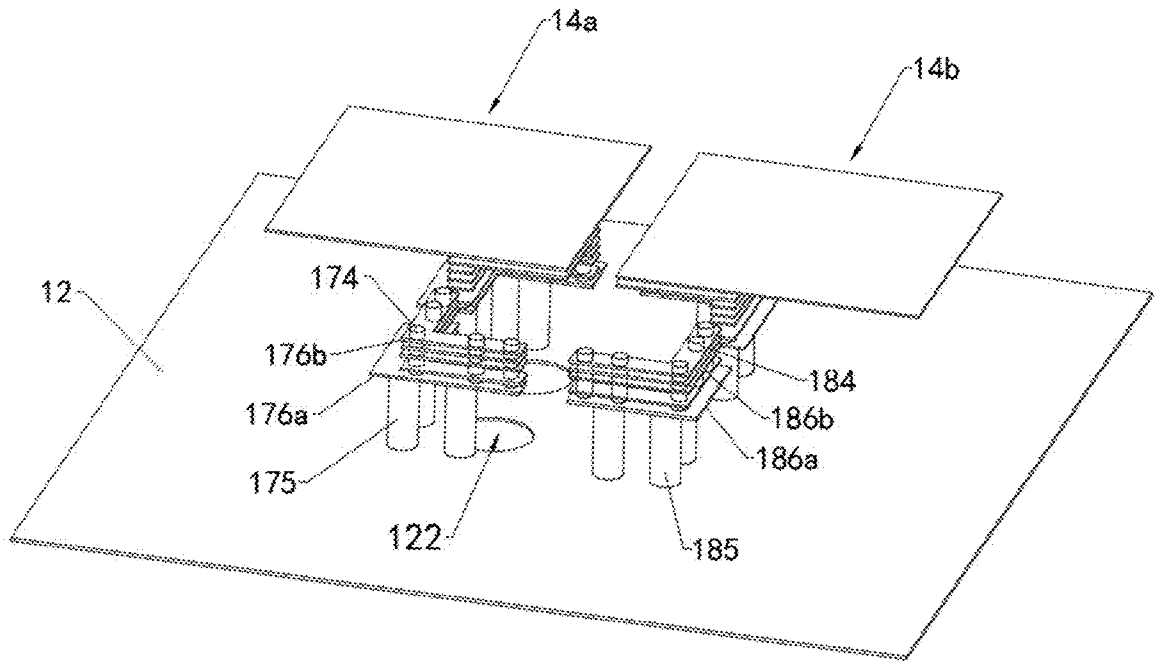
FIG. 16 is a schematic diagram of a part of a structure of an antenna structure shown in FIG. 3.
Figure 17:
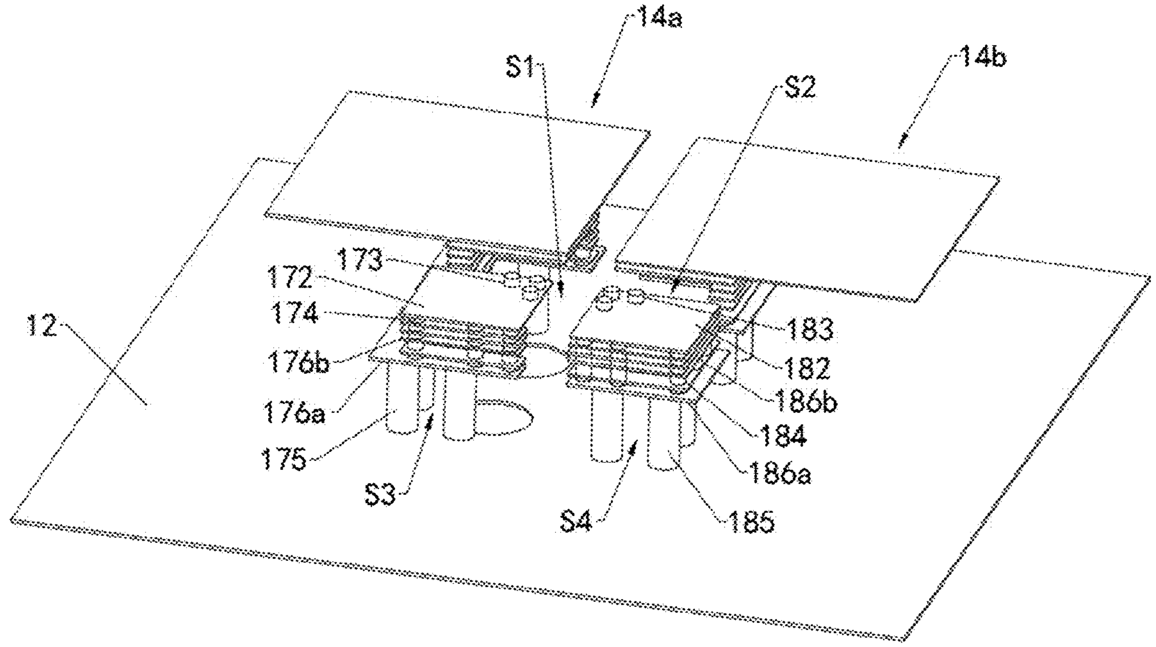
FIG. 17 is a schematic diagram of a part of a structure of an antenna structure shown in FIG. 3.
Figure 18:
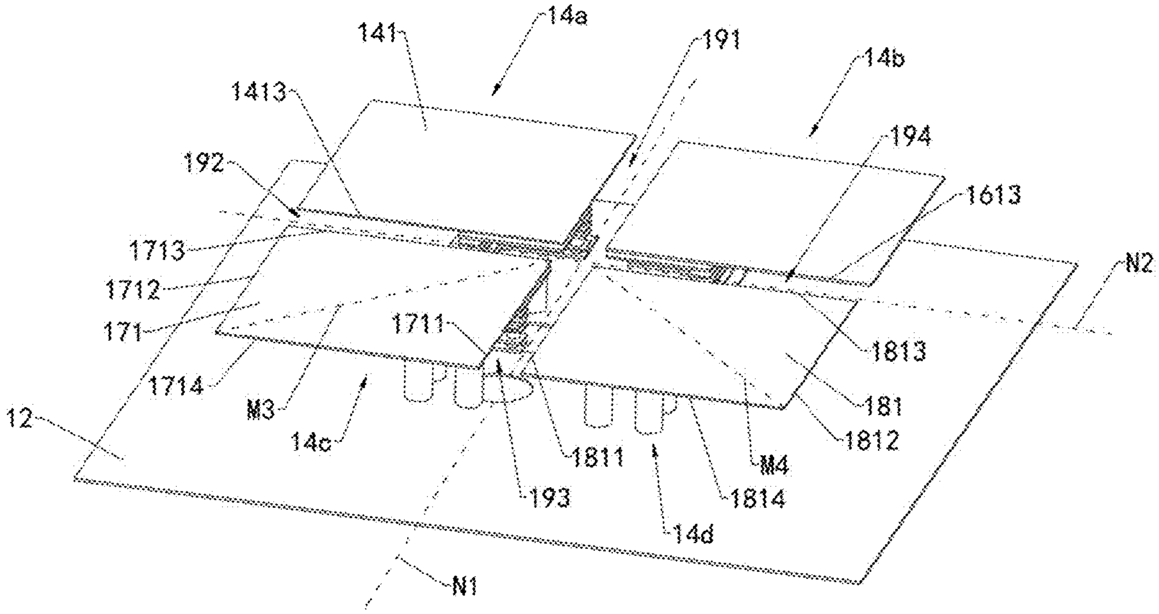
FIG. 18 is a schematic diagram of a structure of an antenna structure shown in FIG. 3.

Refer to FIG. 16 to FIG. 18. FIG. 16 is a schematic diagram of a part of the structure of the antenna structure 10 shown in FIG. 3. FIG. 17 is a schematic diagram of a part of the structure of the antenna structure 10 shown in FIG. 3. FIG. 18 is a schematic diagram of the structure of the antenna structure 10 shown in FIG. 3. For a manner of disposing the first metal layer 171, the second metal layer 172, the first metal columns 173, the second metal columns 174, the third metal columns 175, the first metal connection sheet 176*a*, and the second metal connection sheets 176*b* of the third antenna element 14*c*, refer to the manner of disposing the first metal layer 141, the second metal layer 142, the first metal columns 143, the second metal columns 144, the third metal columns 145, the first metal connection sheet 146*a*, and the second metal connection sheets 146*b* of the first antenna element 14*a*. Details are not described herein again.

The third antenna element 14*c* is located on one side of the first antenna element 14*a*. The third antenna element 14*c* and the first antenna element 14*a* are disposed opposite and spaced from each other. In this case, the first antenna element 14*a* is located between the second antenna element 14*b* and the third antenna element 14*c*.

In addition, a third edge 1713 of the first metal layer 171 of the third antenna element 14*c* and the third edge 1413 of the first metal layer 141 of the first antenna element 14*a* form a second gap 192. The second gap 192 is interconnected to the first gap 191.

In this implementation, the second metal layer 172, the second metal columns 174, the third metal columns 175, the first metal connection sheet 176*a*, the second metal connection sheets 176*b*, and the ground layer 12 of the third antenna element 14*c* may circle up to form a third space S3. The third space S3 is interconnected to the first space S1 and the second space S2. It can be understood that another component of the antenna structure 10 may be disposed in the third space S3. In this way, on one hand, space utilization of the antenna structure 10 is high. On the other hand, the antenna structure 10 may be compactly disposed, to facilitate miniaturization of the antenna structure 10.

For example, the second through hole 122 on the ground layer 12 is interconnected to the third space S3.

In addition, in this implementation, the first metal columns 173 and the second metal columns 174 of the third antenna element 14*c* may also be spaced from each other in two areas of the second metal layer 172, so that a current path is disposed as bent once. In this way, compared with an antenna structure that has a same current path, where the current path of the antenna structure is straight, a cross-sectional height of the antenna structure 10 in this embodiment is smaller, to facilitate achieving thinness of the antenna structure 10.

For example, the third antenna element 14*c* may be a symmetric structure, a partly symmetric structure, a structure having same or similar parts, or a structure having different parts. In this embodiment, the third antenna element 14*c* is a symmetric structure. Specifically, refer to FIG. 18 again. The third antenna element 14*c* is symmetrical along a symmetry plane of the third antenna element 14*c*. The symmetry plane of the third antenna element 14*c* is perpendicular to a plane on which the first metal layer 171 is located, and a diagonal line M3 of the first metal layer 171 is located on the symmetry plane of the third antenna element 14*c*. One end of the diagonal line M3 of the first metal layer 171 is located at a joint between a first edge 1711 and a third edge 1713, and the other end is located at a joint between the second edge 1712 and a fourth edge 1714.

For example, the third antenna element 14*c* and the first antenna element 14*a* may be symmetrical, partly symmetrical, have a same or similar structure, or have different structures. In this embodiment, the third antenna element 14*c* and the first antenna element 14*a* form a symmetric structure. Specifically, the third antenna element 14*c* and the first antenna element 14*a* are symmetrical along a second symmetry plane N2. It should be noted that the second symmetry plane N2 is not an actual structure on the antenna structure 10. The second symmetry plane N2 is a virtual plane. In FIG. 18, the second symmetry plane N2 is represented schematically by a dashed line.

Refer to FIG. 15 again. The fourth antenna element 14*d* includes a first metal layer 181, a second metal layer 182, first metal columns 183, second metal columns 184, third metal columns 185, a first metal connection sheet 186*a*, and second metal connection sheets 186*b*. For structures of the first metal layer 181, the second metal layer 182, the first metal columns 183, the second metal columns 184, the third metal columns 185, the first metal connection sheet 186*a*, and the second metal connection sheets 186*b*, refer to structures of the first metal layer 141, the second metal layer 142, the first metal columns 143, the second metal columns 144, the third metal columns 145, the first metal connection sheet 146*a*, and the second metal connection sheets 146*b* of the first antenna element 14*a*. Details are not described herein again.

The fourth antenna element 14*d* is located on a side that is of the third antenna element 14*c* and that is closer to the second antenna element 14*b*. The fourth antenna element 14*d* is disposed opposite and spaced from the third antenna element 14*c*, and is disposed opposite and spaced from the second antenna element 14*b*. In this case, the fourth antenna element 14*d* is located between the third antenna element 14*c* and the second antenna element 14*b*.

In addition, a first edge 1811 of the first metal layer 181 of the fourth antenna element 14*d* and the first edge 1711 of the first metal layer 171 of the third antenna element 14*c* form a third gap 193.

In addition, a third edge 1813 of the first metal layer 181 of the fourth antenna element 14*d* and the third edge 1613 of the first metal layer 161 of the second antenna element 14*b* form a fourth gap 194. The fourth gap 194 is interconnected to the first gap 191, the second gap 192, and the third gap 193. In this case, the first gap 191, the second gap 192, the third gap 193, and the fourth gap 194 roughly form a "cruciform" shape.

In this implementation, the second metal layer 182, the second metal columns 184, the third metal columns 185, the first metal connection sheet 186*a*, the second metal connection sheets 186*b*, and the ground layer 12 of the fourth antenna element 14*d* circle up to form a fourth space S4. The fourth space S4 is interconnected to the first space S1, the second space S2, and the third space S3. To be specific, the first space S1, the second space S2, the third space S3, and the fourth space S4 circle up to form a large space. It can be understood that another component of the antenna structure 10 may be disposed in the fourth space S4. In this way, on one hand, space utilization of the antenna structure 10 is high. On the other hand, the antenna structure 10 may be compactly disposed, to facilitate miniaturization of the antenna structure 10.

In addition, in this implementation, the first metal columns 183 and the second metal columns 184 of the fourth antenna element 14*d* may also be spaced from each other in two areas of the second metal layer 182, so that the current path is disposed as bent once. In this way, compared with an antenna structure that has a same current path, where the current path of the antenna structure is straight, a cross-sectional height of the antenna structure 10 in this embodiment is smaller, to facilitate achieving thinness of the antenna structure 10.

For example, the fourth antenna element 14*d* may be a symmetric structure, a partly symmetric structure, a structure having same or similar parts, or a structure having different parts. In this embodiment, the fourth antenna element 14*d* is a symmetric structure. Specifically, refer to FIG. 18 again. The fourth antenna element 14*d* is symmetrical along a symmetry plane of the fourth antenna element 14*d*. The symmetry plane of the fourth antenna element 14*d* is perpendicular to a plane on which the first metal layer 181 is located, and a diagonal line M4 of the first metal layer 181 is located on the symmetry plane of the fourth antenna element 14*d*. One end of the diagonal line M4 of the first metal layer 181 is located at a joint between the first edge 1811 and the third edge 1813, and the other end is located at a joint between a second edge 1812 and a fourth edge 1814.

For example, the fourth antenna element 14*d* and the third antenna element 14*c* may be symmetrical, partly symmetrical, have a same or similar structure, or have different structures. In this embodiment, the fourth antenna element 14*d* and the third antenna element 14*c* form a symmetric structure. Specifically, the fourth antenna element 14*d* and the third antenna element 14*c* are also symmetrical along the first symmetry plane N1.

For example, the fourth antenna element 14*d* and the second antenna element 14*b* may be symmetrical, or partly symmetrical, have a same or similar structure, or have different structures. In this embodiment, the fourth antenna element 14*d* and the second antenna element 14*b* form a symmetric structure. Specifically, the fourth antenna element 14*d* and the second antenna element 14*b* are symmetrical along the second symmetry plane N2.

For example, the fourth antenna element 14*a*, the second antenna element 14*b*, the third antenna element 14*c*, and the fourth antenna element 14*d* may be centrosymmetric, partly centrosymmetric, have a same or similar structure, or have different structures. In this embodiment, the first antenna element 14*a*, the second antenna element 14*b*, the third antenna element 14*c*, and the fourth antenna element 14*d* are centrosymmetric with respect to a central point. The central point is located at a joint between the first symmetry plane N1 and the second symmetry plane N2. The central point is a central location of the first antenna element 14*a*, the second antenna element 14*b*, the third antenna element 14*c*, and the fourth antenna element 14*d*. In this implementation, the symmetry plane of the first antenna element 14*a*, the symmetry plane of the second antenna element 14*b*, the symmetry plane of the third antenna element 14*c*, and the symmetry plane of the fourth antenna element 14*d* all pass through the central point. With reference to FIG. 11, the second metal columns 144 of the first antenna element 14*a* are located on a side that is of the first metal columns 143 of the first antenna element 14*a* and that is farther away from the central point. The second metal columns 164 of the second antenna element 14*b* are located on a side that is of the first metal columns 163 of the second antenna element 14*b* that is farther away from the central point. With reference to FIG. 17, the second metal columns 174 of the third antenna element 14*c* are located on a side that is of the first metal columns 163 of the third antenna element 14*c* and that is farther away from the central point. The second metal columns 184 of the fourth antenna element 14*d* are located on a side that is of the first metal columns 183 of the fourth antenna element 14*d* and that is farther away from the central point.

In this embodiment, the first space S1, the second space S2, the third space S3, and the fourth space S4 are formed in the antenna structure 10 by compactly disposing various parts of structures of the antenna elements 14. It can be understood that other components of the antenna structure 10 may be disposed in the first space S1, the second space S2, the third space S3, and the fourth space S4. In this way, on one hand, space utilization of the antenna structure 10 is high. On the other hand, the structure of the antenna structure 10 is compact, to facilitate miniaturization of the antenna structure 10. In addition, a current path of the antenna structure 10 is set to bent once. In this way, compared with an antenna structure that has a same current path, where the current path of the antenna structure is straight, not only a cross-sectional height H of the antenna structure 10 in this embodiment is smaller, widths of the first gap 191, the second gap 192, the third gap 193, and the fourth gap 194 in the antenna structure 10 are also smaller. For example, widths of the first gap 191, the second gap 192, the third gap 193, and the fourth gap 194 each may be in the range of 0.03λ0 to 0.1λ0. In this way, miniaturization of the antenna structure 10 is easier to achieve.

The first antenna element 14*a*, the second antenna element 14*b*, the third antenna element 14*c*, and the fourth antenna element 14*d* in the antenna structure 10 are described in detail with reference to the related accompanying drawings. In this implementation, the first antenna element 14*a* and the fourth antenna element 14*d* may form an electric dipole. The second antenna element 14*b* and the third antenna element 14*c* may form another electric dipole. In addition, the first gap 191 and the third gap 193 may form a magnetic dipole. The second gap 192 and the fourth gap 194 may form another magnetic dipole. The feeding element 13 of the antenna structure 10 is described below with reference to related accompanying drawings.

Figure 19:
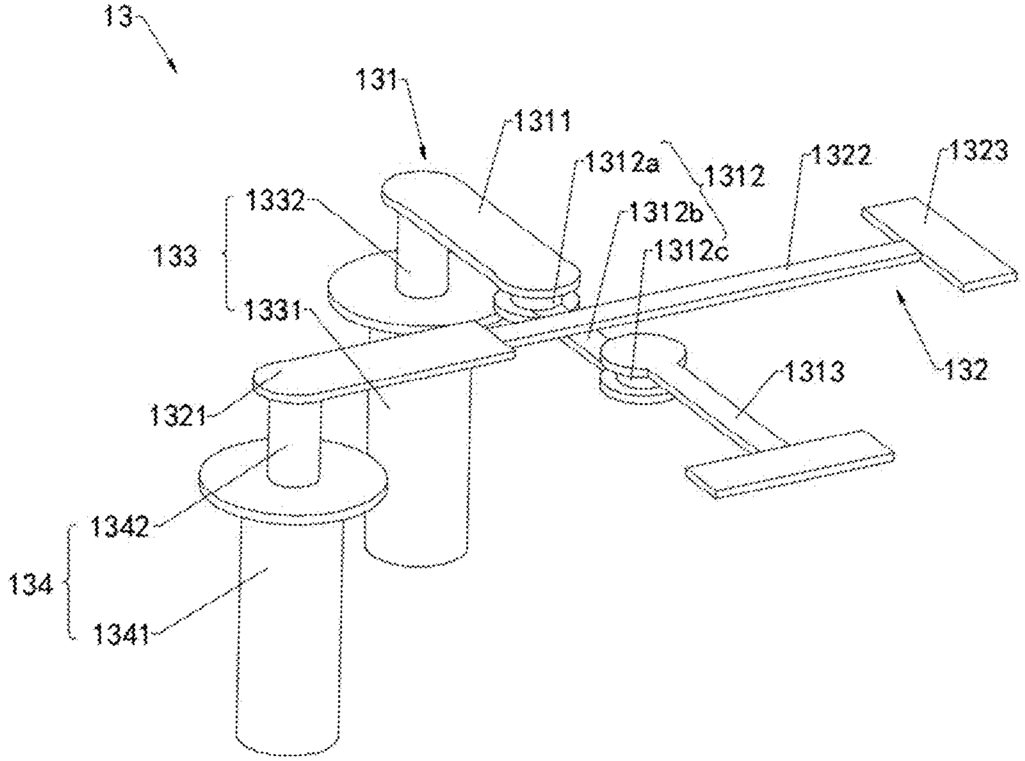
FIG. 19 is a schematic diagram of a structure of a feeding element shown in FIG. 4.

FIG. 19 is a schematic diagram of a structure of the feeding element shown in FIG. 4. The feeding element 13 includes a first feeding branch 131, a second feeding branch 132, a first metal hole 133, and a second metal hole 134. A structure of the first metal hole 133 may be formed by forming a layer of metal material on a wall of a via. In this case, the first metal hole 133 has a roughly "tube-like" structure. In addition, a structure of the first metal hole 133 may alternatively be formed by filling a metal material in a via. In this case, the first metal hole 133 may be of a "columnar" structure. In another implementation, the first metal hole 133 may alternatively be another structure. In addition, for a structure of the second metal hole 134, refer to the structure of the first metal hole 133 in this implementation. Details are not described below again.

The first feeding branch 131 includes a first part 1311, a second part 1312*a*, a third part 1312*b*, a fourth part 1312*c*, and a fifth part 1313 that are sequentially connected. The first part 1311 and the fifth part 1313 are disposed in a same layer. The second part 1312*a*, the third part 1312*b*, and the fourth part 1312*c* roughly form a "U" shape. For example, the second part 1312*a* and the fourth part 1312*c* may each use a metal hole structure. In this case, two ends of the third part 1312*b* are respectively connected to the first part 1311 and the fifth part 1313 by using one metal hole structure for each.

For example, the fifth part 1313 may have a "T" shape.

It can be understood that, in this implementation, a resonance frequency of the antenna structure 10 may be changed by changing factors such as shapes or sizes of the first part 1311, the second part 1312*a*, the third part 1312*b*, the fourth part 1312*c*, and the fifth part 1313 of the first feeding branch 131.

Refer to FIG. 19 again. The first metal hole 133 includes a first hole part 1331 and a second hole part 1332. The second hole part 1332 is connected to the first hole part 1331. A diameter of the first hole part 1331 is greater than a diameter of the second hole part 1332. It can be understood that, in a forming process of the first metal hole, two chip bodylectric boards (one chip bodylectric board is provided with the first hole part 1331, and the other chip bodylectric board is provided with the second hole part 1332) of different thicknesses may be stacked up into a whole by bonding, welding, or the like.

The second hole part 1332 is connected to the first part 1311 of the first feeding branch 131.

Refer to FIG. 19 again. The second feeding branch 132 generally has a roughly "bar-like" shape. The second feeding branch 132 includes a first part 1321, a second part 1322, and a third part 1323 that are sequentially connected. The first part 1321, the second part 1322, and the third part 1323 are disposed in a same layer.

For example, a width of the first part 1321 is greater than a width of the second part 1322. A width of the third part 1323 is greater than the width of the first part 1321 and the width of the second part 1322. The second part 1322 and the third part 1323 roughly form a "T" shape.

It can be understood that, in this implementation, the resonance frequency of the antenna structure 10 may be changed by changing factors such as shapes or sizes of the first part 1321, the second part 1322, and the third part 1323 of the second feeding branch 132.

In addition, the second metal hole 134 includes a third hole part 1341 and a fourth hole part 1342. The third hole part 1341 is connected to the fourth hole part 1342. A diameter of the third hole part 1341 is greater than a diameter of the fourth hole part 1342. The fourth hole part 1342 is connected to the first part 1321 of the second feeding branch 132. In this embodiment, a structure of the second metal hole 134 is the same as a structure of the first metal hole 133.

In another embodiment, a structure of the first feeding branch 131 may also be the structure of the second feeding branch 132, that is, the first feeding branch 131 has a "bar-like" shape. In this case, the first feeding branch 131 and the second feeding branch 132 are disposed in different layers, that is, a distance between the first feeding branch 131 and the ground layer 12 is greater than or less than a distance between the second feeding branch 132 and the ground layer 12, to avoid a short circuit between the first feeding branch 131 and the second feeding branch 132.

Figure 20:
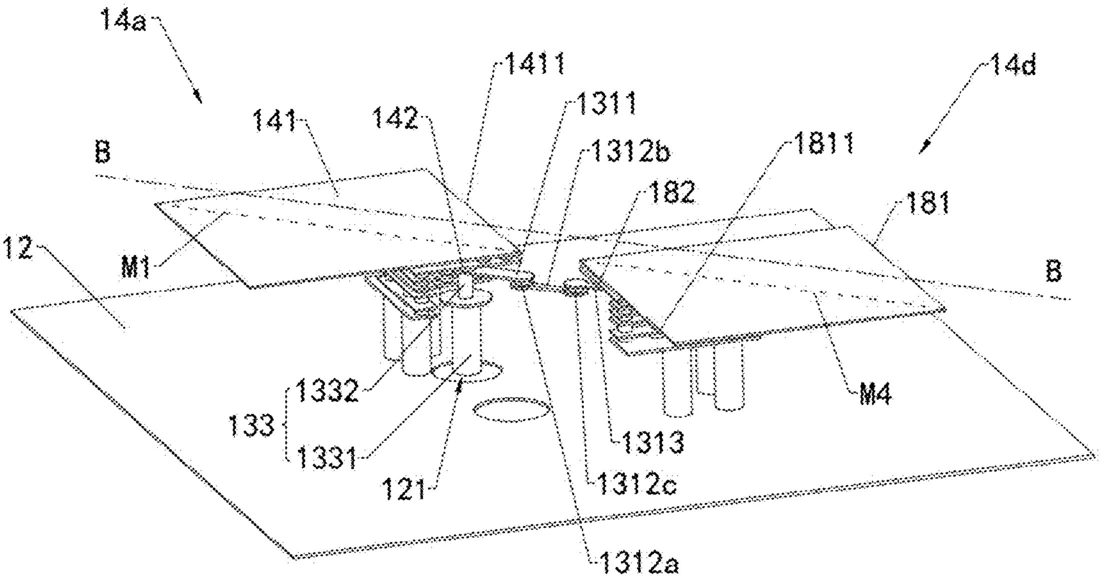
FIG. 20 is a schematic diagram of a part of a structure of an antenna structure shown in FIG. 3.
Figure 21:
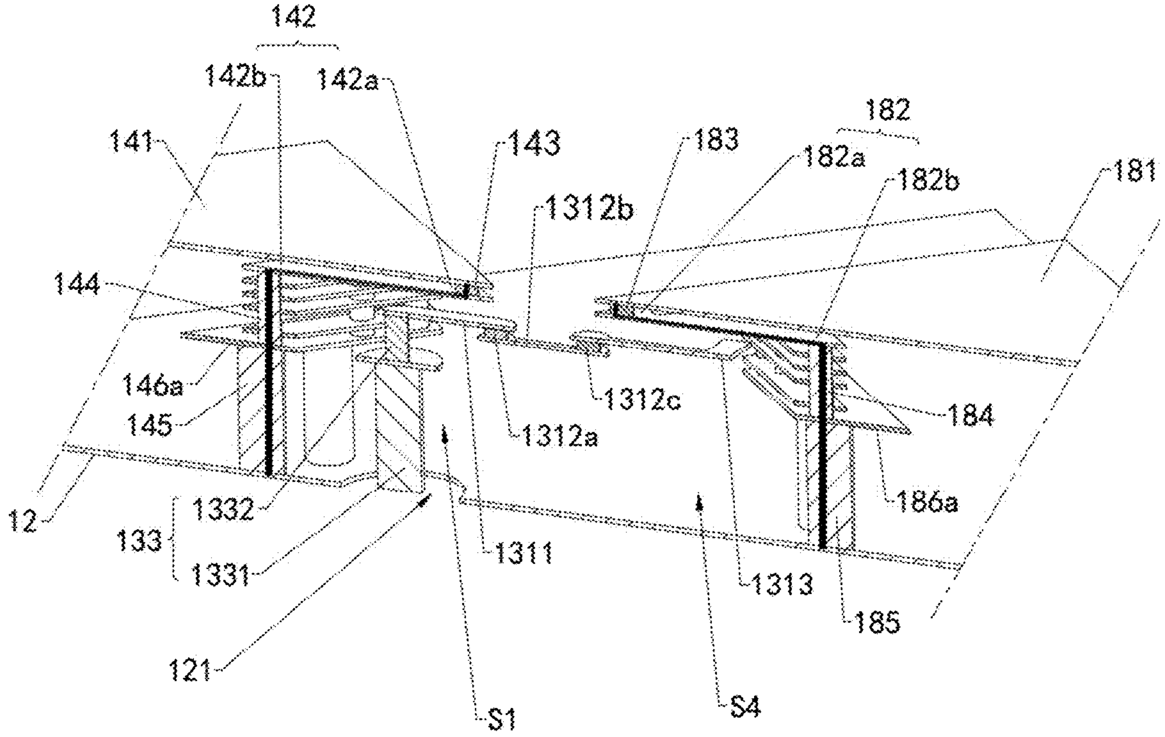
FIG. 21 is a schematic cross-sectional diagram of the antenna structure shown in FIG. 20 cut along a line B-B.

Refer to FIG. 20 and FIG. 21 with reference to FIG. 19. FIG. 20 is a schematic diagram of a part of the structure of the antenna structure 10 shown in FIG. 3. FIG. 21 is a schematic cross-sectional diagram of the antenna structure 10 shown in FIG. 20 cut along a line B-B. The first hole part 1331 of the first metal hole 133 is disposed opposite the first through hole 121 on the ground layer 12. The first hole part 1331 of the first metal hole 133 is electrically connected to the radio frequency circuit 20 through the first through hole 121 (refer to FIG. 3). For example, the first hole part 1331 may be electrically connected to the radio frequency circuit 20 by using a conductive structure, for example, a microstrip line, a coaxial cable, a strip line, or a probe. The first hole part 1331 is further spaced from the ground layer 12, to avoid a short circuit with the ground layer 12.

It can be understood that, as the first part 1311 and the fifth part 1313 of the first feeding branch 131 are disposed in a same layer, a distance between the first part 1311 of the first feeding branch 131 and the ground layer 12 is equal to a distance between the fifth part 1313 of the first feeding branch 131 and the ground layer 12.

In addition, a part of the first part 1311 of the first feeding branch 131 is located on a side that is of the second metal layer 142 of the first antenna element 14*a* and that faces the ground layer 12, that is, located in the first space S1 of the first antenna element 14*a*. In addition, a part of the fifth part 1313 of the first feeding branch 131 is located on a side that is of the second metal layer 182 of the fourth antenna element 14*d* and that faces the ground layer 12, that is, located in the fourth space S4 of the fourth antenna element 14*d*. In addition, an extension direction of the first feeding branch 131 is parallel to the diagonal line M1 of the first metal layer 141 of the first antenna element 14*a*, that is, an included angle between the extension direction of the first feeding branch 131 and the first edge 1411 of the first metal layer 141 of the second antenna element 14*b* may be 45°. In addition, the extension direction of the first feeding branch 131 is further parallel to the diagonal line M4 of the first metal layer 181 of the fourth antenna element 14*d*, that is, an included angle between the extension direction of the first feeding branch 131 and the first edge 1811 of the first metal layer 181 of the fourth antenna element 14*d* may be 45°.

It can be understood that, when the radio frequency circuit 20 transmits a radio frequency signal, the radio frequency signal may be coupled and fed to the second metal layer 182 and the first metal layer 181 of the fourth antenna element 14*d* through the first metal hole 133 and the first part 1311, the second part 1312*a*, the third part 1312*b*, the fourth part 1312*c*, and the fifth part 1313 of the first feeding branch 131. In this case, a current path passing the ground layer 12, the third metal columns 185, the first metal connection sheet 186*a*, the second metal columns 184, the second area 182*b* of the second metal layer 182, the first area 182*a* of the second metal layer 182, the first metal columns 183, and the first metal layer 181 has current transmission.

In addition, the radio frequency signal may be coupled and fed to the second metal layer 142 and the first metal layer 141 of the first antenna element 14*a* through the first metal hole 133 and the first part 1311 of the first feeding branch 131. In this case, a current path passing the ground layer 12, the third metal columns 145, the first metal connection sheet 146*a*, the second metal columns 144, the second area 142*b* of the second metal layer 142, the first area 142*a* of the second metal layer 142, the first metal columns 143, and the first metal layer 141 has current transmission.

Figure 22:
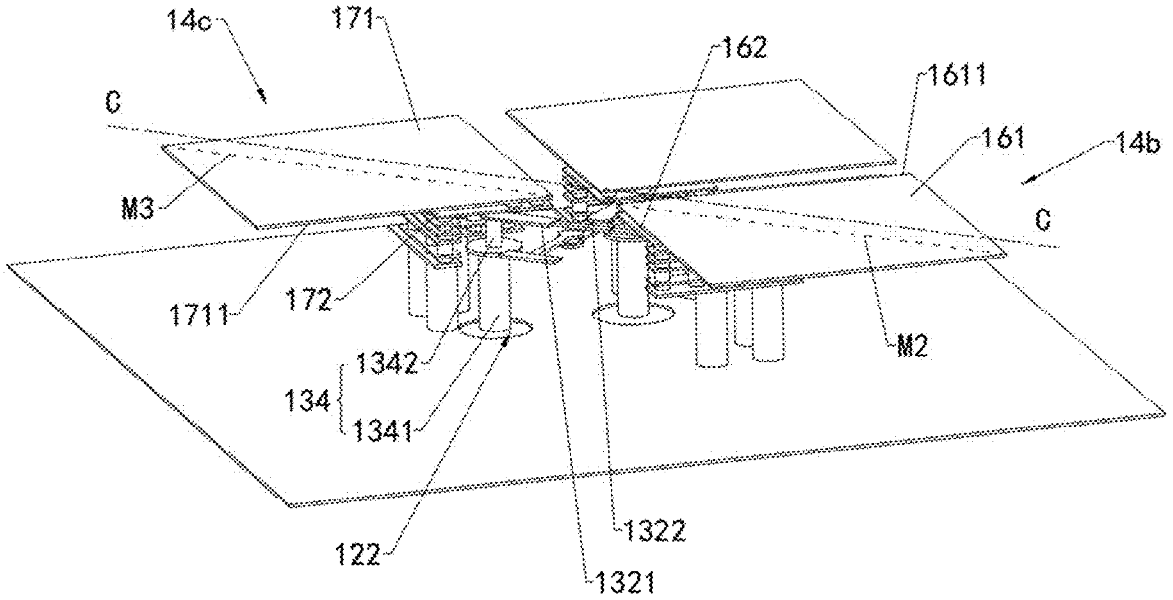
FIG. 22 is a schematic diagram of a part of a structure of an antenna structure shown in FIG. 3.
Figure 23:
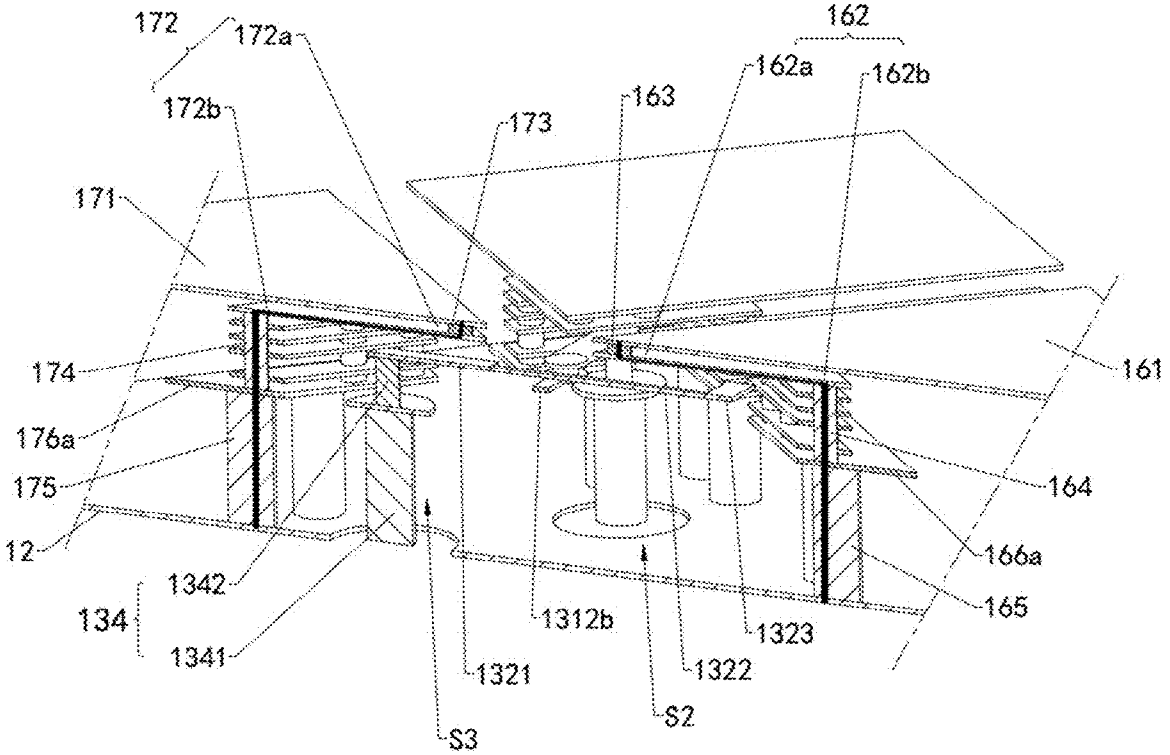
FIG. 23 is a schematic cross-sectional diagram of the antenna structure shown in FIG. 22 cut along a line C-C.

Refer to FIG. 22 and FIG. 23 with reference to FIG. 19. FIG. 22 is a schematic diagram of a part of the structure of the antenna structure 10 shown in FIG. 3. FIG. 23 is a schematic cross-sectional diagram of the antenna structure 10 shown in FIG. 22 cut along a line C-C. The third hole part 1341 of the second metal hole 134 is disposed opposite the second through hole 122 on the ground layer 12. The third hole part 1341 of the second metal hole 134 is electrically connected to the radio frequency circuit 20 through the second through hole 122 (refer to FIG. 3). For example, the third hole part 1341 may be electrically connected to the radio frequency circuit 20 by using a conductive structure, for example, a microstrip line, a coaxial cable, a strip line, or a probe. The third hole part 1341 is further spaced from the ground layer 12, to avoid a short circuit with the ground layer 12.

In this implementation, as the second feeding branch 132, the first part 1311 of the first feeding branch 131, and the fifth part 1313 of the first feeding branch 131 are disposed in a same layer, a distance between the second feeding branch 132 and the ground layer 12, a distance between the first part 1311 of the first feeding branch 131 and the ground layer 12, and a distance between the fifth part 1313 of the first feeding branch 131 and the ground layer 12 are all equal.

In addition, a part of the first part 1321 of the second feeding branch 132 is located on a side that is of the second metal layer 172 of the third antenna element 14*c* and that faces the ground layer 12, that is, located in the third space S3 of the third antenna element 14*c*. A part of the third part 1323 of the second feeding branch 132 is located on a side that is of the second metal layer 162 of the second antenna element 14*b* and that faces the ground layer 12, that is, located in the second space S2 of the second antenna element 14*b*. An extension direction of the second feeding branch 132 is parallel to the diagonal line M3 of the first metal layer 141 of the third antenna element 14*c*, that is, an included angle between the extension direction of the second feeding branch 132 and the first edge 1711 of the first metal layer 171 of the second antenna element 14*b* may be 45°. The extension direction of the second feeding branch 132 is further parallel to the diagonal line M2 of the first metal layer 161 of the second antenna element 14*b*, that is, an included angle between the extension direction of the second feeding branch 132 and the first edge 1611 of the first metal layer 161 of the second antenna element 14*b* may be 45°.

It can be understood that, when the radio frequency circuit 20 transmits a radio frequency signal, the radio frequency signal may be coupled and fed to the second metal layer 162 and the first metal layer 161 of the second antenna element 14*b* through the second metal hole 134 and the first part 1321, the second part 1322, and the third part 1323 of the second feeding branch 132. In this case, a current path passing the ground layer 12, the third metal columns 165, the first metal connection sheet 166*a*, the second metal columns 164, the second area 162*b* of the second metal layer 162, the first area 162*a* of the second metal layer 162, the first metal columns 163, and the first metal layer 161 has current transmission.

In addition, the radio frequency signal may alternatively be coupled and fed to the second metal layer 172 and the first metal layer 171 of the third antenna element 14*c* through the second metal hole 134 and the first part 1321 of the second feeding branch 132. In this case, a current path passing the ground layer 12, the third metal columns 175, the first metal connection sheet 176*a*, the second metal columns 174, the second area 172*b* of the second metal layer 172, the first area 172*a* of the second metal layer 172, the first metal columns 173, and the first metal layer 171 has current transmission.

In another embodiment, refer to FIG. 21 again. The first part 1311 of the first feeding branch 131 may be directly connected to the second metal layer 142 of the first antenna element 14*a*. In addition, the fifth part 1313 of the first feeding branch 131 may be directly connected to the second metal layer 182 of the fourth antenna element 14*d*. In this way, when the radio frequency circuit 20 transmits a radio frequency signal, the radio frequency signal may be directly fed to the second metal layer 182 and the first metal layer 181 of the fourth antenna element 14*d* through the first metal hole 133 and the first part 1311, the second part 1312*a*, the third part 1312*b*, the fourth part 1312*c*, and the fifth part 1313 of the first feeding branch 131. In addition, the radio frequency signal may alternatively be directly fed to the second metal layer 142 and the first metal layer 141 of the first antenna element 14*a* through the first metal hole 133 and the first part 1311 of the first feeding branch 131.

In another embodiment, refer to FIG. 23 again. The first part 1321 of the second feeding branch 132 may be directly connected to the second metal layer 172 of the third antenna element 14*c*. The third part 1323 of the second feeding branch 132 is directly connected to the second metal layer 162 of the second antenna element 14*b*. In this way, when the radio frequency circuit 20 transmits a radio frequency signal, the radio frequency signal may be directly fed to the second metal layer 162 and the first metal layer 161 of the second antenna element 14*b* through the second metal hole 134 and the first part 1321, the second part 1322, and the third part 1323 of the second feeding branch 132. The radio frequency signal may alternatively be directly fed to the second metal layer 172 and the first metal layer 171 of the third antenna element 14*c* through the second metal hole 134 and the first part 1321 of the second feeding branch 132.

The feeding element 13 is described above with reference to the related accompanying drawings. A specific structure of the matching via groups 15 is described below in detail with reference to related accompanying drawings.

Figure 24:
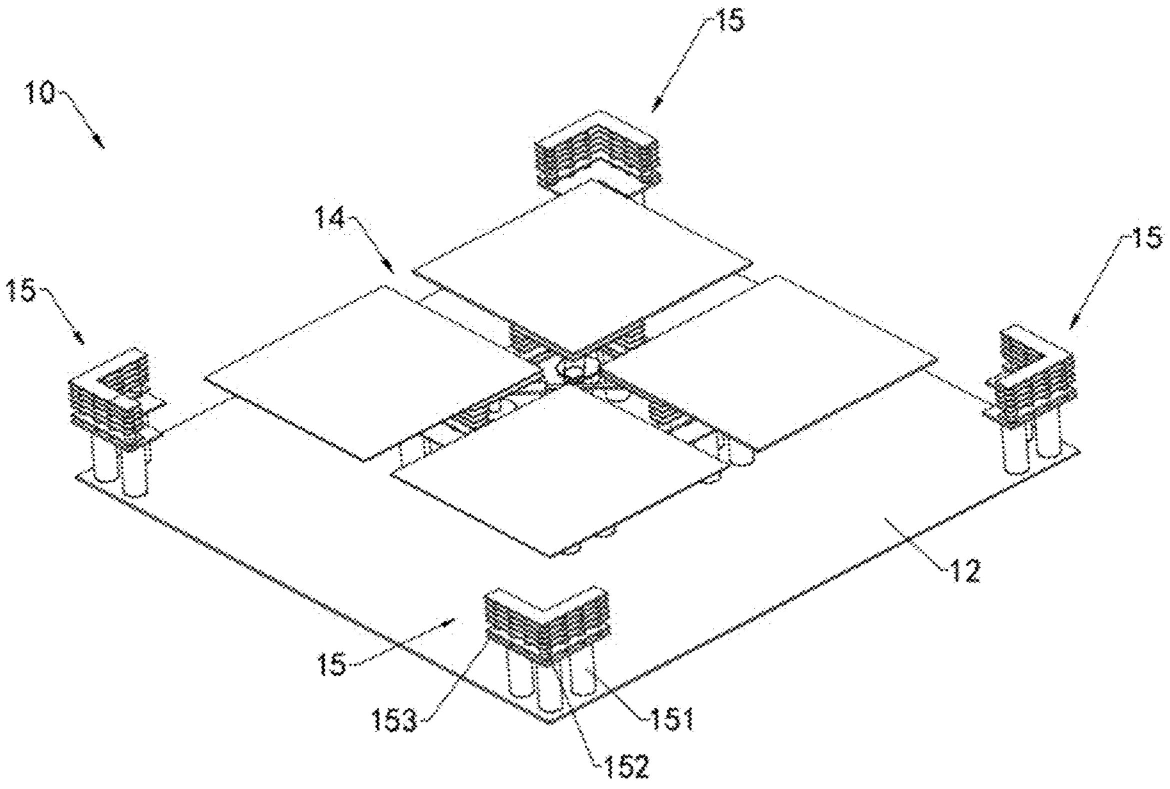
FIG. 24 is a schematic diagram of a part of a structure of an antenna structure shown in FIG. 3.

FIG. 24 is a schematic diagram of a part of the structure of the antenna structure 10 shown in FIG. 3. The plurality of matching via groups 15 are electrically connected to the ground layer 12. The plurality of matching via groups 15 are located on a periphery of the first antenna element 14*a*, the second antenna element 14*b*, the third antenna element 14*c*, and the fourth antenna element 14*d*. The plurality of matching via groups 15 are located on a periphery of the ground layer 12, that is, the plurality of matching via groups 15 are disposed near edges of the ground layer 12. The plurality of matching via groups 15 are disposed around the first antenna element 14*a*, the second antenna element 14*b*, the third antenna element 14*c*, and the fourth antenna element 14*d*.

For example, there are four matching via groups 15. The four matching via groups 15 are located at four corners of the ground layer 12. In this embodiment, one of the matching via groups 15 is used as an example for detailed description.

In this embodiment, the matching via group 15 includes first matching vias 151, second matching vias 152, and metal connection sheets 153. For structures of the first matching vias 151 and the second matching vias 152, refer to structures of the third metal columns 145 of the first antenna element 14*a* (refer FIG. 5). Details are not described herein again.

For example, there are three first matching vias 151. There are seven second matching vias 152. There are seven metal connection sheets 153.

The plurality of first matching vias 151 are spaced from each other, and one end of each of the first matching vias 151 is connected to the ground layer 12. For example, the plurality of first matching vias 151 are arranged into an "L" shape.

In addition, the plurality of metal connection sheets 153 are located on a side that is of the first matching vias 151 and that is farther away from the ground layer 12, and are spaced from each other. One of the metal connection sheets 153 is connected to the plurality of first matching vias 151. In this case, the first matching vias 151 are located between the metal connection sheets 153 and the ground layer 12.

For example, each of the metal connection sheets 153 has an "L" shape.

In addition, the plurality of second metal columns 144 are spaced from each other. The plurality of second matching vias 152 are also arranged into an "L" shape. Each of the second matching vias 152 is connected to each of the metal connection sheets 153.

It can be understood that, as the plurality of matching via groups 15 that are spaced from each other are disposed on the ground layer 12, the matching via groups 15 can enlarge a current path between the antenna elements 14 and the ground layer 12. The matching via groups 15 may be configured to tune impedance of the antenna structure 10, to implement impedance matching. In addition, because the matching via groups 15 can enlarge the current path between the antenna elements 14 and the ground layer 12, sizes of the antenna elements 14 and the ground layer 12 in embodiments may be made small, to achieve miniaturization of the antenna structure 10.

In another embodiment, the matching via groups 15 may not include the second matching vias 152 or the metal connection sheets 153, that is, the matching via groups 15 includes only the first matching vias 151.

Figure 25A:
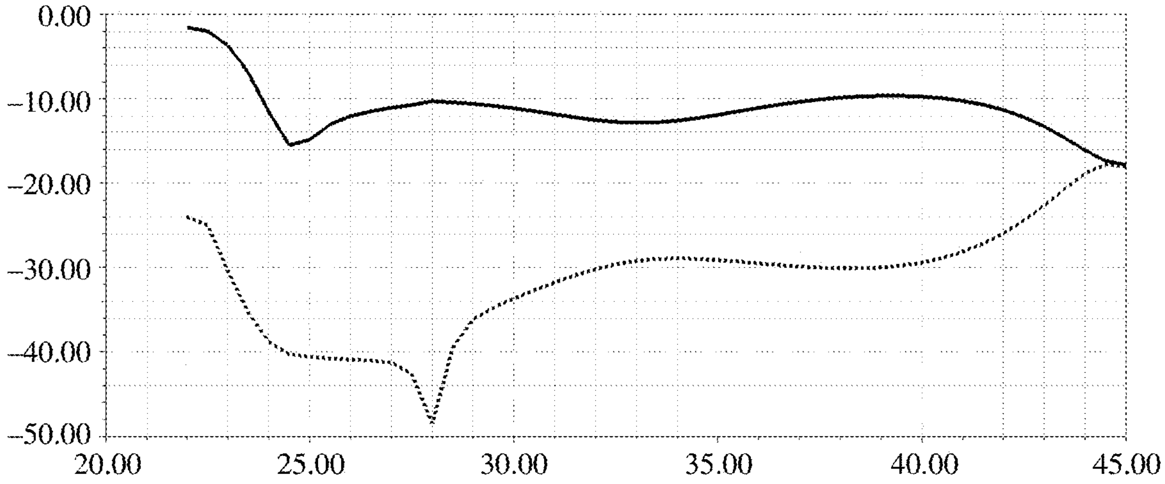
FIG. 25*a* is a data diagram in which a reflection coefficient of an antenna structure changes with a frequency according to an embodiment of this application.

FIG. 25*a* is a data diagram in which a reflection coefficient of the antenna structure 10 changes with a frequency according to an embodiment of this application. A solid line in FIG. 25*a* represents an S11 curve, and the S11 curve is used to indicate an input return loss. A dotted line represents an S21 curve, and the S21 curve is used to indicate isolation between two ports. A horizontal ordinate indicates a frequency, where a frequency unit is GHz, and a vertical ordinate indicates a unit, dB. A frequency band that can be covered by the antenna structure 10 ranges from 24.25 GHz to 43.5 GHz. A return loss is greater than 10 dB, and isolation is greater than 15 dB, to satisfy an antenna performance requirement. In this way, the antenna structure 10 may work in an operating frequency band ranging from 24.25 GHz to 29.5 GHz and from 37 GHz to 43.5 GHz. The antenna structure 10 may support frequency bands n257, n258, n259, n260, and n261.

In addition, the antenna structure 10 has two resonance frequencies (also referred to as center frequencies). The two resonance frequencies are 24 GHz and 33 GHz.

A signal bandwidth, corresponding to the antenna structure 10, $\Delta f$=43.5 GHZ-24.25 GHz=19.25 GHz.

A center frequency f0=(43.5 GHz+24.25 GHZ)/2=33.875 GHz.

In this case, a relative bandwidth ff0c1=$\Delta f$/f0=19.25 GHz/33.875 GHZ=56.83%. The antenna structure 10 is a wide-band antenna.

Figure 25B:
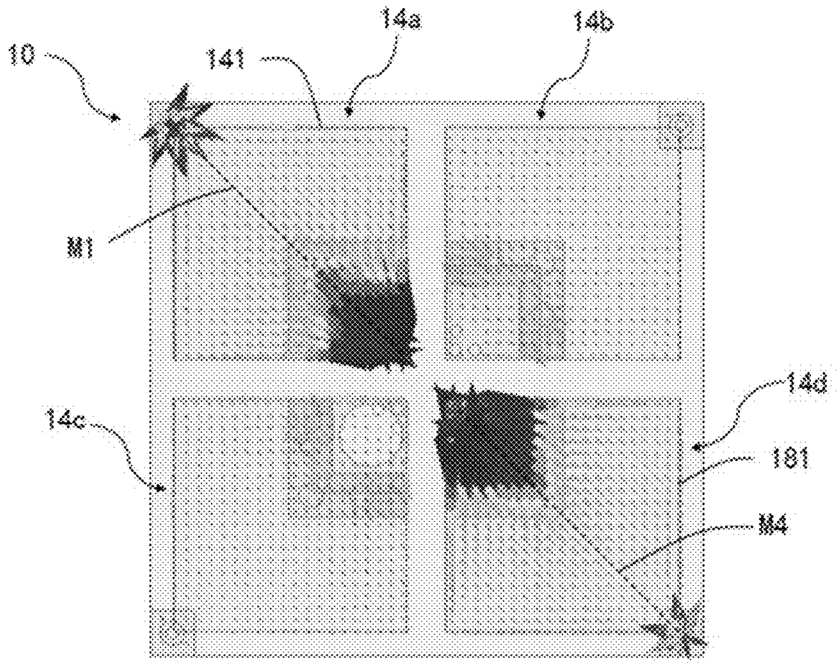
FIG. 25*b* is a schematic diagram of a type of polarization of an antenna structure according to an embodiment of this application.

FIG. 25*b* is a schematic diagram of a type of polarization of the antenna structure 10 according to an embodiment of this application. A direction of an arrow in FIG. 25*b* indicates a direction of a current. In addition, a shade of the arrow indicates current intensity. A darker shade of the arrow indicates higher current intensity. A lighter shade of the arrow indicates lower current intensity. The first type of polarization of the antenna structure 10 is −45° polarization of the antenna structure 10. Most currents in the antenna structure 10 are mainly in the first antenna element 14*a* and the fourth antenna element 14*d*, and a small part is in the second antenna element 14*b* and the third antenna element 14*c*. A current in the first antenna element 14*a* flows along the diagonal line M1 towards the fourth antenna element 14*d*. A current in the fourth antenna element 14*d* flows along the diagonal line M4 away from the first antenna element 14*a*.

Figure 25C:
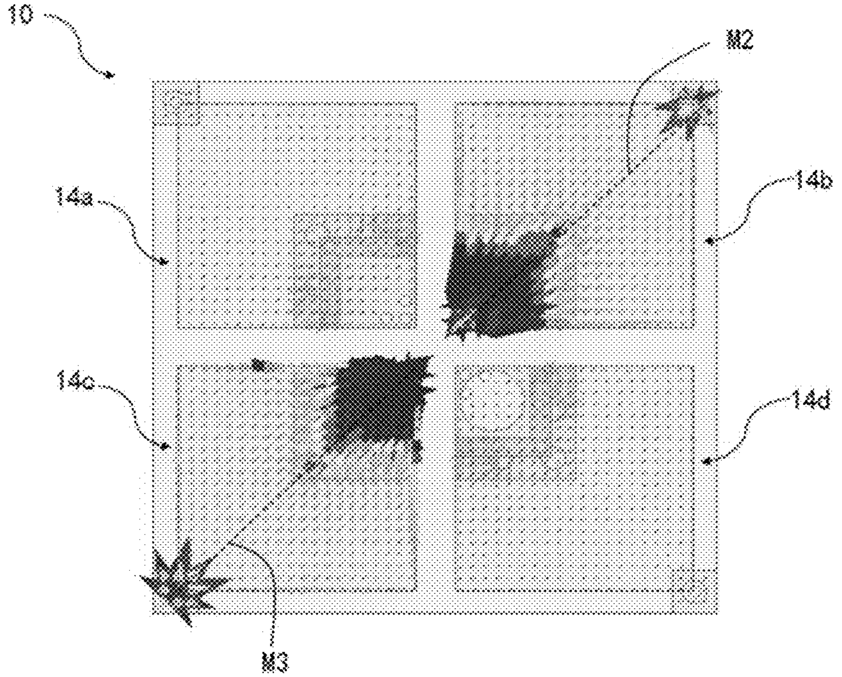
FIG. 25*c* is a schematic diagram of another type of polarization of an antenna structure according to an embodiment of this application.

FIG. 25*c* is a schematic diagram of another type of polarization of the antenna structure 10 according to an embodiment of this application. A direction of an arrow in FIG. 25*c* indicates a direction of a current. In addition, a shade of the arrow indicates current intensity. A darker shade of the arrow indicates higher current intensity. A lighter shade of the arrow indicates lower current intensity. The second type of polarization of the antenna structure 10 is +45° polarization of the antenna structure 10. Most currents in the antenna structure 10 are mainly in the second antenna element 14*b* and the third antenna element 14*c*, and a small part is in the first antenna element 14*a* and the fourth antenna element 14*d*. A current in the second antenna element 14*b* flows along the diagonal line M2 away from the third antenna element 14*c*. A current in the third antenna element 14*c* flows along the diagonal line M3 towards the second antenna element 14*b*.

It can be learned from FIG. 25*b* and FIG. 25*c* that the antenna structure 10 in this implementation has two types of polarization, that is, the antenna structure 10 features dual-polarization.

Figure 25D:
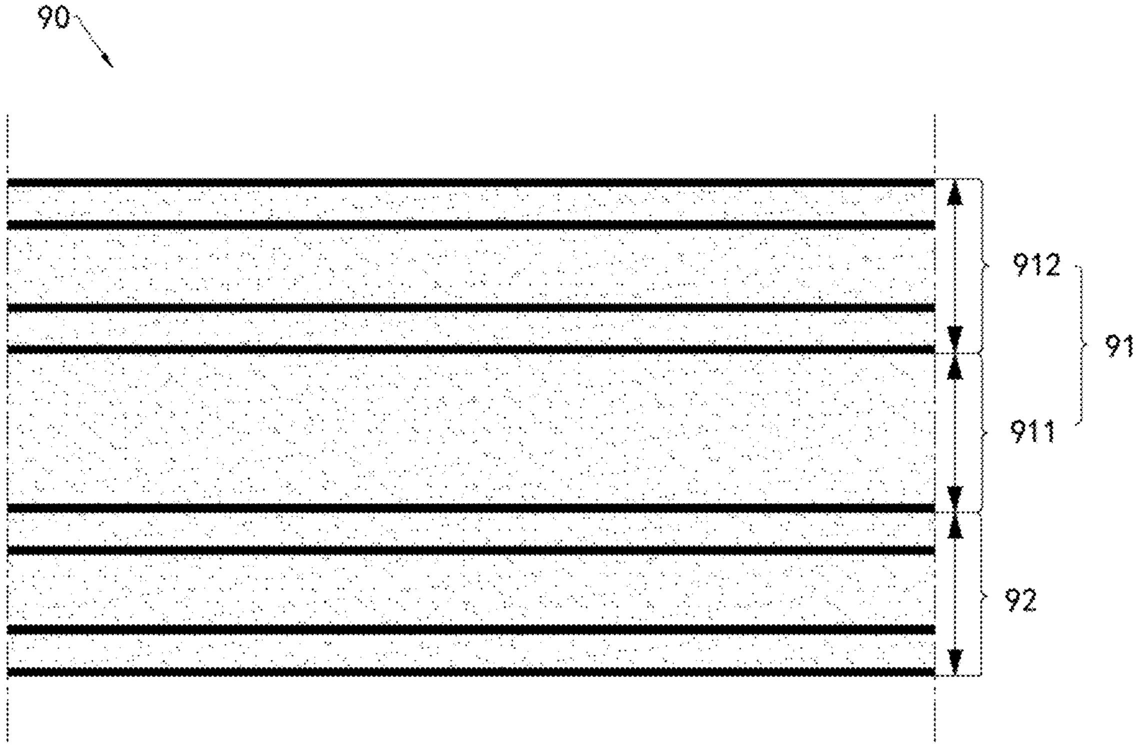
FIG. 25*d* is a schematic cross-sectional diagram of a part of a package substrate structure according to an embodiment.

FIG. 25*d* is a schematic cross-sectional diagram of a part of a package substrate structure 90 according to an embodiment. The package substrate structure 90 may be disposed by using a multi-layer symmetric substrate. The package substrate structure 90 includes an antenna layer 91 and a prepreg (prepreg, PP) chip bodylectric layer 92 that are layered up. The antenna layer 91 is configured to dispose the antenna structure 10 shown in FIG. 4 to FIG. 24. There are a plurality of layers of routing in the PP chip bodylectric layer 92. In FIG. 25*d*, three layers of routing in the PP chip bodylectric layer 92 are represented schematically by using thick lines. A quantity of layers of routing in the PP chip bodylectric layer 92 is not specifically limited. Each layer of routing may be electrically connected through a metal hole or a metal column. Routing in the PP chip bodylectric layer 92 may be used to provide radio frequency signal routing, a ground cable, power routing, and the like for the antenna layer 91. Clearly, the PP chip bodylectric layer 92 may further be used to provide signal routing, a ground cable, power routing, and the like for another chip or device. In addition, the PP chip bodylectric layer 92 may further be used to raise the antenna layer 91. For example, the antenna structure 10 radiates or receives an electromagnetic wave to or from the outside of the electronic device 1 via an insulating part of the rear cover 202. The PP chip bodylectric layer 92 can enable the antenna structure 10 to be closer to the rear cover 202.

In this implementation, the antenna layer 91 further includes a core board (also referred to as a core chip bodylectric layer) 911 and a metal layer 912 that are layered up. The core chip bodylectric layer 911 is layered on the PP chip bodylectric layer 92. The core chip bodylectric layer 911 may be connected to the PP chip bodylectric layer 92 by press-fit or the like. The metal layer 912 includes a chip bodylectric part and a metal part. The chip bodylectric part may fully surround or half-surround the metal part. In FIG. 25*d*, three layers of the metal part of the metal layer 912 are represented schematically by thick lines. A quantity of layers of the metal part of the metal layer 912 is not specifically limited. A metal hole or a metal column may be disposed in the chip bodylectric part, to electrically connect each layer of the metal part. For example, the PP chip bodylectric layer 92 may be symmetrically distributed with respect to the core chip bodylectric layer 911.

In this implementation, the antenna structure 10 shown in FIG. 4 to FIG. 24 is disposed in the antenna layer 91. The first metal layer, the second metal layer, the first metal columns, the second metal columns, the first metal connection sheet, and the second metal connection sheets of each of the antenna elements 14 of the antenna structure 10 may all be disposed in the metal layer 912. In addition, both the third metal columns and the ground layer 12 of each of the antenna elements 14 of the antenna structure 10 may be disposed in the core chip bodylectric layer 911.

In addition, the first feeding branch 131 and the second feeding branch 132 of the feeding element 13, the second hole part 1332 of the first metal hole 133 of the feeding element 13, and the fourth hole part 1342 of the second metal hole 134 of the feeding element 13 may all be disposed in the metal layer 912. Both the first hole part 1331 of the first metal hole 133 of the feeding element 13 and the third hole part 1341 of the second metal hole 134 of the feeding element 13 may be disposed in the core chip bodylectric layer 911. The first hole part 1331 of the first metal hole 133 of the feeding element 13 and the third hole part 1341 of the second metal hole 134 of the feeding element 13 may be electrically connected to the radio frequency transceiver chip 21 through signal routing, a ground cable, and power routing in the PP chip bodylectric layer 92.

In addition, both the first matching vias 151 and the metal connection sheets 153 of the matching via groups 15 may be disposed in the metal layer 912. The second matching vias 152 of the matching via groups 15 may be disposed in the core chip bodylectric layer 911.

Figure 26:
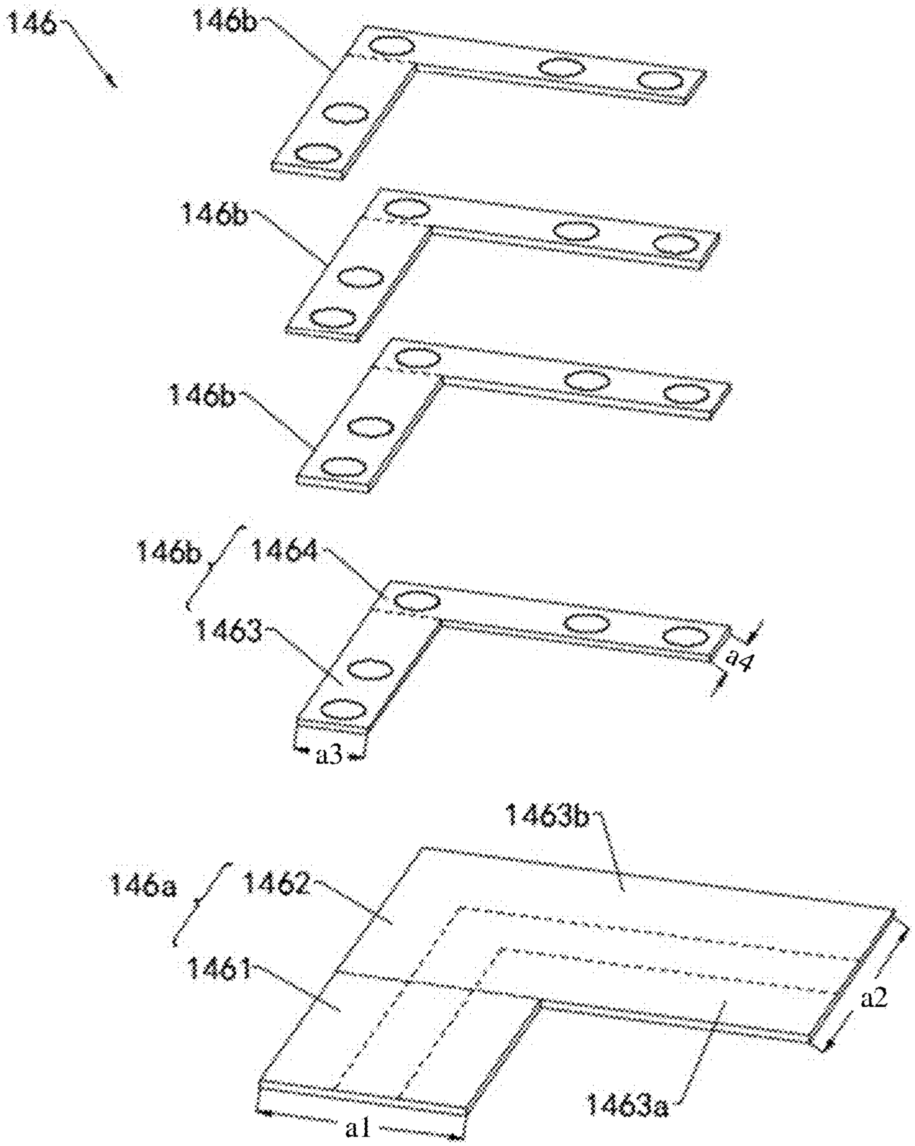
FIG. 26 is a schematic diagram of structures of a first metal connection sheet and a second metal connection sheet of a first antenna element in another implementation according to an embodiment of this application.

Technical content that is the same as or similar to the implementations shown in FIG. 4 to FIG. 24 is not described again. FIG. 26 is a schematic diagram of structures of the first metal connection sheet 146*a* and the second metal connection sheets 146*b* of the first antenna element 14*a* in another implementation according to an embodiment of this application. The first metal connection sheet 146*a* includes a third area 1463*a* and a fourth area 1463*b* that are spaced from each other. In FIG. 26, the third area 1463*a* and the fourth area 1463*b* are distinguished schematically by using a dashed line. A part of the third area 1463*a* is located in the first connection part 1461 of the first metal connection sheet 146*a*, and a part of the third area 1463*a* is located in the second connection part 1462 of the first metal connection sheet 146*a*. A part of the fourth area 1463*b* is located in the first connection part 1461 of the first metal connection sheet 146*a*, and a part of the fourth area 1463*b* is located in the second connection part 1462 of the first metal connection sheet 146*a*. For example, both the third area 1463*a* and the fourth area 1463*b* may each have an "L" shape. In another embodiment, shapes of the third area 1463*a* and the fourth area 1463*b* are not specifically limited.

It can be understood that, compared with the width a1 of the first connection part 1461 and the width a2 of the second connection part 1462 of the first metal connection sheet 146*a* in the first implementation, the width a1 of the first connection part 1461 and the width a2 of the second connection part 1462 of the first metal connection sheet 146*a* in this implementation are greater. In addition, for the second metal connection sheets 146*b* in this implementation, refer to the manner of disposing the second metal connection sheets 146*b* in the first implementation. Details are not described herein again.

Figure 27:
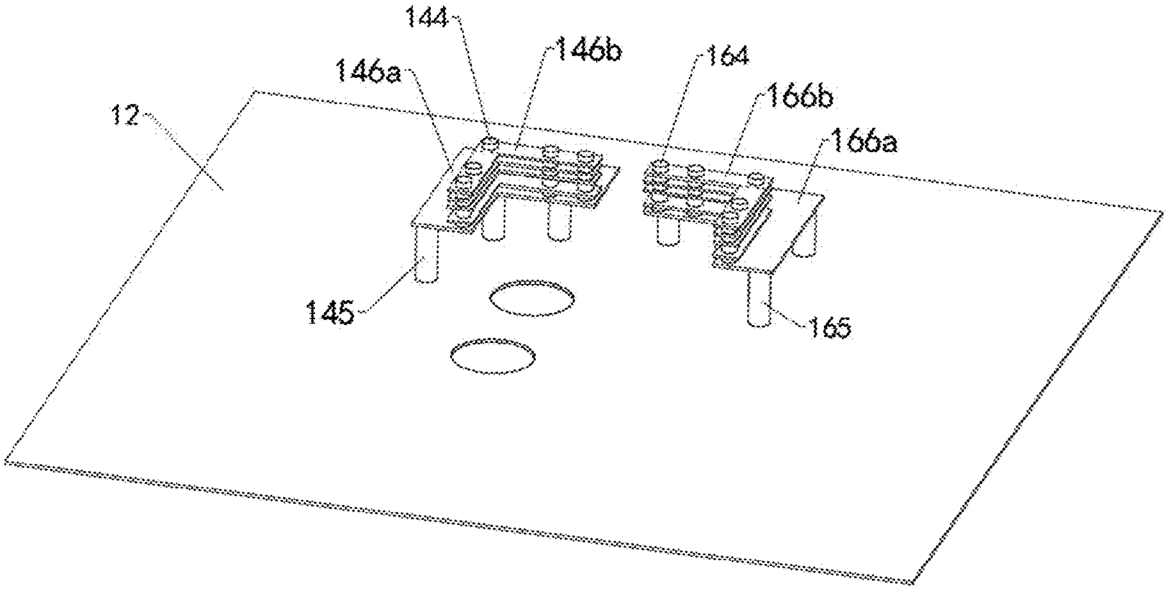
FIG. 27 is a schematic diagram of a part of a structure of an antenna structure in another implementation according to an embodiment of this application.

Refer to FIG. 27 with reference to FIG. 26. FIG. 27 is a schematic diagram of a part of the structure of the antenna structure 10 in another implementation according to an embodiment of this application. The second metal columns 144 are connected to the third area 1463*a* of the first metal connection sheet 146*a*. One end of each of the third metal columns 145 is connected to the fourth area 1463*b* of the first metal connection sheet 146*a*. In this way, the second metal columns 144 and the third metal columns 145 are spaced from each other in two areas of the first metal connection sheet 146*a*. In other words, projections of the second metal columns 144 on the first metal connection sheet 146*a* do not overlap projections of the third metal columns 145 on the first metal connection sheet 146*a* (that is, there is no overlapped part).

Figure 28:
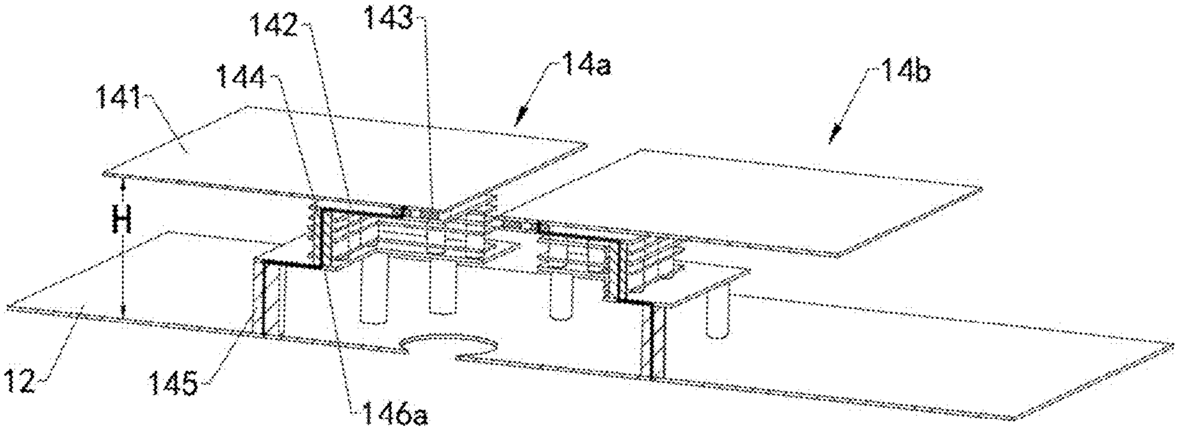
FIG. 28 is a schematic cross-sectional diagram of a part of an antenna structure in another implementation according to an embodiment of this application.

Refer to FIG. 28 with reference to FIG. 26 and FIG. 27. FIG. 28 is a schematic cross-sectional diagram of a part of the antenna structure 10 in another implementation according to an embodiment of this application. When the first antenna element 14*a* is in a working state, a current path (simply represented by thick lines in FIG. 28) includes the ground layer 12, the third metal columns 145, the fourth area 1463*b* of the first metal connection sheet 146*a*, the third area 1463*a* of the first metal connection sheet 146*a*, the second metal columns 144, the second metal layer 142, the first metal columns 143, and the first metal layer 141. In this case, because a current may be transmitted between the fourth area 1463*b* of the first metal connection sheet 146*a* and the third area 1463*a* of the first metal connection sheet 146*a* and transmitted between two areas of the second metal layer 142, the current path is disposed as bent twice. Compared with the current path in the first implementation, a cross-section H of the antenna structure 10 in this implementation can be smaller. In this way, thinness of the antenna structure 10 is easier to achieve.

For example, when a length of the current path (to be specific, an electrical length is equal to a sum of the cross-sectional height H of the antenna structure 10 and the length of the edges of the second metal layer 142) is in the range of 0.25λ0 to 0.32λ0, the cross-sectional height H of the antenna structure 10 in this embodiment may be in the range of 0.1λ0 to 0.15λ0.

Figure 29:
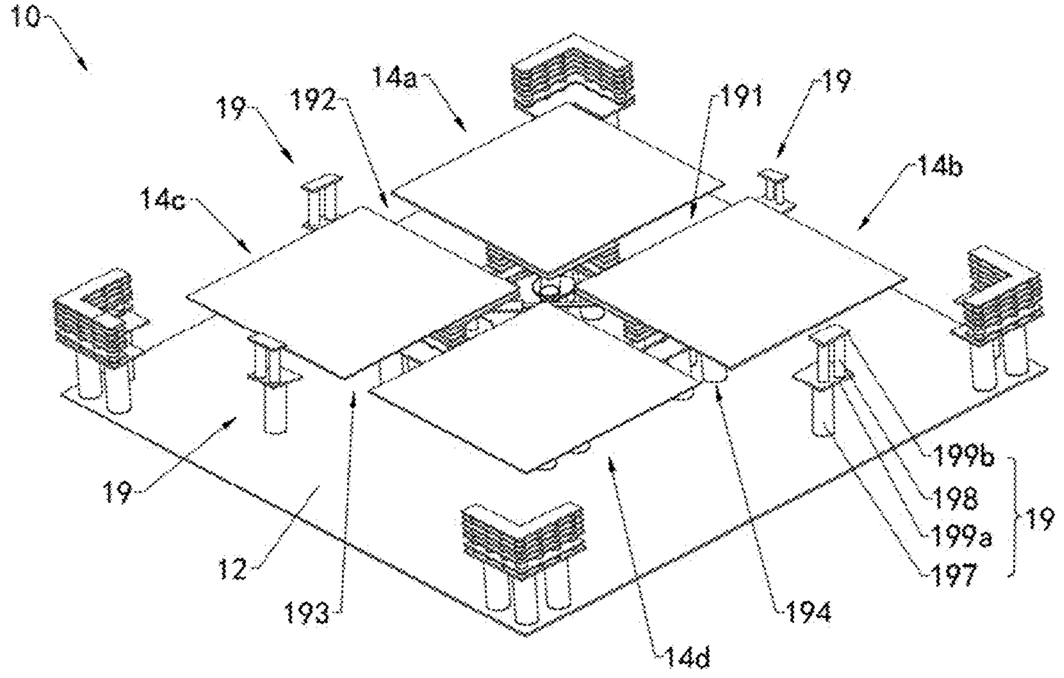
FIG. 29 is a schematic diagram of a structure of an antenna structure in another implementation according to an embodiment of this application.

FIG. 29 is a schematic diagram of a structure of the antenna structure 10 in another implementation according to an embodiment of this application. For a manner of disposing the second antenna element 14*b*, the third antenna element 14*c*, and the fourth antenna element 14*d*, refer to the manner of disposing the first antenna element 14*a*. Details are not described herein again.

It can be understood that current paths of the first antenna element 14*a*, the second antenna element 14*b*, the third antenna element 14*c*, and the fourth antenna element 14*d* in this implementation may all be disposed as bent twice. In this way, not only the cross-sectional height H of the antenna structure 10 may be smaller, widths of the first gap 191, the second gap 192, the third gap 193, and the fourth gap 194 may also be smaller. For example, widths of the first gap 191, the second gap 192, the third gap 193, and the fourth gap 194 each may be in the range of 0.03λ0 to 0.1λ0. In this way, miniaturization of the antenna structure 10 is easier to achieve.

In another embodiment, the first antenna element 14*a* may further include a third metal connection sheet, a fourth metal connection sheet, a fifth metal connection sheet, . . . , and an $m^{th}$ metal connection sheet, where m is an integer and is greater than 2. For a manner of disposing the $m^{th}$ metal connection sheet, refer to the manner of disposing the first metal connection sheet 146*a*. In addition, the first antenna element 14*a* may further include a fourth metal column, a fifth metal column, . . . , and an $n^{th}$ metal column, where n is an integer and is greater than 3. In this way, as the $m^{th}$ metal connection sheet and the $n^{th}$ metal column are disposed, a current path of the first antenna element 14*a* can be disposed as bent a plurality of times, to further reduce the cross-sectional height H of the antenna structure 10 and the widths of the first gap 191, the second gap 192, the third gap 193, and the fourth gap 194.

Refer to FIG. 29 again. The antenna structure 10 further includes a plurality of metal short-circuit hole groups 19. The plurality of metal short-circuit hole groups 19 are electrically connected to the ground layer 12. The plurality of metal short-circuit hole groups 19 are located on the periphery of the first antenna element 14*a*, the second antenna element 14*b*, the third antenna element 14*c*, and the fourth antenna element 14*d*.

For example, there are four metal short-circuit hole groups 19. One of the metal short-circuit hole groups 19 is located on a same side of the first antenna element 14*a* and the second antenna element 14*b*, and is disposed in an extension direction of the first gap 191. One of the metal short-circuit hole groups 19 is disposed opposite the first gap 191. One of the metal short-circuit hole groups 19 is located on a same side of the first antenna element 14*a* and the third antenna element 14*c*, and is disposed in an extension direction of the second gap 192. One of the metal short-circuit hole groups 19 is disposed opposite the second gap 192. One of the metal short-circuit hole groups 19 is located on a same side of the third antenna element 14*c* and the fourth antenna element 14*d*, and is disposed in an extension direction of the third gap 193. One of the metal short-circuit hole groups 19 is disposed opposite the third gap 193. One of the metal short-circuit hole groups 19 is located on a same side of the fourth antenna element 14*d* and the second antenna element 14*b*, and is disposed in an extension direction of the fourth gap 194. One of the metal short-circuit hole groups 19 is disposed opposite the fourth gap 194.

In this embodiment, the metal short-circuit hole group 19 located on the same side of the fourth antenna element 14*d* and the second antenna element 14*b* is used as an example for detailed description.

In this embodiment, the metal short-circuit hole group 19 includes a first short-circuit hole 197, second short-circuit holes 198, a first metal sheet 199*a*, and a second metal sheet 199*b*. For structures of the first short-circuit hole 191 and the second short-circuit holes 198, refer to structures of the third metal columns 145 of the first antenna element 14*a* (refer to FIG. 5). Details are not described herein again.

For example, there is one first short-circuit hole 191. There are two second short-circuit holes 198. There is one first metal sheet 199*a* and one second metal sheet 199*b*.

One end of the first short-circuit hole 197 is connected to the ground layer 12, and the other end is connected to the first metal sheet 199*a*. In this case, the first short-circuit hole 197 is located between the ground layer 12 and the first metal sheet 199*a*. One end of each of the second short-circuit holes 198 is connected to the first metal sheet 199*a*, and the other end is connected to the second metal sheet 199*b*. In this case, the second short-circuit holes 198 are located between the first metal sheet 199*a* and the second metal sheet 199*b*.

For example, the first short-circuit hole 197 and the second short-circuit holes 198 may be spaced from each other in two areas of the first metal sheet 199*a*. For details, refer to the manner in which the second metal columns 144 and the third metal columns 145 are spaced from each other in two areas of the first metal connection sheet 146*a* in this implementation.

Figure 30A:
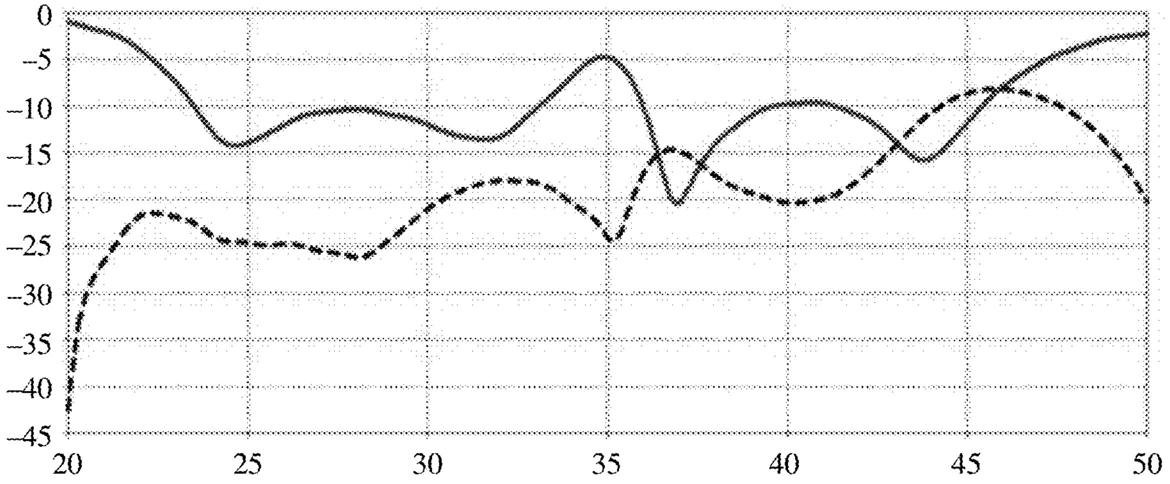
FIG. 30*a* is a data diagram in which a reflection coefficient of an antenna structure changes with a frequency according to an embodiment of this application.

FIG. 30*a* is a data diagram in which a reflection coefficient of the antenna structure 10 changes with a frequency according to an embodiment of this application. A solid line in FIG. 30*a* represents an S11 curve, and the S11 curve is used to indicate an input return loss. A dotted line represents an S21 curve, and the S21 curve is used to indicate isolation between two ports. A horizontal ordinate indicates a frequency, where a frequency unit is GHz, and a vertical ordinate indicates a unit, dB. As shown in FIG. 30*a*, a frequency band that can be covered by the antenna structure 10 ranges from 24.25 GHz to 43.5 GHz. A return loss is greater than 10 dB, and isolation is greater than 15 dB, to satisfy an antenna performance requirement. In this way, the antenna structure 10 may work in an operating frequency band ranging from 24.25 GHz to 29.5 GHz and from 37 GHz to 43.5 GHz. The antenna structure 10 may support frequency bands n257, n258, n259, n260, and n261.

In addition, it can be learned from the S11 curve in FIG. 30*a*, when the antenna structure 10 includes the metal short-circuit hole groups 19, the antenna structure 10 has four resonance frequencies, that is, 24 GHZ, 32 GHZ, 37 GHz, and 44 GHz. It can be understood that, on one hand, within a frequency band range including n257, n258, n259, n260, and n261, the antenna structure 10 has another resonance point (and a resonance frequency is 44 GHz). On the other hand, within the frequency band range including n257, n258, n259, n260, and n261, the antenna structure 10 has another trap point (and a frequency is roughly 35 GHZ). In this case, the resonance frequency (33 GHz) in the first implementation may be split into two resonance frequencies (32 GHz and 37 GHz).

Figure 30B:
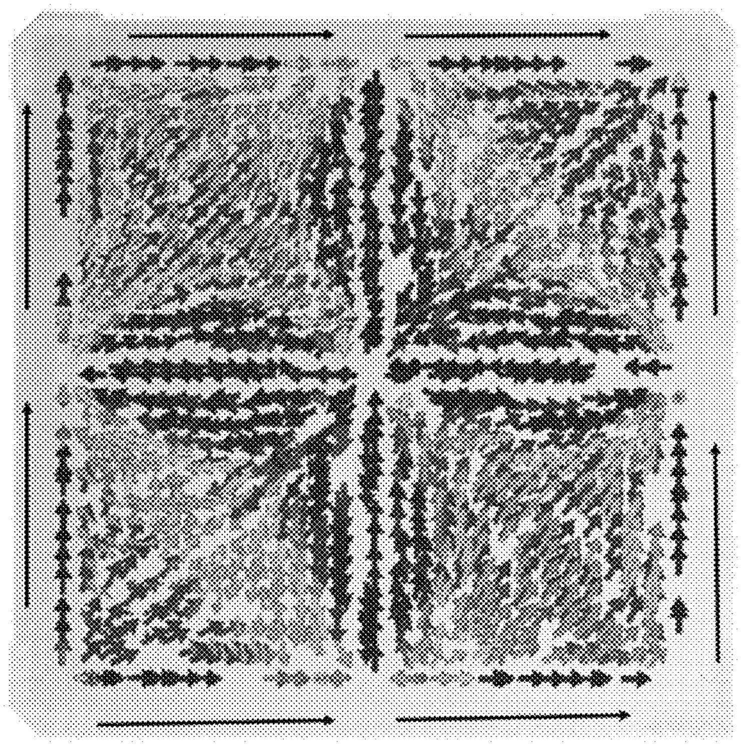
FIG. 30*b* is a schematic diagram of a current in an antenna structure in a frequency band of n259 according to an embodiment of this application.

FIG. 30*b* is a schematic diagram of a current in the antenna structure 10 in the frequency band of n259 according to an embodiment of this application. A direction of a smaller arrow in FIG. 30*b* indicates a direction of a current at each location in the antenna structure 10. In addition, a shade of the smaller arrow indicates current intensity. A darker shade of the smaller arrow indicates higher current intensity. A lighter shade of the smaller arrow indicates lower current intensity. A direction of a bigger arrow in FIG. 30*b* indicates an overall direction of a current on one side of the antenna elements 14. A current generated around the antenna structure 10 when the antenna structure 10 is at 44 GHz can be learned from FIG. 30*b*. Directions of currents on a same side of the antenna structure 10 are basically the same. For example, currents on a left side of the antenna structure 10 are roughly in an upward direction. To be specific, a current on a left side of the first antenna element 14*a* and a current on a left side of the third antenna element 14*c* are both in an upward direction. A large solid-line arrow is used for representation in FIG. 30*b*.

Figure 30C:
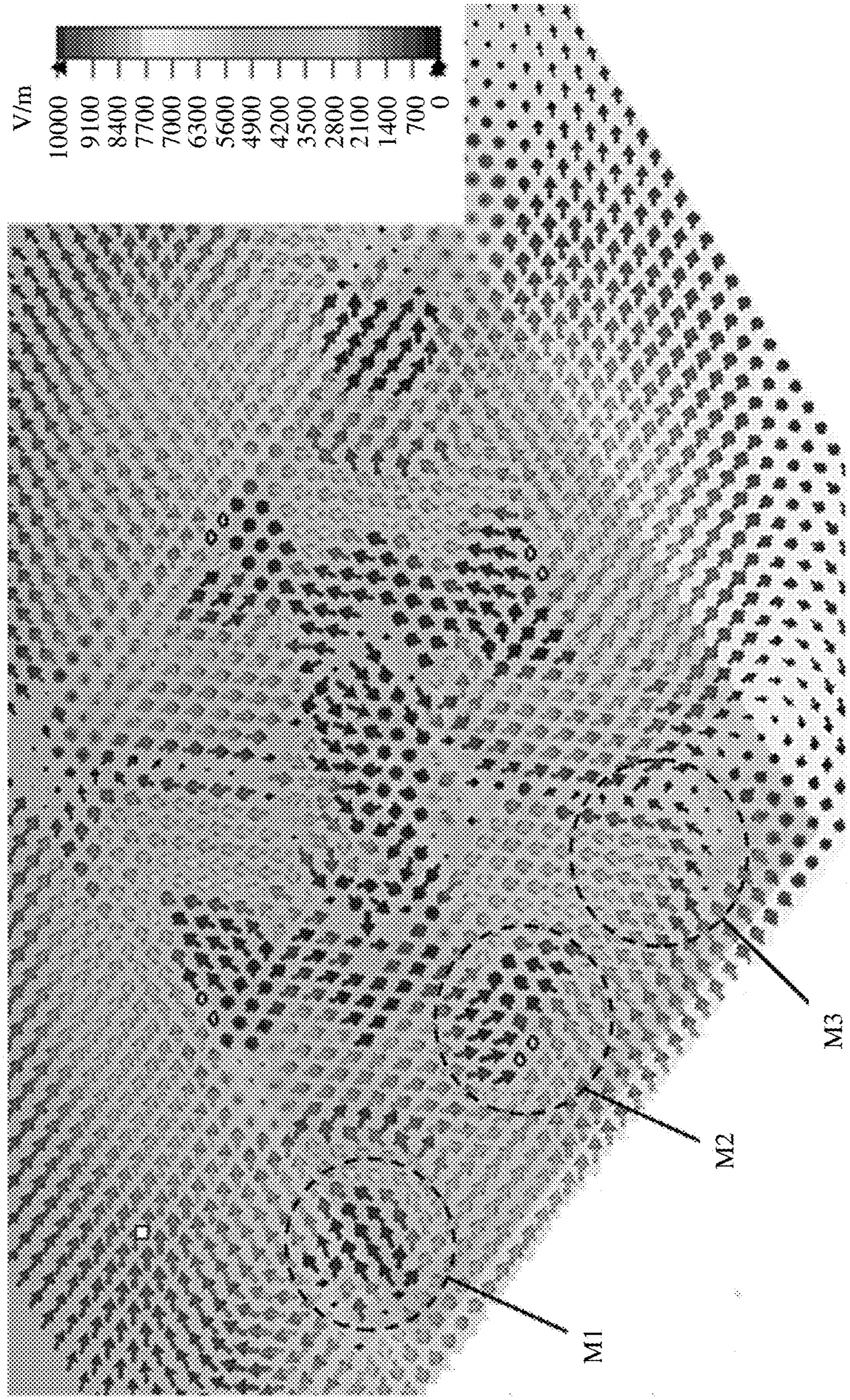
FIG. 30*c* is a schematic diagram of an electric field of an antenna structure in a frequency band of n259 according to an embodiment of this application.

FIG. 30*c* is a schematic diagram of an electric field of the antenna structure 10 in the frequency band of n259 according to an embodiment of this application. A direction of an arrow in FIG. 30*c* indicates a direction of the electric field. In addition, a shade of the arrow indicates intensity of the electric field. A darker shade of the arrow indicates higher intensity of the electric field. A lighter shade of the arrow indicates lower intensity of the electric field. An electric field generated around the antenna structure 10 when the antenna structure 10 is at 44 GHz can be learned from FIG. 30*c*. Directions of the electric field on a same side of the antenna structure 10 are “negative-positive-negative”. For example, an electric field on a left side of the antenna structure 10 includes a first area M1, a second area M2, and a third area M3. An electric field in the first area M1 is in an upward direction. An electric field in the second area M2 is in a downward direction. An electric field in the third area M3 is in an upward direction. The upward direction of the electric field in the first area M1 is referred to as positive. The downward direction of the electric field in the second area M2 is referred to as negative. It can be understood that the electric field in the second area M2 is relatively small, and therefore, the antenna structure 10 can work normally in a higher-order mode (that is, at the resonance frequency of 44 GHz).

It can be understood that, it can be learned from FIG. 30*b* and FIG. 30*c* that as the antenna structure 10 is at a resonance location of 44 GHz, because the antenna structure 10 is provided with the metal short-circuit hole groups 19, a higher-order type of field is introduced into the antenna structure 10, currents basically flow in a same direction, and the antenna structure 10 has a new resonance point (44 GHz).

Figure 30D:
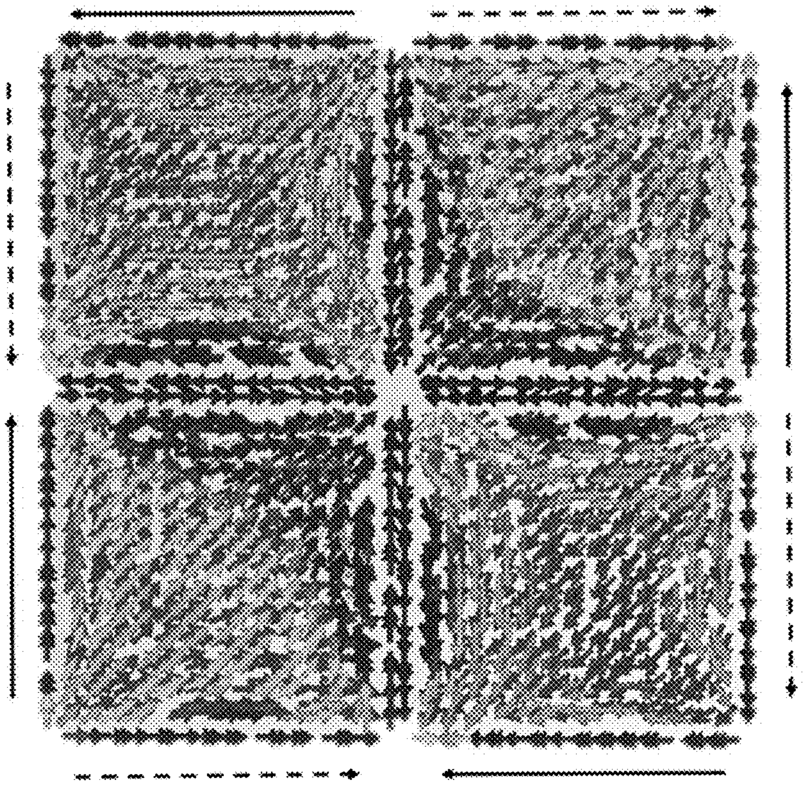
FIG. 30*d* is a schematic diagram of a current in an antenna structure in a frequency band of n260 according to an embodiment of this application.

FIG. 30*d* is a schematic diagram of a current in the antenna structure in the frequency band of n260 according to an embodiment of this application. A direction of a smaller arrow in FIG. 30*d* indicates a direction of a current at each location in the antenna structure 10. In addition, a shade of the smaller arrow indicates current intensity. A darker shade of the smaller arrow indicates higher current intensity. A lighter shade of the smaller arrow indicates lower current intensity. A direction of a bigger arrow in FIG. 30*d* indicates an overall direction of a current on one side of the antenna elements 14. A current generated around the antenna structure 10 when the antenna structure 10 is at 35 GHz can be learned from FIG. 30*d*. Directions of currents on a same side of the antenna structure 10 are basically opposite. For example, currents on the left side of the antenna structure 10 are in opposite directions. To be specific, a current on the left side of the first antenna element 14*a* is in a downward direction (indicated by a bigger dashed-line arrow in FIG. 30*d*), and a current on the left side of the third antenna element 14*c* is in an upward direction (indicated by a bigger solid-line arrow in FIG. 30*b*).

Figure 30E:
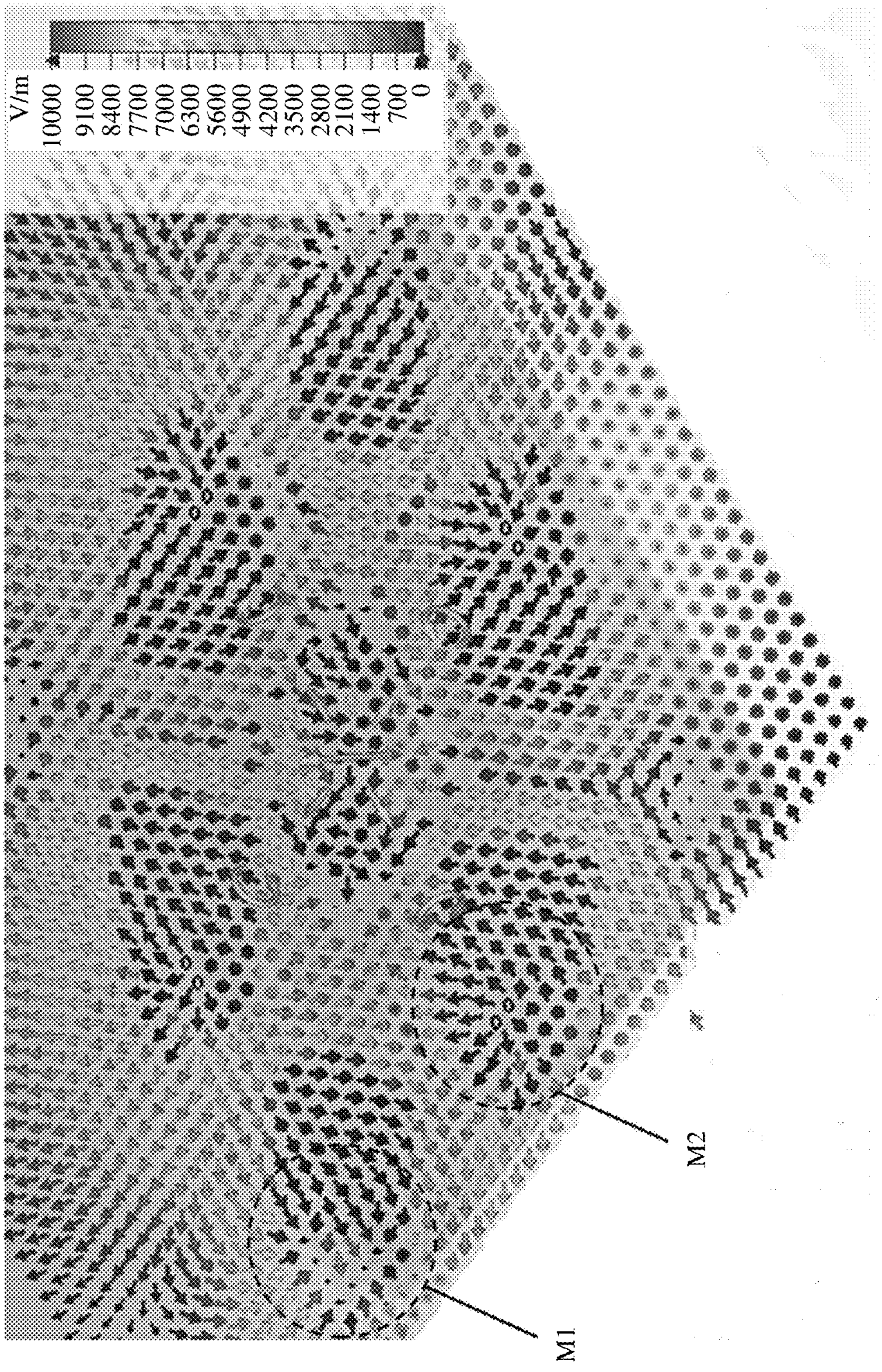
FIG. 30*e* is a schematic diagram of an electric field of an antenna structure in a frequency band of n260 according to an embodiment of this application.

FIG. 30*e* is a schematic diagram of an electric field of the antenna structure 10 in the frequency band of n260 according to an embodiment of this application. A direction of an arrow in FIG. 30*e* indicates a direction of the electric field. In addition, a shade of the arrow indicates intensity of the electric field. A darker shade of the arrow indicates higher intensity of the electric field. A lighter shade of the arrow indicates lower intensity of the electric field. Directions of the electric field on a same side of the antenna structure 10 are “negative-positive”. For example, an electric field on a left side of the antenna structure 10 includes a first area M1 and a second area M2. An electric field in the first area M1 is in a downward direction. An electric field in the second area M2 is in an upward direction. The downward direction of the electric field in the first area M1 is referred to as negative. The upward direction of the electric field in the second area M2 is referred to as positive. In this case, directions of the electric field are “negative-positive”. The antenna structure 10 is in a higher-order cancellation mode.

It can be understood that, it can be learned from FIG. 30*d* and FIG. 30*e* that, at the 35 GHz trap point, because the antenna structure 10 is provided with the metal short-circuit hole groups 19, a reverse type of field is introduced into the antenna structure 10. In this case, a current is reversed, and a trap point is generated. In addition, because of the trap point, a resonance mode at an original location is split into two resonance points. Therefore, there are one more resonance point and one more trap point on S11 in FIG. 30*a*.

Figure 31:
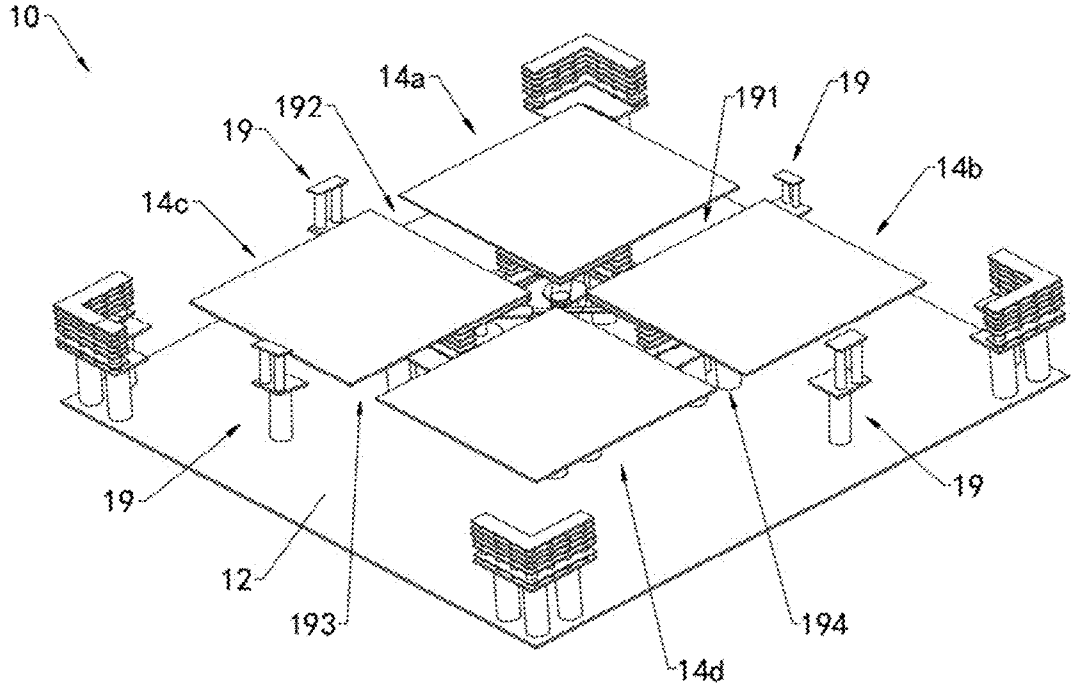
FIG. 31 is a schematic diagram of a structure of an antenna structure in still another implementation according to an embodiment of this application.

FIG. 31 is a schematic diagram of a structure of the antenna structure 10 in still another implementation according to an embodiment of this application. Current paths of the first antenna element 14*a*, the second antenna element 14*b*, the third antenna element 14*c*, and the fourth antenna element 14*d* in this implementation are all disposed as bent once. Specifically, for a manner of disposing the first antenna element 14*a*, the second antenna element 14*b*, the third antenna element 14*c*, and the fourth antenna element 14*d*, refer to the manner of disposing the first antenna element 14*a*, the second antenna element 14*b*, the third antenna element 14*c*, and the fourth antenna element 14*d* described in FIG. 4 to FIG. 24. Details are not described herein again.

In addition, the antenna structure 10 in this implementation further includes a plurality of metal short-circuit hole groups 19. For a manner of disposing the metal short-circuit hole groups 19, refer to the metal short-circuit hole groups 19 described in FIG. 29. Details are not described herein again.

Figure 32A:
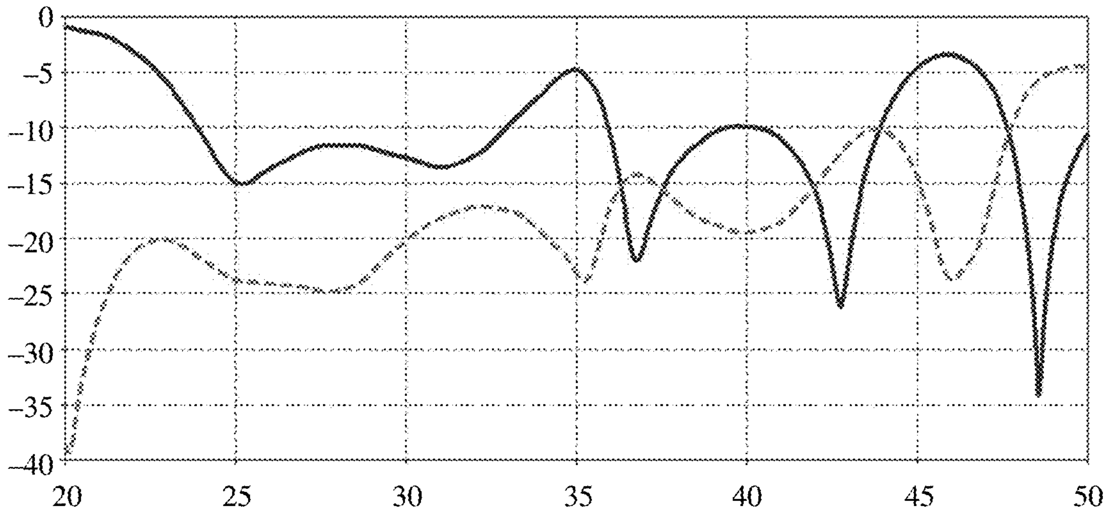
FIG. 32*a* is a data diagram in which a reflection coefficient of an antenna structure changes with a frequency according to an embodiment of this application.

FIG. 32*a* is a data diagram in which a reflection coefficient of the antenna structure 10 changes with a frequency according to an embodiment of this application. A solid line in FIG. 32*a* represents an S11 curve, and the S11 curve is used to indicate an input return loss. A dotted line represents an S21 curve, and the S21 curve is used to indicate isolation between two ports. A horizontal ordinate indicates a frequency, where a frequency unit is GHz, and a vertical ordinate indicates a unit, dB. As shown in. 32*a*, a frequency band that can be covered by the antenna structure 10 ranges from 24.25 GHz to 43.5 GHz. In addition, a return loss is greater than 10 dB, and isolation is greater than 15 dB, to satisfy an antenna performance requirement. In this way, the antenna structure 10 may work in an operating frequency band ranging from 24.25 GHz to 29.5 GHz and from 37 GHz to 43.5 GHz. The antenna structure 10 may support frequency bands n257, n258, n259, n260, and n261.

Figure 32B:
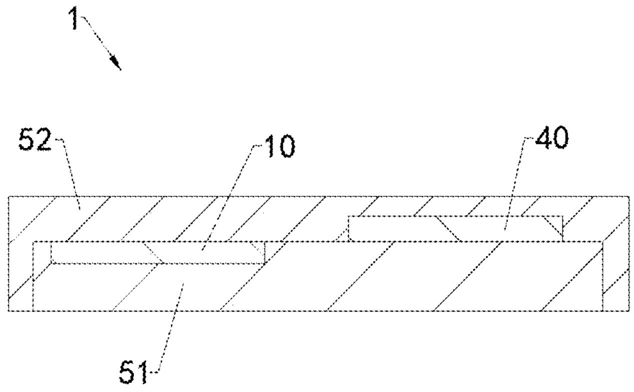
FIG. 32*b* is a schematic cross-sectional diagram of a chip according to an embodiment of this application.

FIG. 32*b* is a schematic cross-sectional diagram of a chip 1 according to an embodiment of this application. The chip 1 in this embodiment may be a chip based on an AiP (AiP, Antenna-in-Package) solution.

The chip 1 includes an antenna structure 10, a chip body 40, a package substrate 51, and an injection molded piece 52. Both the antenna structure 10 and the chip body 40 are disposed on the package substrate 51 and are electrically connected to the package substrate 51. The injection molded piece 52 packages the antenna structure 10 and the chip body 40. For example, the injection molded piece 52 fully surrounds the antenna structure 10. The injection molded piece 52 fully surrounds the chip body 40. In another embodiment, the injection molded piece 52 may alternatively half-surround the antenna structure 10. The injection molded piece 52 may alternatively half-surround the chip body 40. For the antenna structure 10, refer to the antenna structure 10 shown in FIG. 4 to FIG. 24, the antenna structure 10 shown in FIG. 26 to FIG. 29, or the antenna structure 10 shown in FIG. 31. Details are not described herein again.

For example, the chip body 40 is a radio frequency transceiver chip. The antenna structure 10 may be electrically connected to the chip body 40 via the package substrate 51. In this case, the chip body 40 transmits a radio frequency signal to the antenna structure 10 via the package substrate 51, so that the antenna structure 10 radiates an electromagnetic wave based on the radio frequency signal. In addition, when the antenna structure 10 receives an electromagnetic wave and converts the electromagnetic wave into a radio frequency signal, the chip body 40 may further receive the radio frequency signal converted by the antenna structure 10.

For example, a matching circuit (not shown in the figure) may be further disposed on the package substrate 51. The matching circuit is electrically connected between the antenna structure 10 and the chip body 40.

In another implementation, the chip may alternatively be a chip based on an AiM (Antenna in Module) solution or a chip based on an AoC (Antenna-on-Chip) solution.

In this embodiment, the chip 1 may be used in an electronic device. Specifically, the chip 1 may be disposed on a circuit board of the electronic device. The package substrate 51 of the chip 1 may be electrically connected to the circuit board.

Figure 33:
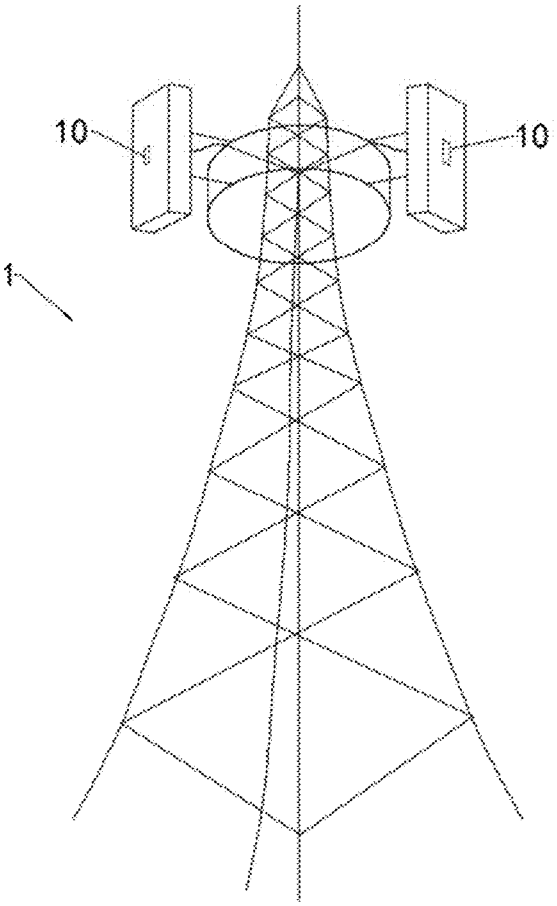
FIG. 33 is a schematic diagram of a structure of an electronic device according to another embodiment of this application.

It can be understood that, in this implementation, as the antenna structure 10 is disposed on the package substrate 51 and is surrounded by the injection molded piece 52, the antenna structure 10, the chip body 40, and a package member 50 have higher integrity. FIG. 33 is a schematic diagram of a structure of an electronic device 1 according to another embodiment of this application. The electronic device 1 may be a base station, CPE (Customer Premise Equipment), a wireless access point device (for example, a wireless router), or a device configured to transmit a non-millimeter-wave signal (for example, a low frequency signal). An example in which the electronic device 1 in the embodiment shown in FIG. 33 is a base station is used for description.

The electronic device 1 includes an antenna structure 10. It should be noted that, because the antenna structure 10 is located inside the electronic device 1, in FIG. 33, the antenna structure 10 is represented by a dashed line. For example, a frequency band covered by the antenna structure 10 in this embodiment may be 1.5 GHz to 3 GHz. In another embodiment, the antenna structure 10 may alternatively cover another frequency band.

Figure 34:
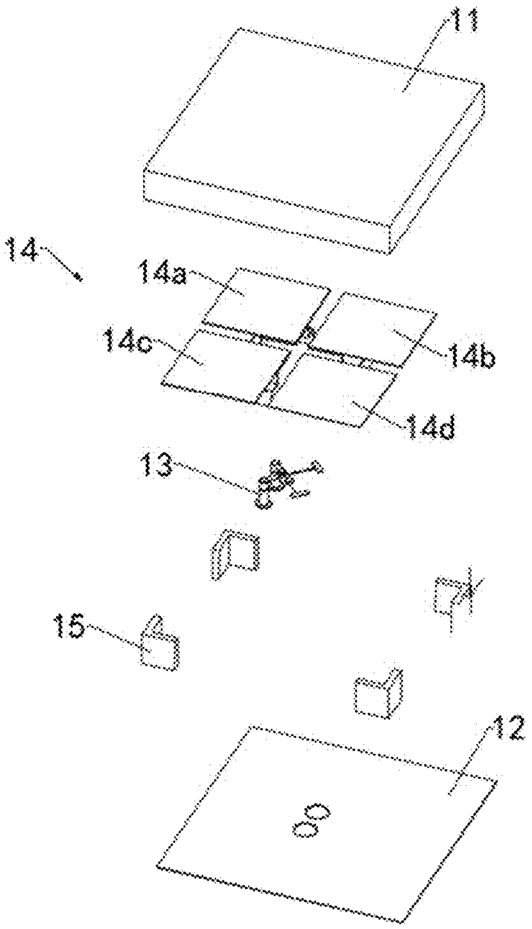
FIG. 34 is an exploded schematic diagram of an antenna structure shown in FIG. 33.

FIG. 34 is an exploded schematic diagram of the antenna structure 10 shown in FIG. 33. The antenna structure 10 includes a chip bodylectric layer 11, a ground layer 12, a feeding element 13, a plurality of antenna elements 14, and a plurality of matching metal walls 15. For a manner of disposing the chip bodylectric layer 11, the ground layer 12, and the feeding element 13, refer to the manner of disposing the chip bodylectric layer 11, the ground layer 12, and the feeding element 13 in the foregoing implementations. Details are not described herein again. In another embodiment, sizes, shapes, and the like of the chip bodylectric layer 11, the ground layer 12, and the feeding element 13 may be flexibly set based on an actual requirement.

Figure 35:
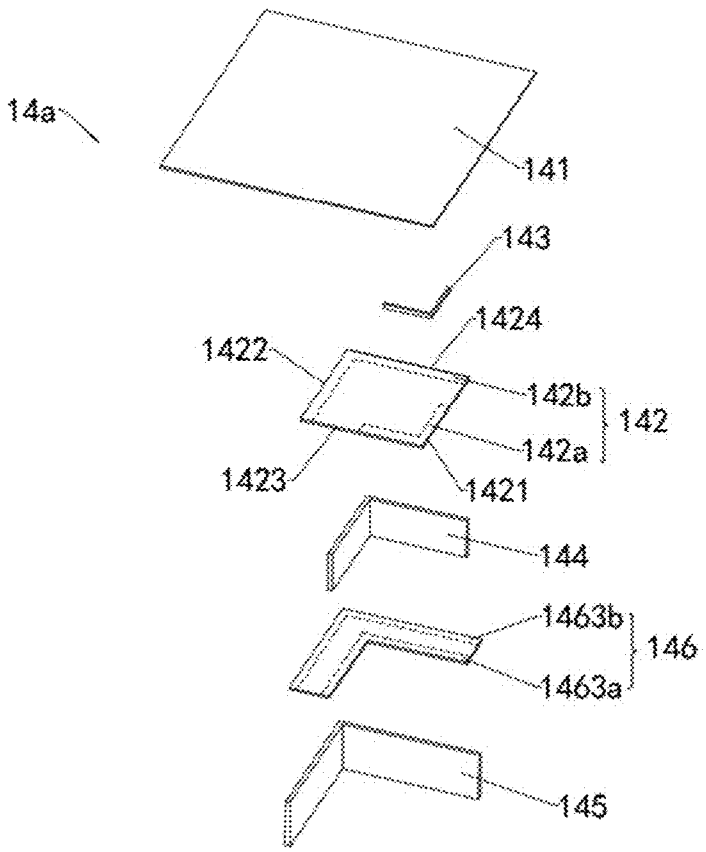
FIG. 35 is an exploded schematic diagram of a first antenna element in FIG. 34.

FIG. 35 is an exploded schematic diagram of the first antenna element 14*a* in FIG. 34. The first antenna element 14*a* includes a first metal layer 141, a second metal layer 142, a first metal wall 143, a second metal wall 144, a third metal wall 145, and a metal connection sheet 146. The first metal wall 143 forms a first conducting member in this implementation. The second metal wall 144, the third metal wall 145, and the metal connection sheet 146 form a second conducting member in this implementation.

In this implementation, for a manner of disposing the first metal layer 141 and the second metal layer 142, refer to the manner of disposing the first metal layer 141 and the second metal layer 142 in the foregoing implementations. Details are not described herein again. Sizes, shapes, and the like of the first metal layer 141 and the second metal layer 142 may be flexibly set based on an actual requirement.

For example, the first metal wall 143, the second metal wall 144, the third metal wall 145, and the metal connection sheet 146 all have an "L" shape. In another implementation, the first metal wall 143, the second metal wall 144, the third metal wall 145, and the metal connection sheet 146 may all have an arc shape.

The second metal layer 142 includes a first area 142*a* and a second area 142*b* that are spaced from each other. In FIG.

35, the first area 142a and the second area 142b are distinguished schematically by using a dashed line.

For example, both the first area 142a and the second area 142b have an "L" shape. The first area 142a includes a first edge 1421 and a third edge 1423 of the second metal layer 142. The second area 142b includes a second edge 1422 and a fourth edge 1424 of the second metal layer 142.

The metal connection sheet 146 includes a third area 1463a and a fourth area 1463b that are spaced from each other. In FIG. 35, the third area 1463a and the fourth area 1463b are distinguished schematically by using a dashed line.

For example, both the third area 1463a and the fourth area 1463b may each have an "L" shape.

Figure 36:
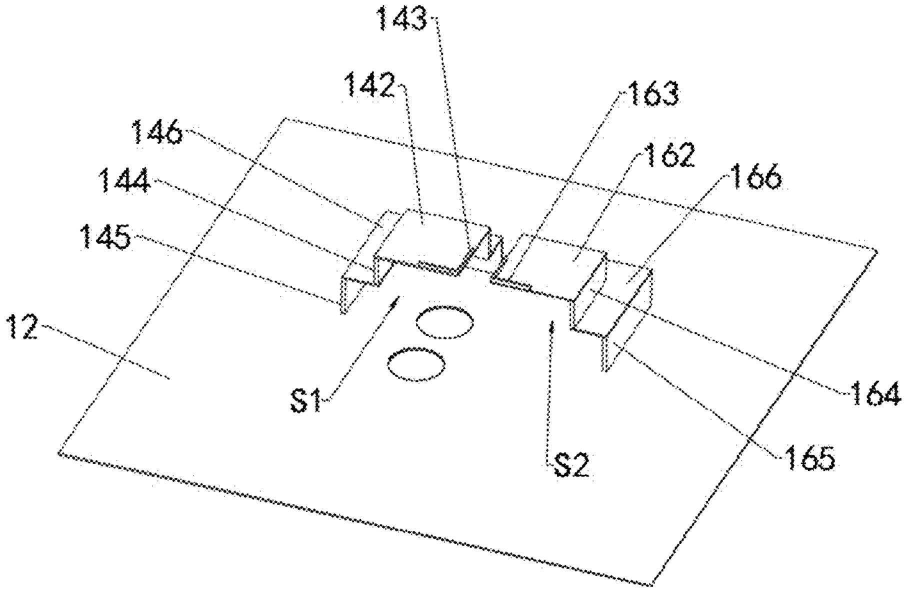
FIG. 36 is a schematic diagram of a part of a structure of an antenna structure shown in FIG. 33.
Figure 37:
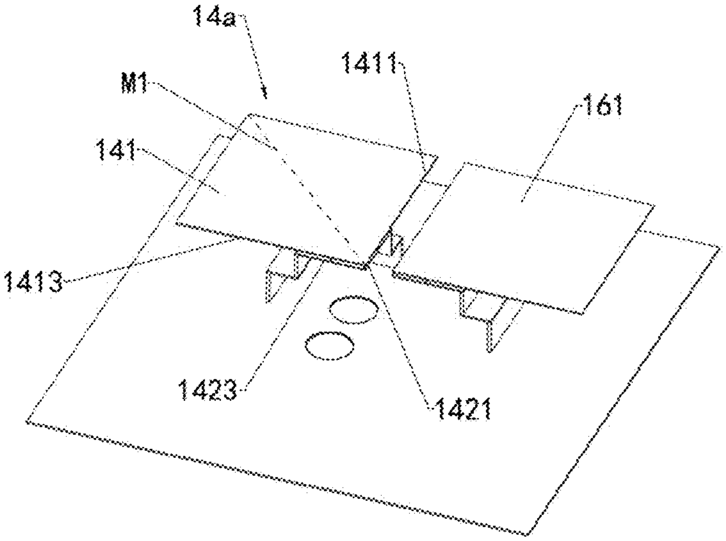
FIG. 37 is a schematic diagram of a part of a structure of an antenna structure shown in FIG. 33.

Refer to FIG. 36 and FIG. 37 with reference to FIG. 35. FIG. 36 is a schematic diagram of a part of the structure of the antenna structure 10 shown in FIG. 33. FIG. 37 is a schematic diagram of a part of the structure of the antenna structure 10 shown in FIG. 33. One end of the third metal wall 145 is connected to the ground layer 12, and the other end is connected to the fourth area 1463b of the metal connection sheet 146. In other words, the third metal wall 145 is connected between the ground layer 12 and the fourth area 1463b of the metal connection sheet 146. One end of the second metal wall 144 is connected to the third area 1463a of the metal connection sheet 146, and the other end is connected to the second area 142b of the second metal layer 142. In other words, the second metal wall 144 is connected between the third area 1463a of the metal connection sheet 146 and the second area 142b of the second metal layer 142. One end of the first metal wall 143 is connected to the first area 142a of the second metal layer 142, and the other end is connected to the first metal layer 141. In other words, the first metal wall 143 is connected between the first area 142a of the second metal layer 142 and the first metal layer 141.

In this implementation, a projection of the third metal wall 145 on the metal connection sheet 146 does not overlap a projection of the second metal wall 144 on the metal connection sheet 146. In addition, a projection of the second metal wall 144 on the second metal layer 142 does not overlap a projection of the first metal wall 143 on the second metal layer 142. In another implementation, a projection of the third metal wall 145 on the metal connection sheet 146 at least partly overlaps a projection of the second metal wall 144 on the metal connection sheet 146.

For example, the first edge 1421 of the second metal layer 142 is disposed opposite the first edge 1411 of the first metal layer 141. The third edge 1423 of the second metal layer 142 is disposed opposite the third edge 1413 of the first metal layer 141.

The second metal layer 142, the first metal wall 143, the second metal wall 144, the third metal wall 145, the metal connection sheet 146, and the ground layer 12 circle up to form a first space S1. It can be understood that another component of the antenna structure 10 may be disposed in the first space S1. In this way, on one hand, space utilization of the antenna structure 10 is high. On the other hand, the antenna structure 10 may be compactly disposed, to facilitate miniaturization of the antenna structure 10.

In this embodiment, as the second metal wall 144 and the third metal wall 145 are spaced from each other in two areas of the metal connection sheet 146, and the first metal wall 143 and the second metal wall 144 are spaced from each other in two areas of the second metal layer 142, when the first antenna element 14a is in a working state, a current path includes the ground layer 12, the third metal wall 145, the metal connection sheet 146, the second metal wall 144, the second metal layer 142, the first metal wall 143, and the first metal layer 141. Because a current may be transmitted between the third area 1463a and the fourth area 1463b of the metal connection sheet 146 and transmitted between the first area 142a and the second area 142b of the second metal layer 142, the current path may be disposed as bent twice. In this way, compared with an antenna structure that has a same current path, where the current path of the antenna structure is straight, a cross-sectional height H of the antenna structure 10 in this embodiment is smaller, to facilitate miniaturization of the antenna structure 10.

In another implementation, the first antenna element 14a may not include the third metal wall 145 or the metal connection sheet 146. In this case, the second metal wall 144 is directly connected to the ground layer 12. In this way, a current path of the first antenna element 14a is disposed as bent once.

In another implementation, the first antenna element 14a may further include a second metal connection sheet, a third metal connection sheet, . . . , and an $m^{th}$ metal connection sheet, where m is an integer and is greater than 1. For a manner of disposing the $m^{th}$ metal connection sheet, refer to the manner of disposing the metal connection sheet 146a. In addition, the first antenna element 14a may further include a fourth metal wall, a fifth metal wall, . . . , and an $n^{th}$ metal wall, where n is an integer and is greater than 3. In this way, as the $m^{th}$ metal connection sheet and the $n^{th}$ metal wall are disposed, the current path of the first antenna element 14a can be disposed as bent a plurality of times.

For example, the first antenna element 14a may be a symmetric structure, a partly symmetric structure, a structure having same or similar parts, or a structure having different parts. In this embodiment, the first antenna element 14a is a symmetric structure. Specifically, refer to FIG. 37 again. The first antenna element 14a is symmetrical along a symmetry plane of the first antenna element 14a. The symmetry plane of the first antenna element 14a is perpendicular to the plane on which the first metal layer 141 is located, and the diagonal line M1 of the first metal layer 141 is located on the symmetry plane of the first antenna element 14a.

Figure 38:
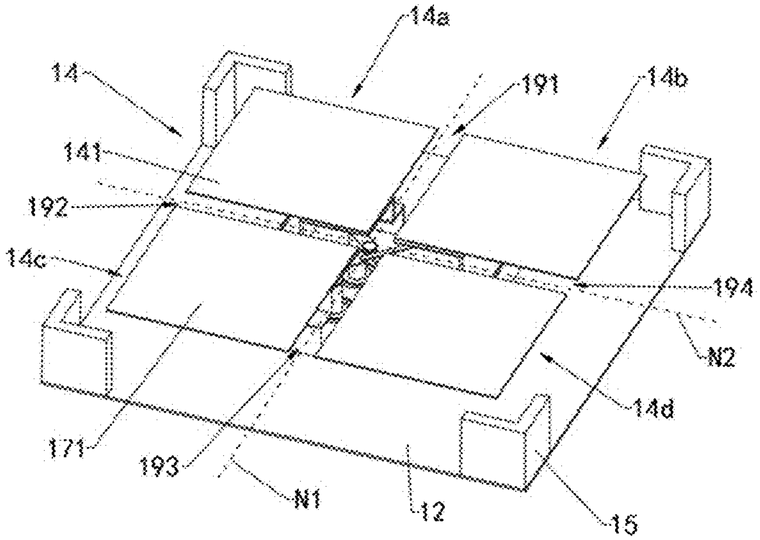
FIG. 38 is a schematic diagram of a structure of an antenna structure shown in FIG. 33.

FIG. 38 is a schematic diagram of the structure of the antenna structure 10 shown in FIG. 33. For a manner of disposing the second antenna element 14b, the third antenna element 14c, and the fourth antenna element 14d, refer to the manner of disposing the first antenna element 14a. In addition, for a location relationship and a connection relationship between the first antenna element 14a, the second antenna element 14b, the third antenna element 14c, and the fourth antenna element 14d, refer to the location relationship and the connection relationship between the first antenna element 14a, the second antenna element 14b, the third antenna element 14c, and the fourth antenna element 14d in the first embodiment. Details are not described herein again.

In this embodiment, new spaces are created in the antenna structure 10 by compactly disposing various parts of structures of the antenna elements 14. To be specific, the first space S1 (refer to FIG. 36), a second space S2 (refer to FIG. 36), a third space (not shown in the figure), and a fourth space (not shown in the figure) are formed in the antenna structure 10. It can be understood that other components of the antenna structure 10 may be disposed in the first space S1, the second space S2, the third space, and the fourth space. In this way, on one hand, space utilization of the antenna structure 10 is high. On the other hand, the structure of the antenna structure 10 is compact, to facilitate miniaturization of the antenna structure 10. In addition, a current path of the antenna structure 10 is set to bent twice. In this way, compared with an antenna structure that has a same current path, where the current path of the antenna structure is straight, not only a cross-sectional height H of the antenna structure 10 in this embodiment is smaller, widths of the first gap 191, the second gap 192, the third gap 193, and the fourth gap 194 in the antenna structure 10 are also smaller.

For example, the second antenna element 14*b* and the first antenna element 14*a* may be symmetrical, partly symmetrical, have a same or similar structure, or have different structures. The second antenna element 14*b* and the first antenna element 14*a* form a symmetric structure. Specifically, the second antenna element 14*b* and the first antenna element 14*a* are symmetrical along a first symmetry plane. The first symmetry plane is perpendicular to a plane on which the first metal layer 141 of the first antenna element 14*a* is located, and a central plane N1 between the first antenna element 14*a* and the second antenna element 14*b* is located on the first symmetry plane.

For example, the third antenna element 14*c* and the first antenna element 14*a* may be symmetrical, partly symmetrical, have a same or similar structure, or have different structures. In this embodiment, the third antenna element 14*c* and the first antenna element 14*a* form a symmetric structure. Specifically, the third antenna element 14*c* and the first antenna element 14*a* are symmetrical along a second symmetry plane. The second symmetry plane is perpendicular to a plane on which the first metal layer 171 of the third antenna element 14*c* is located, and a central plane N2 between the first antenna element 14*a* and the third antenna element 14*c* is located on the second symmetry plane.

For example, the fourth antenna element 14*d* and the third antenna element 14*c* may be symmetrical, partly symmetrical, have a same or similar structure, or have different structures. In this embodiment, the fourth antenna element 14*d* and the third antenna element 14*c* form a symmetric structure. Specifically, the fourth antenna element 14*d* and the third antenna element 14*c* are symmetrical along the first symmetry plane. The central plane N1 is also a central line between the fourth antenna element 14*d* and the third antenna element 14*c*.

For example, the fourth antenna element 14*d* and the second antenna element 14*b* may be symmetrical, or partly symmetrical, have a same or similar structure, or have different structures. In this embodiment, the fourth antenna element 14*d* and the second antenna element 14*b* form a symmetric structure. Specifically, the fourth antenna element 14*d* and the second antenna element 14*b* are symmetrical along the second symmetry plane. The central plane N2 is also a central line between the second antenna element 14*b* and the fourth antenna element 14*d*.

For example, the fourth antenna element 14*a*, the second antenna element 14*b*, the third antenna element 14*c*, and the fourth antenna element 14*d* may be centrosymmetric, partly centrosymmetric, have a same or similar structure, or have different structures. In this embodiment, the first antenna element 14*a*, the second antenna element 14*b*, the third antenna element 14*c*, and the fourth antenna element 14*d* are centrosymmetric with respect to a central axis. The central axis is an intersection point of the central plane N1 and the central plane N2.

Refer to FIG. 38 again. The plurality of matching metal walls 15 are located on a periphery of the ground layer 12, that is, the plurality of matching metal walls 15 are disposed near edges of the ground layer 12. The plurality of matching metal walls 15 are disposed around the periphery of the ground layer 12.

For example, there are four matching metal walls 15. The four matching metal walls 15 are located at four corners of the ground layer 12. For example, each of the matching metal walls 15 has an "L" shape or an arc shape.

It can be understood that, as the plurality of matching metal walls 15 that are spaced from each other are disposed on the ground layer 12, the matching metal walls 15 can enlarge a current path between the antenna elements 14 and the ground layer 12. The matching metal walls 15 may be configured to tune impedance of the antenna structure 10, to implement impedance matching. In addition, because the matching metal walls 15 can increase the current path between the antenna elements 14 and the ground layer 12, sizes of the antenna elements 14 and the ground layer 12 in this embodiment may be made small, to achieve miniaturization of the antenna structure 10.

In another implementation, for a manner of disposing the antenna structure 10 in this embodiment, refer to the manner of disposing the antenna structure 10 in the second implementation in the first embodiment. In this case, a current path of the antenna structure 10 may be disposed as bent a plurality of times. In addition, the antenna structure 10 further includes metal short-circuit hole groups 19. In this case, a bandwidth capability of the antenna structure 10 may be further improved, and a new trap point is generated.

In another implementation, for a manner of disposing the antenna structure 10 in this embodiment, refer to the manner of disposing the antenna structure 10 in the third implementation in the first embodiment. For example, the antenna structure 10 further includes the metal short-circuit hole groups 19.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A chip, comprising:

a package substrate;

an injection molded piece;

a chip body; and an antenna structure, wherein both the antenna structure and the chip body are disposed on the package substrate and are electrically connected to the package substrate, and the injection molded piece is configured to package the antenna structure and the chip body, and the antenna structure comprises a ground layer, a feeding element, and a first antenna element;

wherein the first antenna element comprises a first metal layer, a second metal layer, a first conducting member, and a second conducting member, the first metal layer and the ground layer are disposed opposite to and spaced from each other, the second metal layer is located between the first metal layer and the ground layer and is spaced from both the first metal layer and the ground layer, the second metal layer comprises a first area and a second area that are spaced from each other, the first conducting member is connected between the first metal layer and the first area of the second metal layer, and the second conducting member is connected between the ground layer and the second area of the second metal layer; and wherein the feeding element is located on a side that is of the first metal layer and that faces the ground layer, the feeding element comprises a feeding branch, a projection of at least a part of the feeding branch on a plane, on which the first metal layer is located, falls within the first metal layer, and the feeding element is configured to feed the second metal layer and the first metal layer.

2. The chip according to claim 1, wherein the antenna structure comprises four antenna elements arranged in two rows and two columns and spaced from each other, and the four antenna elements are the first antenna element, a second antenna element, a third antenna element, and a fourth antenna element;

wherein a first edge of a first metal layer of the second antenna element and a first edge of the first metal layer of the first antenna element form a first gap;

wherein a third edge of a first metal layer of the third antenna element and a third edge of the first metal layer of the first antenna element form a second gap;

wherein a first edge of a first metal layer of the fourth antenna element and a first edge of the first metal layer of the third antenna element form a third gap;

wherein a third edge of the first metal layer of the fourth antenna element and a third edge of the first metal layer of the second antenna element form a fourth gap; and wherein the fourth gap is interconnected to the first gap, the second gap, and the third gap, and wherein the first gap, the second gap, the third gap, and the fourth gap form a cruciform shape.

3. The chip according to claim 2, wherein the first antenna element, the second antenna element, the third antenna element, and the fourth antenna element form a centrosymmetric structure.

4. The chip according to claim 2, wherein the feeding branch comprises a first feeding branch and a second feeding branch that are spaced from each other;

wherein one end of the first feeding branch overlaps the first metal layer of the first antenna element in a plan view of the first metal layer of the first antenna element, another end of the first feeding branch overlaps the first metal layer of the fourth antenna element in a plan view of the first metal layer of the fourth antenna element, and the first feeding branch is configured to feed the second metal layer of the first antenna element, the first metal layer of the first antenna element, a second metal layer of the fourth antenna element, and the first metal layer of the fourth antenna element; and wherein one end of the second feeding branch overlaps the first metal layer of the second antenna element in a plan view of the first metal layer of the second antenna element, another end of the second feeding branch overlaps the first metal layer of the third antenna element in a plan view of the first metal layer of the third antenna element, and the second feeding branch is configured to feed a second metal layer of the second antenna element, the first metal layer of the second antenna element, a second metal layer of the third antenna element, and the first metal layer of the third antenna element.

5. The chip according to claim 4, wherein the four antenna elements are arranged around a central point, the first antenna element, the second antenna element, the third antenna element, and the fourth antenna element are all symmetric structures, and a symmetry plane of the first antenna element, a symmetry plane of the second antenna element, a symmetry plane of the third antenna element, and a symmetry plane of the fourth antenna element all pass through the central point; and wherein an extension direction of the first feeding branch is parallel to the symmetry plane of the first antenna element and the symmetry plane of the fourth antenna element, and an extension direction of the second feeding branch is parallel to the symmetry plane of the second antenna element and the symmetry plane of the third antenna element.

6. The chip according to claim 4, wherein the first feeding branch comprises a first part, a second part, a third part, a fourth part, and a fifth part that are sequentially connected; and wherein a projection of a part of the first part on the plane, on which the first metal layer of the first antenna element is located, falls within the first metal layer of the first antenna element, and a projection of a part of the fifth part on the plane, on which the first metal layer of the first antenna element is located, falls within the first metal layer of the fourth antenna element.

7. The chip according to claim 4, wherein the second feeding branch includes a first part, a second part, and a third part that are sequentially connected, a projection of a part of the first part on the plane, on which the first metal layer of the third antenna element is located, falls within the first metal layer of the third antenna element, and a projection of a part of the third part on the plane, on which the first metal layer of the second antenna element is located, falls within the first metal layer of the second antenna element.

8. The chip according to claim 4, wherein the first feeding branch and the second feeding branch satisfy one of the following:

an included angle between an extension direction of the first feeding branch and the first edge of the first metal layer of the first antenna element is 45°;

an included angle between the extension direction of the first feeding branch and the first edge of the first metal layer of the fourth antenna element is 45°;

an included angle between an extension direction of the second feeding branch and the first edge of the first metal layer of the third antenna element is 45°; or an included angle between the extension direction of the second feeding branch and the first edge of the first metal layer of the second antenna element is 45°.

9. The chip according to claim 2, wherein the feeding branch comprises a first feeding branch and a second feeding branch that are spaced from each other; and wherein a first metal via and a second metal via that are spaced from each other extend in the feeding element, the first metal via is connected to the first feeding branch and the second metal via is connected to the second feeding branch, and wherein projections of the first metal via and the second metal via on the plane, on which the first metal layer is located, fall within the first metal layer.

10. The chip according to claim 9, wherein the chip further comprises a radio frequency circuit, a first through via and a second through via that are spaced from each other extend in the ground layer, the first metal via is electrically connected to the radio frequency circuit through the first through via, and the second metal via is electrically connected to the radio frequency circuit through the second through via.

11. The chip according to claim 10, wherein the first conducting member comprises a plurality of first metal columns; and wherein the second conducting member comprises a first metal connection sheet, a plurality of second metal columns, and a plurality of third metal columns, wherein the first metal connection sheet is located between the second metal layer and the ground layer, the plurality of second metal columns are connected between the first metal connection sheet and the second area of the second metal layer, and the plurality of third metal columns are connected between the first metal connection sheet and the ground layer.

12. The chip according to claim 11, wherein the plurality of third metal columns are disposed half-round the first through via, and the plurality of third metal columns are disposed half-round the second through via.

13. The chip according to claim 11, wherein a diameter of each third metal column is greater than a diameter of each second metal column.

14. The chip according to claim 11, wherein the chip satisfies at least one of the following:

the plurality of first metal columns are arranged into an L shape or an arc shape;

the first metal connection sheet has an L shape or an arc shape;

the plurality of second metal columns are arranged into an L shape or an arc shape; or the plurality of third metal columns are arranged into an L shape or an arc shape.

15. The chip according to claim 11, wherein projections of the plurality of third metal columns on the first metal connection sheet at least partly overlap projections of the plurality of second metal columns on the first metal connection sheet.

16. The chip according to claim 2, wherein the four antenna elements are arranged around a central point, the second conducting member of the first antenna element is located on a side that is of the first conducting member of the first antenna element other than a side of the first conducting member of the first antenna element that is closest to the central point, a second conducting member of the second antenna element is located on a side that is of a first conducting member of the second antenna element other than a side of the first conducting member of the second antenna element that is closest to the central point, a second conducting member of the third antenna element is located on a side that is of a first conducting member of the third antenna element other than a side of the first conducting member of the third antenna element that is closest to the central point, and a second conducting member of the fourth antenna element is located on a side that is of a first conducting member of the fourth antenna element other than a side of the first conducting member of the fourth antenna element that is closest to the central point.

17. The chip according to claim 2, wherein the feeding branch is located in a space encircled by the second conducting member of the first antenna element, a second conducting member of the second antenna element, a second conducting member of the third antenna element, and a second conducting member of the fourth antenna element.

18. The chip according to claim 1, wherein a projection of the first metal layer on the ground layer falls within the ground layer, and a projection of the second metal layer on the plane, on which the first metal layer is located, falls within the first metal layer.

19. An electronic device, comprising:

a chip comprising a package substrate, an injection molded piece, a chip body, and an antenna structure, wherein both the antenna structure and the chip body are disposed on the package substrate and are electrically connected to the package substrate, and the injection molded piece is configured to package the antenna structure and the chip body, and the antenna structure comprises a ground layer, a feeding element, and a first antenna element;

wherein the first antenna element comprises a first metal layer, a second metal layer, a first conducting member, and a second conducting member, the first metal layer and the ground layer are disposed opposite to and spaced from each other, the second metal layer is located between the first metal layer and the ground layer and is spaced from both the first metal layer and the ground layer, the second metal layer comprises a first area and a second area that are spaced from each other, the first conducting member is connected between the first metal layer and the first area of the second metal layer, and the second conducting member is connected between the ground layer and the second area of the second metal layer; and wherein the feeding element is located on a side that is of the first metal layer and that faces the ground layer, the feeding element comprises a feeding branch, a projection of at least a part of the feeding branch on a plane, on which the first metal layer is located, falls within the first metal layer, and the feeding element is configured to feed the second metal layer and the first metal layer.

20. The electronic device according to claim 19, further comprising a circuit board, wherein the chip is disposed on the circuit board, and the package substrate of the chip is electrically connected to the circuit board.

21. The electronic device according to claim 19, wherein the antenna structure comprises four antenna elements arranged in two rows and two columns and spaced from each other, and the four antenna elements are the first antenna element, a second antenna element, a third antenna element, and a fourth antenna element;

a first edge of a first metal layer of the second antenna element and a first edge of the first metal layer of the first antenna element form a first gap;

a third edge of a first metal layer of the third antenna element and a third edge of the first metal layer of the first antenna element form a second gap;

a first edge of a first metal layer of the fourth antenna element and a first edge of the first metal layer of the third antenna element form a third gap; and a third edge of the first metal layer of the fourth antenna element and a third edge of the first metal layer of the second antenna element form a fourth gap; and wherein the fourth gap is interconnected to the first gap, the second gap, and the third gap, and wherein the first gap, the second gap, the third gap, and the fourth gap form a cruciform shape.

22. The electronic device according to claim 21, wherein the four antenna elements are arranged around a central point, a second conducting member of the first antenna element is located on a side that is of the first conducting member of the first antenna element and that is other than a side of the first conducting member of the first antenna element that is closest to the central point, a second conducting member of the second antenna element is located on a side that is of a first conducting member of the second antenna element and that is other than a side of the first conducting member of the second antenna element that is closest to the central point, a second conducting member of the third antenna element is located on a side that is of a first conducting member of the third antenna element and that is other than a side of the first conducting member of the third antenna element that is closest to the central point, and a second conducting member of the fourth antenna element is located on a side that is of a first conducting member of the fourth antenna element and that is other than a side of the first conducting member of the fourth antenna element that is closest to the central point.

23. The electronic device according to claim 22, wherein the feeding branch is located in a space encircled by the second conducting member of the first antenna element, the second conducting member of the second antenna element, the second conducting member of the third antenna element, and the second conducting member of the fourth antenna element.

24. The electronic device according to claim 21, wherein the feeding branch comprises a first feeding branch and a second feeding branch that are spaced from each other;

wherein one end of the first feeding branch overlaps the first metal layer of the first antenna element in a plan view of the first metal layer of the first antenna element, another end of the first feeding branch overlaps the first metal layer of the fourth antenna element in a plan view of the first metal layer of the fourth antenna element, and the first feeding branch is configured to feed the second metal layer of the first antenna element, the first metal layer of the first antenna element, a second metal layer of the fourth antenna element, and the first metal layer of the fourth antenna element; and wherein one end of the second feeding branch overlaps the first metal layer of the second antenna element in a plan view of the first metal layer of the second antenna element, and another end of the second feeding branch overlaps the first metal layer of the third antenna element in a plan view of the first metal layer of the third antenna element, and the second feeding branch is configured to feed a second metal layer of the second antenna element, the first metal layer of the second antenna element, a second metal layer of the third antenna element, and the first metal layer of the third antenna element.

25. The electronic device according to claim 24, wherein the first feeding branch and the second feeding branch satisfy one of the following:

an included angle between an extension direction of the first feeding branch and the first edge of the first metal layer of the first antenna element is 45°;

an included angle between the extension direction of the first feeding branch and the first edge of the first metal layer of the fourth antenna element is 45°;

an included angle between an extension direction of the second feeding branch and the first edge of the first metal layer of the third antenna element is 45°; or an included angle between the extension direction of the second feeding branch and the first edge of the first metal layer of the second antenna element is 45°.

* * * * *